United States Patent
Pang et al.

(10) Patent No.: US 6,578,188 B1
(45) Date of Patent: Jun. 10, 2003

(54) METHOD AND APPARATUS FOR A NETWORK-BASED MASK DEFECT PRINTABILITY ANALYSIS SYSTEM

(75) Inventors: Linyong Pang, Stanford, CA (US); Daniel William Howard, Santa Clara, CA (US); Linard Karklin, Sunnyvale, CA (US)

(73) Assignee: Numerical Technologies, Inc., San Jose, CA (US)

( * ) Notice: Subject to any disclaimer, the term of this patent is extended or adjusted under 35 U.S.C. 154(b) by 0 days.

(21) Appl. No.: 09/544,798

(22) Filed: Apr. 7, 2000

Related U.S. Application Data

(63) Continuation-in-part of application No. 09/130,996, filed on Aug. 7, 1998.
(60) Provisional application No. 60/059,306, filed on Sep. 17, 1997.

(51) Int. Cl.[7] .............................................. G06F 17/50
(52) U.S. Cl. .......................................................... 716/19
(58) Field of Search ........................................... 716/19

(56) References Cited

U.S. PATENT DOCUMENTS

| | | | |
|---|---|---|---|
| 4,812,962 A | 3/1989 | Witt ........................... | 364/490 |
| 5,051,598 A | 9/1991 | Ashton et al. ............ | 250/492.2 |
| 5,182,718 A | 1/1993 | Harafuji et al. ............. | 364/490 |
| 5,241,185 A | 8/1993 | Meiri et al. ............... | 250/492.2 |
| 5,242,770 A | 9/1993 | Chen et al. ..................... | 430/5 |
| 5,256,505 A | 10/1993 | Chen et al. ..................... | 430/5 |
| 5,316,878 A | 5/1994 | Saito et al. ..................... | 430/5 |
| 5,326,659 A | 7/1994 | Liu et al. ........................ | 430/5 |
| 5,340,700 A | 8/1994 | Chen et al. .................. | 430/312 |
| 5,424,154 A | 6/1995 | Borodovsky ................... | 430/5 |
| 5,432,714 A | 7/1995 | Chung et al. ............... | 364/525 |

(List continued on next page.)

FOREIGN PATENT DOCUMENTS

| | | |
|---|---|---|
| WO | WO 00/67075 A1 | 11/1990 |
| WO | WO 97/13370 | 4/1997 |
| WO | WO 98/20327 | 5/1998 |
| WO | WO 98/45685 | 10/1998 |
| WO | WO 99/14706 A2 A3 | 3/1999 |
| WO | WO 00/36525 A3 | 6/2000 |
| WO | WO 00/67074 A1 | 11/2000 |
| WO | WO 00/67076 A1 | 11/2000 |

OTHER PUBLICATIONS

Ogawa, K., et al., "Phase Defect Inspection by Differential Interference", Lasertec Corporation (12 pages).
Socha, R., et al., "Printability of Phase–Shift Defects Using a Perturbational Model", Univ. of California Berkeley, Sematech (11 pages).

(List continued on next page.)

*Primary Examiner*—Matthew Smith
*Assistant Examiner*—A. M. Thompson
(74) *Attorney, Agent, or Firm*—Bever, Hoffman & Harms, LLP; Jeanette S. Harms

(57) ABSTRACT

A mask defect printability simulation server provides simulations, one-dimensional analysis, and reports to multiple clients over a wide area network, such as the Internet. This network-based simulation server allows a client to leverage a core of highly-trained engineers. Additionally, the network-based simulation server can be easily supported since only a single source for the tools associated with the simulation server is necessary for multiple clients. A client can access the simulation server using a standard personal computer having a browser, thereby eliminating the need for client to maintain an expensive database for the server. Finally, in the network-based simulation server, multiple users can view the same mask defect image and provide real-time comments to each other as simulation and analysis are performed on the defect image, thereby encouraging problem solving and decision-making dialogue among the users.

36 Claims, 37 Drawing Sheets

U.S. PATENT DOCUMENTS

| | | | |
|---|---|---|---|
| 5,447,810 A | 9/1995 | Chen et al. ..................... | 430/5 |
| 5,532,090 A | 7/1996 | Borodovsky ................... | 430/5 |
| 5,533,148 A | 7/1996 | Sayah et al. ................ | 382/240 |
| 5,538,815 A | 7/1996 | Oi et al. ......................... | 430/5 |
| 5,553,273 A | 9/1996 | Liebmann ................... | 395/500 |
| 5,572,598 A | 11/1996 | Wihl et al. ................... | 382/144 |
| 5,631,110 A | 5/1997 | Shioiri et al. .................. | 430/5 |
| 5,657,235 A | 8/1997 | Liebmann et al. ..... | 364/474.24 |
| 5,663,893 A | 9/1997 | Wampler et al. ............ | 364/491 |
| 5,702,848 A | 12/1997 | Spence .......................... | 430/5 |
| 5,705,301 A | 1/1998 | Garza et al. ................... | 430/5 |
| 5,707,765 A | 1/1998 | Chen ............................. | 430/5 |
| 5,740,068 A | 4/1998 | Liebmann et al. .......... | 364/489 |
| 5,795,688 A | 8/1998 | Burdorf et al. ............... | 430/30 |
| 5,801,954 A | 9/1998 | Le et al. ...................... | 364/488 |
| 5,804,340 A | 9/1998 | Garza et al. ................... | 430/5 |
| 5,815,685 A | 9/1998 | Kamon ........................ | 395/500 |
| 5,825,647 A | 10/1998 | Tsudaka ................ | 364/167.03 |
| 5,827,623 A | 10/1998 | Ishida et al. .................... | 430/5 |
| 5,847,959 A | 12/1998 | Veneklasen et al. ... | 364/468.28 |
| 5,849,440 A | 12/1998 | Lucas et al. ................... | 430/5 |
| 5,862,058 A | 1/1999 | Samuels et al. ............ | 364/491 |
| 5,863,682 A | 1/1999 | Abe et al. ...................... | 430/30 |
| 6,009,250 A | 12/1999 | Ho et al. ................ | 395/500.06 |
| 6,009,251 A | 12/1999 | Ho et al. ................ | 395/500.06 |
| 6,011,911 A | 1/2000 | Ho et al. ................ | 395/500.06 |
| 6,016,357 A | 1/2000 | Neary et al. ................. | 382/144 |
| 6,076,465 A | 6/2000 | Vacca et al. ................. | 101/481 |
| 6,078,738 A | 6/2000 | Garza et al. ............ | 395/500.22 |
| 6,081,658 A | 6/2000 | Rieger et al. .......... | 395/500.22 |
| 6,081,659 A | 6/2000 | Garza et al. ............ | 395/500.22 |
| 6,130,750 A | 10/2000 | Ausschnitt et al. ......... | 356/401 |
| 6,171,731 B1 | 1/2001 | Medvedeva et al. ........... | 430/5 |
| 2002/0019729 A1 | 2/2002 | Chang et al. ................... | 703/6 |

OTHER PUBLICATIONS

Fiekowsky, P., "The End of Thresholds: Subwavelenght Optical Linewidth Measurement Using the Flux–Area Technique", Automated Visual Inspection (6 pages).

Watanabe, H., et al., "Detection and Printability of Shifter Defects in Phase–Shifting Masks", Japanese Journal of Applied Physics, vol. 30, No. 11B, pp. 3016–3020, Nov. 1991.

Hosono, K., et al., "A Novel Architecture for High Speed Dual Image Generation of Pattern Data for Phase Shifting Reticle Inspection", SPIE—Integrated Circuit Metrology, Inspection, and Process Control VI, vol. 1673–pp. 229–235 (1992).

Ohtsuka, H., et al., "Evaluation of Repair Phase and Size Tolerance for a Phase–Shift Mask", J. Vac. Sci. Technol. B, vol. 11, No. 6, pp. 2665–2668, Nov./Dec. 1993.

Reynolds, J., "Elusive Mask Defects: Reflectivity Variations", Solid State Technology, pp. 75–76, Mar. 1995.

Kusunose, H., et al., "Direct Phase–Shift Measurement with Transmitted Deep–UV Illumination", SPIE, vol. 2793, pp. 251–260 (1996).

Adam, K., et al., "Simplified Models for Edge Transitions in Rigorous Mask Modeling", University of California Berkeley (40 pages).

Gordon, R., et al., "Mask Topography Simulation for EUV Lithography", FINLE Technologies Inc. (15 pages).

Pistor, T., "Rigorous 3D Simulation of Phase Defects in Alternating Phase–Shifting Masks", Panoramic Technology Inc. (13 pages).

Semmier, A., et al., "Application of 3D EMF Simulation for Development and Optimization of Alternating Phase Shifting Masks", Infineon Technologies AG (12 pages).

Wong, A., et al., "Polarization Effects in Mask Transmission", University of California Berkeley (8 pages).

Neureuther, A., et al., "Modeling Defect–Feature Interactions in the Presence of Aberrations", University of California Berkeley (10 pages).

Mathur, B.P., et al., "Quantitative Evaluation of Shape of Image on Photoresist of Square Apertures", IEEE, Transactions On Electron Devices, vol. 35, No. 3, pp. 294–297, Mar. 1988.

Crisalle, O., et al., "A Comparison of the Optical Projection Lithography Simulators in Sample and PROLITH", IEEE, Transactions On Semiconductor Manufacturing, vol. 5, No. 1, pp. 14–26, Feb. 1992.

Qian, Q.D., et al., "A New Scalar Planewave Model for High No Lithography Simulations", IEEE, pp. 45–48 (1994).

Balasinski, A., et al., "A Novel Approach to Simulate the Effect of Optical Proximity on MOSFET Parametric Yield", IEEE, pp. 37.6.1–37.6.4 (1999).

Balasinksi, A., et al., "Comparison of Mask Writing Tools and Mask Simulations for 0.16um Devices", IEEE, Semi Advanced Semiconductor Manufacturing Conference, pp. 372–377 (1999).

Barouch, E. et al., "Optimask: An OPC Algorithm For Chrome And Phase–Shift Mask Design", SPIE, vol. 2440, pp. 192–206, Feb. 1995.

Casey, Jr., J.D. et al., "Chemically Enhanced FIB Repair Of Opaque Defects On Molybdenum Silicide Photomasks", SPIE, vol. 3236, pp. 487–497 (1997).

Cobb, et al., "Fast Sparse Aerial Image Calculation For OPC", SPIE, vol. 2621, pp. 534–544.

Gans, F. et al., "Printability And Repair Techniques For DUV Photomasks", SPIE, Proceedings of the 17$^{th}$ Annual Symposioum on Photomask Technology and Management, vol. 3236, pp. 136–141 (1997).

Ham, Y.M. et al., "Dependence Of Defects In Optical Lithography", Jpn. J. Appl. Phys., vol. 31, pp. 4137–4142 (1992).

Henke, W. et al., "A Study Of Reticle Defects Imaged Into Three–Dimensional Developed Profiles Of Positive Photoresist Using The Solid Lithography Simulator", Microelectronics Eng., vol. 14, pp. 283–297 (1991).

Ibsen, K. et al., "Clear Field Reticle Defect Disposition For Advanced Sub–Half Micron Lithography", SPIE, Proceedings of the 17$^{th}$ Annual Symposium on Photomask Technology and Management, vol. 3236, pp. 124–135 (1997).

Karklin, L., "A Comprehensive Simulation Study Of The Photomask Defects Printability", SPIE, vol. 2621, pp. 490–504 (1995).

Lithas, "Lithas: Optical Proximity Correction Software" (2 pages).

Microunity, "OPC Technology & Product Description", MicroUnity Systems Engineering, Inc., pp. 1–5.

Morimoto, H. et al., "Next Generation Mask Strategy— Technologies Are Ready For Mass Production Of 256MDRAM?", SPIE, vol. 3236, pp. 188–189 (1997).

Nistler, J. et al., "Large Area Optical Design Rule Checker For Logic PSM Application", SPIE, Photomask and X–Ray Mask Technology, vol. 2254, pp. 78–92 (1994).

Nislter, J. et al., "Phase Shift Mask Defect Printability Analysis", Proceedings of the Microlithography Seminar Interface '93, OCG Microelectronic Materials, Inc., pp. 11–28 (1993).

Ohtsuka, H. et al., "Phase Defect Repair Method For Alternating Phase Shift Masks Conjugate Twin–Shifter Method", *Jpn. J. Appl. Phys.*, vol. 31, pp. 4143–4149 (1992).

Park, C. et al., "An Autmatic Gate CD Control For A Full Chip Scale SRMA Device", *SPIE*, vol. 3236, pp. 350–357 (1997).

Pati, Y.C. et al., "Exploiting Structure In Fast Aerial Image Computation For Integrated Circuit Patterns", *IEEE Transactions on Semiconductor Manufacturing*, vol. 10, No. 1, pp. 62–74, Feb. 1997.

Precim, "Proxima System", Precim Company, Portland, Oregon (2 pages).

Precim, "Proxima Wafer Proximity Correction System", Precim Company, Portland, Oregon (2 pages).

Rieger, M. et al., "Customizing Proximity Correction For Process–Specific Objectives", *SPIE*, vol. 2726, pp. 651–659 (1996).

Rieger, M. et al., "Mask Fabrication Rules For Proximity-–Corrected Patterns", Precim Company, Portland, Oregon (10 pages).

Rieger, M. et al., "System For Lithography Proximity Compensation", Precim Company, Portland, Oregon, Sep. 1993 (28 pages).

Rieger, M. et al., "Using Behavior Modeling For Proximity Correction", Precim Company, Portland, Oregon (6 pages).

Spence, C. et al., "Automated Determination Of CAD Layout Failures Through Focus: Experiment and Simulation", *SPIE*, vol. 2197, pp. 302–313 (1994).

Spence, C. et al., "Detection Of 6° Phase Defects On Alternating PSMs", Advance Micro Devices, KLA–Tencor, DuPont RTC (2 pages).

Stirniman, J. et al., "Fast Proximity Correction With Zone Sampling", *SPIE*, vol. 2197, pp. 294–301 (1994).

Stirniman, J. et al., "Optimizing Proximity Correction For Wafer Fabrication Processes", *SPIE*, Photomask Technology and Management, vol. 2322, pp. 239–246 (1994).

Stirniman, J. et al., "Spatial Filter Models To Describe IC Lithographic Behavior", Precim Corporation, Portland, Oregon (10 pages).

Stirniman, J. et al., "Wafer Proximity Correction And Its Impact On Mask–Making", *Bacus News*, vol. 10, Issue 1, pp. 1, 3–7, 10–12, Jan. 1994.

Sugawara, M. et al., "Defect Printability Study Of Attenuated Phase–Shifting Masks For Specifying Inspection Sensitivity", Semiconductor Company, Sony Corporation, Kanagawa Japan (16 pages).

Trans Vector, "Now Better Quality Photomasks", Trans Vector Technologies, Inc., Camarillo, California (4 pages).

Vacca, A. et al., "100nm Defect Detection Using A Dynamically Programmable Image Processing Algorithm", *SPIE*, vol. 3236 (1997) (Abstract Only).

Watanabe, H. et al., "Detection And Printability Of Shifter Defects In Phase–Shifting Masks II Defocus Characteristics", *Jpn. J. Appl. Phys.*, vol. 31, pp. 4155–4160 (1992).

Wiley, J. et al., "Device Yield And Reliability By Specification Of Mask Defects", *Solid State Technology*, vol. 36, No. 7, pp. 65–66, 70, 72, 74, 77, Jul. 1993.

Wiley, J. et al., "The Effect Of Off–Axis Illumination On The Printability Of Opaque And Transparent Reticle Defects", *SPIE*, vol. 2512, pp. 432–440 (1995).

Wiley, J. et al., "Phase Shift Mask Pattern Accuracy Requirements And Inspection Technology", *SPIE*, Integrated Circuit Metrology, Inspection, and Process Control V, vol. 1464, pp. 346–355 (1991).

Yen, A. et al., "Characterization And Correction Of Optical Proximity Effects in Deep–Ultraviolet Lithography Using Behavior Modeling", *J. Vac. Sci. Technol. B*, vol. 14, No. 6, pp. 4175–4178, Nov./Dec. 1996.

Lin, B.J., et al., "Single–Level Electric Testsites for Phase–Shifting Masks", SPIE, vol. 1673, pp. 221–228, Mar. 9–11, 1992.

METHOD AND APPARATUS FOR A NETWORK-BASED MASK DEFECT PRINTABILITY ANALYSIS SYSTEM

RELATED APPLICATIONS

This application is a continuation-in-part of U.S. patent application Ser. No. 09/130,996 entitled, "Visual Inspection and Verification System", filed on Aug. 7, 1998, which in turn relates to U.S. patent application Ser. No.60/059,306, entitled "Mask Verification Correction and Design Rule Checking", filed on Sep. 17, 1997, both applications incorporated by reference herein.

THE BACKGROUND OF THE INVENTION a. The Field of the Invention

This invention relates to the field of integrated circuit manufacturing. In particular, the invention relates to a system for inspection of defects on masks used in the manufacture of integrated circuits.

b. Description of Related Art

In designing an integrated circuit (IC), engineers typically rely upon computer simulation tools to help create a circuit schematic design consisting of individual devices coupled together to perform a certain function. To actually fabricate this circuit in a semiconductor substrate the circuit must be translated into a physical representation, or layout, which itself can then be transferred onto a template (i.e., mask), and then to the silicon surface. Again, computer aided design (CAD) tools assist layout designers in the task of translating the discrete circuit elements into shapes which will embody the devices themselves in the completed IC. These shapes make up the individual components of the circuit, such as gate electrodes, field oxidation regions, diffusion regions, metal interconnections, and so on.

Once the layout of the circuit has been created, the next step to manufacturing the integrated circuit (IQ is to transfer the layout onto a semiconductor substrate. One way to do this is to use the process of optical lithography in which the layout is first transferred onto a physical template which is in turn used to optically project the layout onto a silicon wafer.

In transferring the layout to a physical template, a mask (usually. a quartz plate coated with chrome) is generally created for each layer of the integrated circuit design. This is done by inputting the data representing the layout design for that layer into a device such, as an electron beam machine which writes the integrated circuit layout pattern into the mask material. In less complicated and dense integrated circuits, each mask comprises the geometric shapes which represent the desired circuit pattern for its corresponding layer. In more complicated and dense circuits in which the size of the circuit features approach the optical limits of the lithography process, the masks may also comprise optical proximity correction features such as serifs, hammerheads, bias and assist bars which are sublithographic, sized features designed to compensate for proximity effects. In other advanced circuit designs, phase shifting masks may be used to circumvent certain basic optical limitations of the process by enhancing the contrast of the optical lithography process.

These masks are then used to optically projected the layout onto a siliconwafer coated with photoresist material. For each layer of the design, a light is shone on the mask corresponding to that layer via a visible light source or an ultra-violet light source. This light passes through the clear regions of the mask, whose image exposes the underlying photoresist layer, and is blocked by the opaque regions of the mask, leaving that underlying portion of the photoresist layer unexposed. The exposed photoresist layer is then developed, typically, through chemical removal of the exposed/non-exposed regions of the photoresist layer. The end result is a semiconductor wafer coated with a photoresist layer exhibiting a desired pattern which defines the geometries, features, lines and shapes of that layer. This process is then repeated for each layer of the design.

As integrated circuit designs become more complicated, it becomes increasingly important that the masks used in photolithography are accurate representations of the original design layout. It is, unfortunately, unrealistic to assume that the electron beam and other machines used to manufacture these masks can do so without error. In the typical manufacturing process, some mask defects do occur outside the controlled process.

A defect on a mask is anything that is different from the design database and is deemed intolerable by an inspection tool or an inspection engineer. FIGS. 1(a)–(f), illustrate a mask 100 representing a simple integrated circuit design which contains some of the common mask defects that occur during the mask manufacturing process. The mask 100 comprises an opaque area 105, typically made of chrome, and clear areas 110 and 20 which represent the geometry primitives to be transferred onto the photoresist layer, and typically made of quartz. FIG. 1(a) illustrates an isolated pinhole defect 125, in the opaque area 105 of the mask 100. FIG. 1(b) illustrates an isolated opaque spot defect 130 in the clear area 110 of the mask 100. FIG., 1(c) illustrates edge intrusion defects 140 in the clear areas 110 and 120 of the mask 100. FIG. 1(d) illustrates edge protrusion defects 145 in the opaque area 105 of the mask 100. FIG. 1(e) illustrates a geometry break defect 150 in the clear area 110 of the mask 100. Finally, FIG. 1(f) illustrates a geometry bridge defect 155 in the opaque area 105 of the mask 100.

FIGS. 2(a)–(b) illustrate possible defects which may occur on a mask which utilizes optical proximity correction features. FIG. 2(a) illustrates a simple desired mask design 200 consisting of an opaque area 205, a clear area 210 which represents the shape desired to be transferred to the photoresist, and design serifs 215 which are added to the design to correct for optical proximity effects. FIG. 2(b) illustrates the mask 220 which could be produced by a typical electron beam machine given the mask design 200 as an input. The mask 220 comprises an opaque area 225, a clear area 230, and modified serifs 235. Note that the shape of the modified serifs 235 is different than the shape of the design serifs 215. This is because the size of the serifs is very small——they are designed to be smaller than the optical resolution of the lithography process to be used——and the electron beam typically can not perfectly reproduce the design serif 215 shape onto the mask material. The result would be similar for masks which utilize-other optical proximity correction features such as hammerheads, bias bars and assist bars.

One typical method of inspecting a mask for defects such as those illustrated in FIGS. 1 and 2 is illustrated in the flowchart of FIG. 3. After designing an integrated circuit 300 and creating a data file of mask design data 310, the mask design data is provided to a device such as an electron beam or laser writing machine and a mask is manufactured 315. The mask is then inspected for defects as shown at process block 320. The inspection may, for instance, be carried out by scanning the surface of the mask with a high resolution microscope (e.g., optical, scanning electron, focus ion beam, atomic force, and near-field optical microscopes) and capturing images of the mask. These mask images may then be observed by engineers off-line or mask fabrication workers online to identify defects on the physical mask. The next step, shown as decision block 325, is determining whether or not the inspected mask is good enough for use in the lithography process. This step can be performed offline by a skilled-inspection engineer, or by fabrication workers online possibly with the aid of inspection software. If there are no defects, or defects are discovered but determined to be within tolerances set by the manufacturer or end-user, then the mask is passed and used to expose a wafer as shown at process block 340. If defects are discovered that fall outside tolerances, then the mask fails the inspection 325, and a decision 330 must be made as to whether the mask may be cleaned and/or repaired to correct the defects 335, or whether the defects are so severe that a new mask must be manufactured 315. This process is continued until a manufactured mask passes the inspection 325.

Once a physical mask is produced which passes the inspection, it is important to further inspect the mask to ensure that the mask will produce the desired image on a photoresist after a wafer is exposed to light through the mask. This is typically performed by undertaking the costly step of actually exposing and processing a wafer using the mask that is being inspected as shown at process block 340. The processed wafer is then inspected at block 345, and a decision 350 is made to determine whether there are any defects and whether the defects fall within tolerances. If discovered defects are substantial, then, as before, it is determined 330 whether the defects can be repaired 335 or whether a new mask must be produced 315. This process is continued until a mask is manufactured that will produce desired wafer patterns and that will pass the wafer level inspection shown at block 350. This mask is then used in the lithography process to expose the corresponding layer in the overall manufacturing process.

However, not all mask defects are important with respect to the desired end result——the end result being an-accurate representation of the original design layout on the photoresist material or etched into silicon. This is because not all mask defects will "print." Loosely speaking, the printability of a defect is how a defect would impact the outcome of a given photolithography and/or etching process. The importance of printability now becomes apparent, because the goal of defect inspection is to correctly identify a defect in order to avoid a failed wafer processing. Since printability of a defect is mainly associated with the stepper exposure, it depends on the particular stepper exposure conditions. Therefore to say a' defect is "not printable" means that it has little effect on the expected outcome of a particular stepper exposure, even though it may become "printable" under a different set of stepper exposure conditions. Put in a different way,.printability is highly dependent on the stepper conditions, because a defect may print under one set of conditions, but not another. These conditions include: defect size, wavelength, numerical apertures coherence factor, illumination mode, exposure time, exposure focus/defocus, and the reflection/transmission characteristics of the defect among others.

Currently, inspection tools that are in use include tools which inspect masks both on-line (ie. within the production line) and off-line. Conventional on-line inspection tools typically scan the entire mask area looking for defect areas, and some may also compare the inspected result with the mask layout database when defects are detected. However, the defect analysis of the typical on-line inspection tools are based primarily (or solely) on the size of the defect picked up by the optics to define the severity of a particular defect. While this scheme has been somewhat successful in the past, today's masks are designed with smaller and smaller features, using advanced and unconventional methods such as OPC. Due to these changes, conventional methods of, inspection are rapidly proving to be inadequate because they do not address several issues.

First, whether a defect prints or not greatly depends on both its location and size, not just size or transmission/reflection characteristics alone. For example, a large defective spot in an isolated area may have little or no effect on the current and subsequent process layers. On the other hand, a small spot near a corner or an edge, or critical area should not be dismissed without closer examination. This is true for both conventional binary masks and advanced masks. Second, advanced OPC mask features can trigger false defect detections. The typical conventional scheme can falsely report an OPC feature or an imperfect OPC feature (e.g., rounded serifs as illustrated in FIG. 2) as a defect, when it actually has little impact on the end result. Although some existing mask inspection tools have a sliding scale setting to "tolerate" OPC features this is not a robust method since defects associated with these special features may be overlooked because of this arbitrary scale. Additionally, OPC features are typically designed for a specific set of stepper parameters, but conventional tools, sliding scales are blind to these optical parameters.

Third, phase information is not properly incorporated into consideration, if at all, in the typical conventional defect inspection scheme. Therefore, phase shifting masks are not properly inspected. Finally, even though a defect may not appear to print, it might affect the process latitude in a way that will decrease yield and not be detected by conventional on-line defect inspection, systems.

On the other hand,. off-line inspection stations, which either scan for defects directly or review previously stored undeterminable defect data from an on-line tool, also face the same issues. In addition, these issues may require expensive engineers' time to be resolved, and thus diminish throughput while raising cost. Although with an engineer's judgement, magnitude of the defect printability/classification problem is greatly reduced due to experience and know-how, still, there is not enough certainty and accuracy until the defect is viewed as it appears on an actual wafer after exposure through the mask. This is especially true in today's lithography steppers using non-standard illumination modes such as annular and quadruple. Thus, using currently existing inspection systems, it is nearly impossible to judge a defect's printability without actually printing the mask onto a wafer, which is expensive and time-consuming.

Accordingly, in any mask inspection system, the important decision to be made is whether a given defect will "print" on the underlying photoresist in a lithography process under specified conditions. If a mask defect does not print or have other effects on the lithography process (such as unacceptably narrowing the photolithography process window), then the mask with the defect can still be used to provide acceptable lithography results. Therefore, one can avoid the expense in time and money of repairing and/or replacing masks whose defects do not print. What is desired then, is a method and apparatus for inspecting masks used in the photolithography process that solve the aforementioned problems of currently existing mask inspection systems.

A SUMMARY OF THE INVENTION

In accordance with the present invention, a simulation server provides mask defect printability analysis over a network to various client sites. A client site includes a plurality of client view stations. In one embodiment, at least one client view station is used by a mask house or a fab that provides services to the client.

To communicate with the client view stations, the simulation server includes a network server. In one embodiment, the network server is programmed with open source software. By using open source software, the code for implementing the network server is extremely robust with minimal additional cost to the total system.

The network server includes an interface that receives a mask image from the client. The mask image may represent a single potential defect or multiple potential defects on the mask. The interface transfers the mask image to a module in the network server. The module, in turn, stores the mask image in a database. The database also stores a plurality of simulation models.

Upon receiving an indication that a user at a client view station wants to analyze the mask image, the appropriate module in the network server retrieves the necessary information from the database and transfers that information to an application. The application includes simulation software as well as one-dimensional plot and report generation software. In one embodiment, the application generates a simulation image of the mask image using at least one simulation model. Stepper parameters, input by the user (or provided by default) and stored in the database, are used for calibrating that simulation model.

After the application operates on the information and outputs the test results in the form of simulations, one-dimensional plots, or reports, these results are provided to the appropriate module. The module then transfers the test results to the interface, which displays those results to the user. The module also stores the test results in the database for future review or additional analysis.

The layout images of the corresponding mask defect areas can also be stored in the database. For reference purposes, the user can simulate a layout image and compare this simulated layout image to the corresponding simulated mask image. In one embodiment, the application calculates the difference between the two images and displays the difference, thereby providing a two-dimensional representation of the defect.

In the present invention, users at the client view stations can simultaneously view the analysis being done on the mask image. In one embodiment, users can communicate during this analysis, thereby providing the users a valuable opportunity for problem solving and decision-making.

To facilitate organization of this complex network-based process, a hierarchy of authorizations is provided for the users. Each user has an assigned authorization that allows the user to perform predetermined tasks with the mask image. In one embodiment, the authorizations in descending order are administrator, manager, process engineer, and operator.

To facilitate analyzing the mask image, the user can use a panning and zooming feature of the invention to designate either a two-dimensional area for the simulation image or a cutline for the one-dimensional plot. A number of one-dimensional plots can be generated including, for example, an aerial image intensity plot, an intensity versus defocus plot, an intensity versus exposure plot, a process window plot, and a latitude curve.

Where security is an issue, transmission of data across the network, including mask images and mask analysis, may be encrypted. In this case, the simulation server includes means for decrypting the mask image and encrypting the mask analysis.

The simulator server of the present invention can be used in any system with multiple users. Therefore, in one embodiment, the network includes a wide area network, such as the Internet, and each client view station includes a browser connected to the network. In another embodiment, the network includes a company's Intranet and each client view station is a campus site of the company. The campus sites may be across the world, across the city, across the street, or across the hallway from one another. In one embodiment, the network is implemented with dedicated lines.

In accordance with the present invention, an integrated circuit is fabricated using an improved mask, wherein the improved mask includes either a mask defect or a corrected mask defect analyzed using the following steps. A database stores a plurality of simulation models. A wide area network server receives a mask defect image. A simulation image of the mask defect image is generated using at least one simulation model. The simulation image is displayed via the wide area network server. If the simulation image is acceptable, then the mask defect is not repaired. However, if the simulation image is unacceptable, then the mask defect is repaired, thereby creating the corrected mask defect.

A BRIEF DESCRIPTION OF THE DRAWINGS

The figures illustrate the invention by way of example, and not limitation. Like references indicate similar elements.

FIGS. 1(a)–(f) illustrate examples of typical photolithography mask defects.

FIGS. 2(a)–(b) illustrate an optical proximity corrected photolithography mask with typical defects.

Figure 5A:
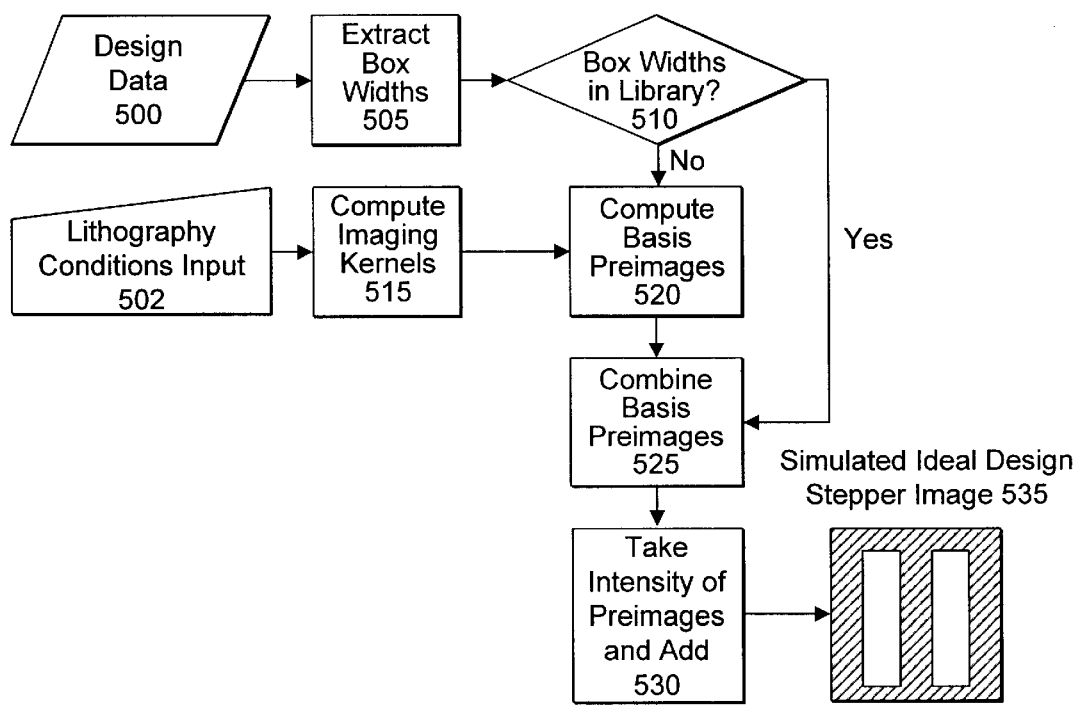
Figure 5B:
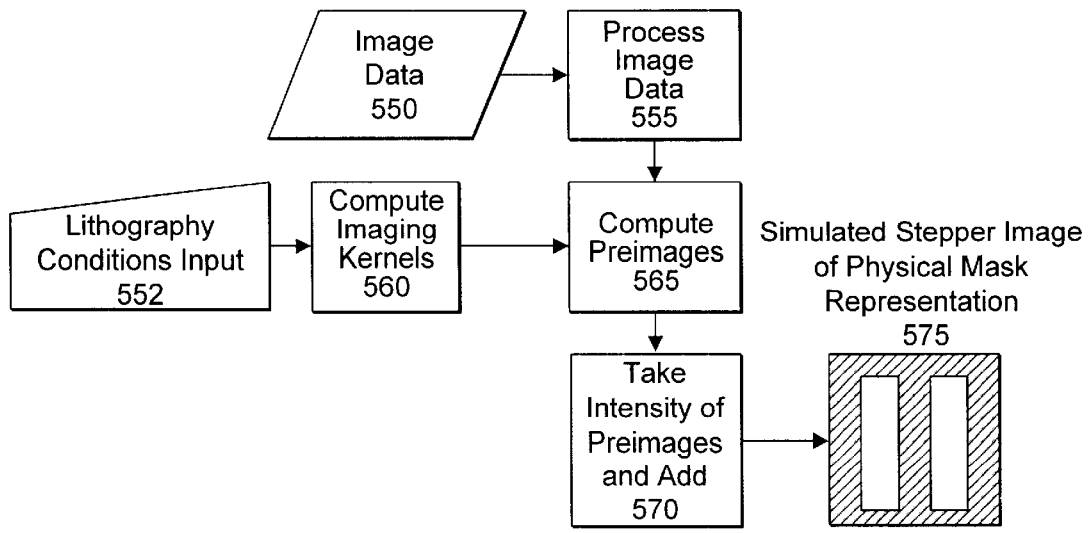

FIGS. 5(a)–(b) illustrate, in simplified process flow diagram form, two embodiments of the image simulation process utilized n the present invention to produce simulated stepper images of an exposed wafer.

Figure 6A:
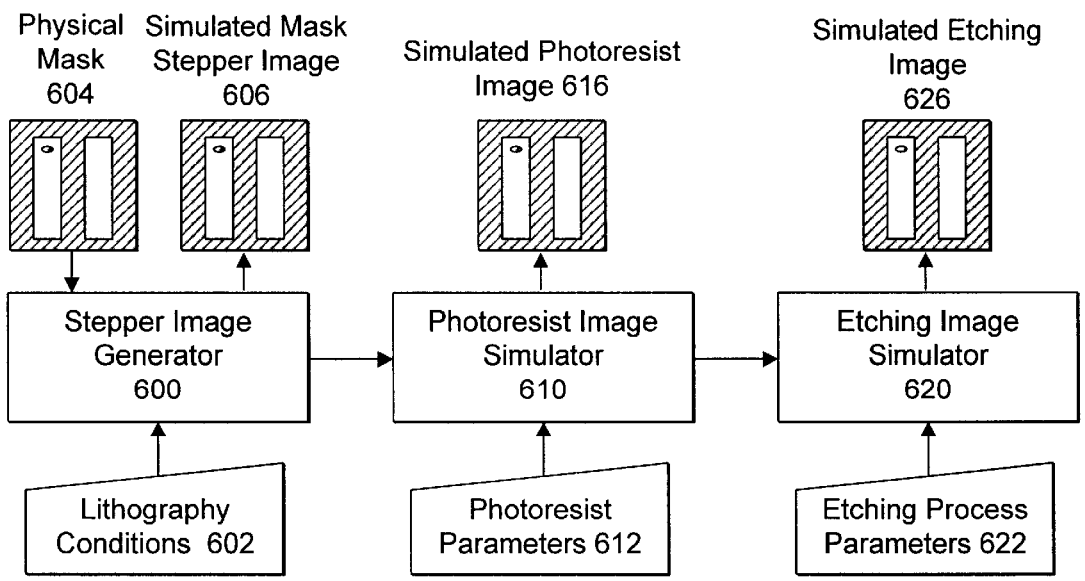
Figure 6B:
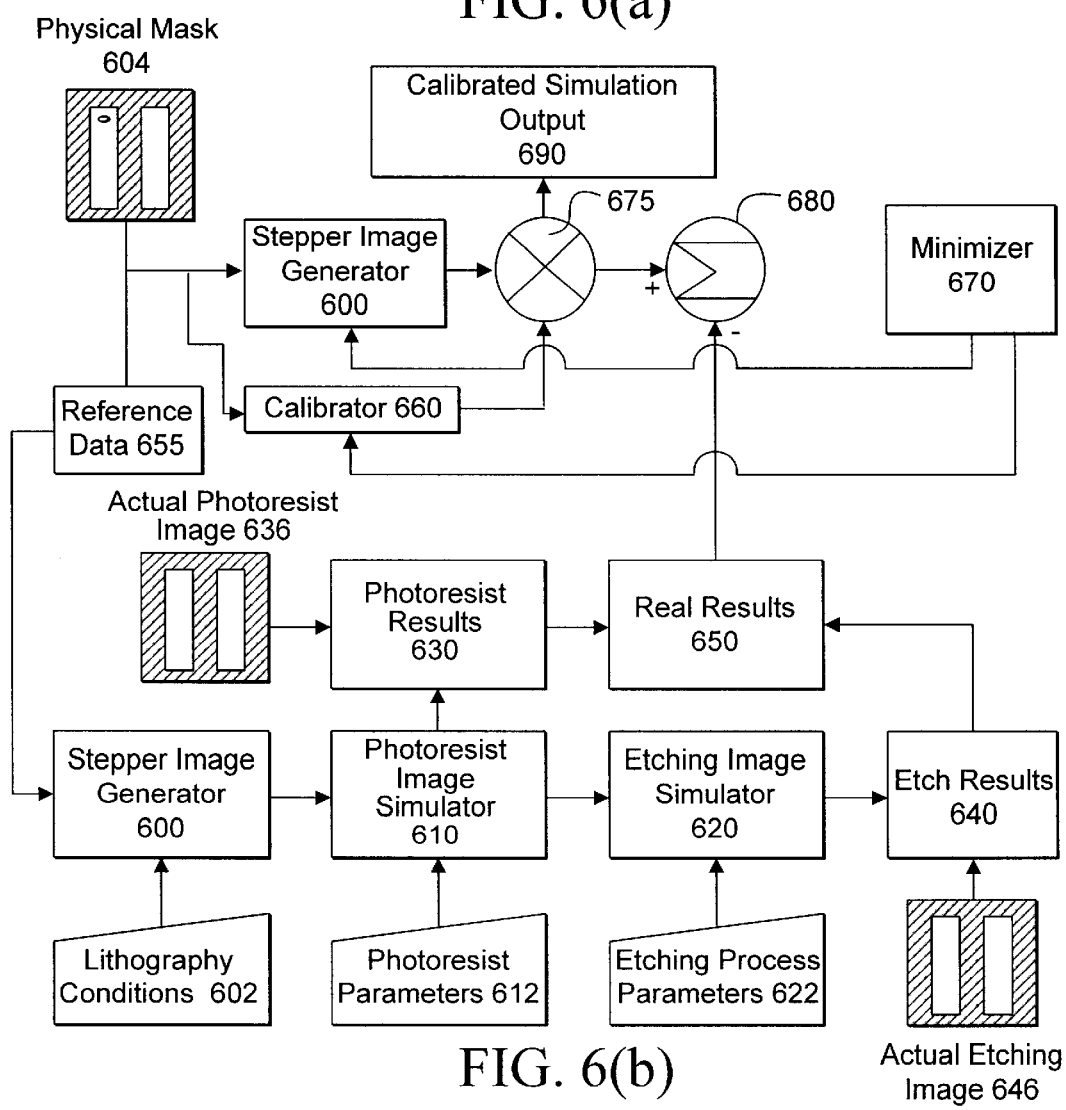

FIGS. 6(a)–(b) illustrate, in simplified process flow diagram form, two methods of utilizing one embodiment of the present invention to generate image simulations which incorporate photoresist material parameters and etching parameters.

Figure 7A:
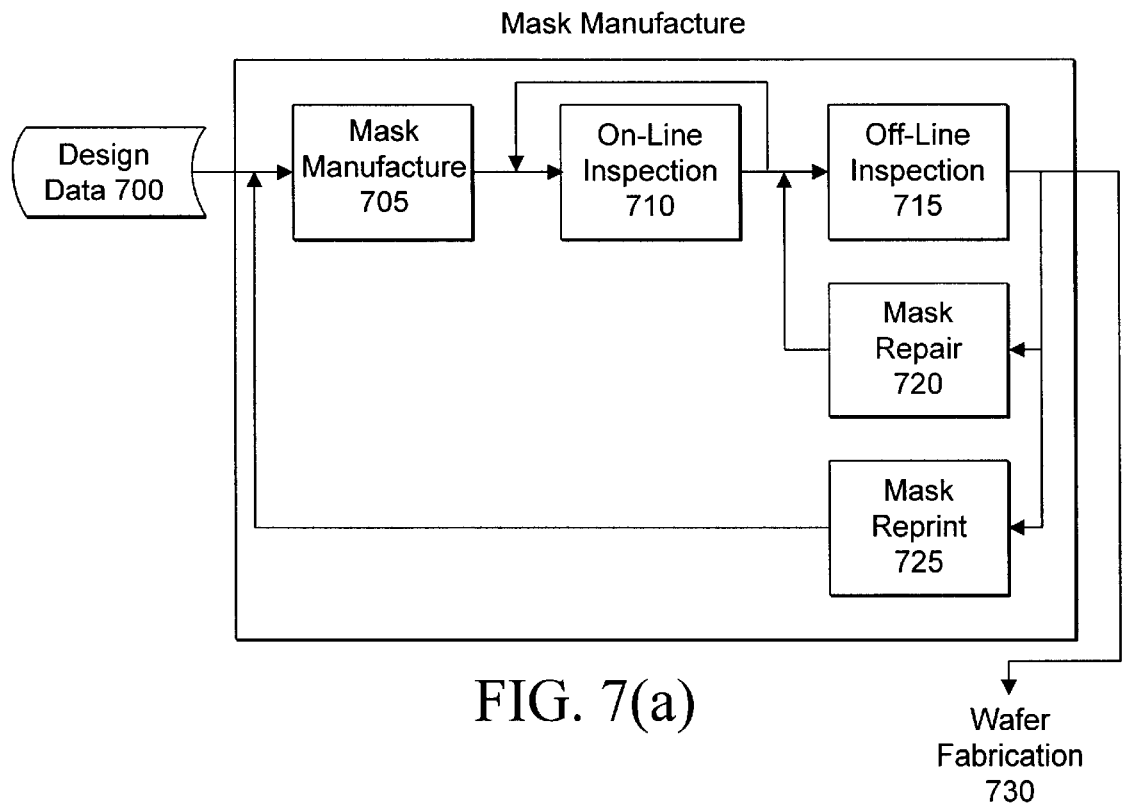
Figure 7B:
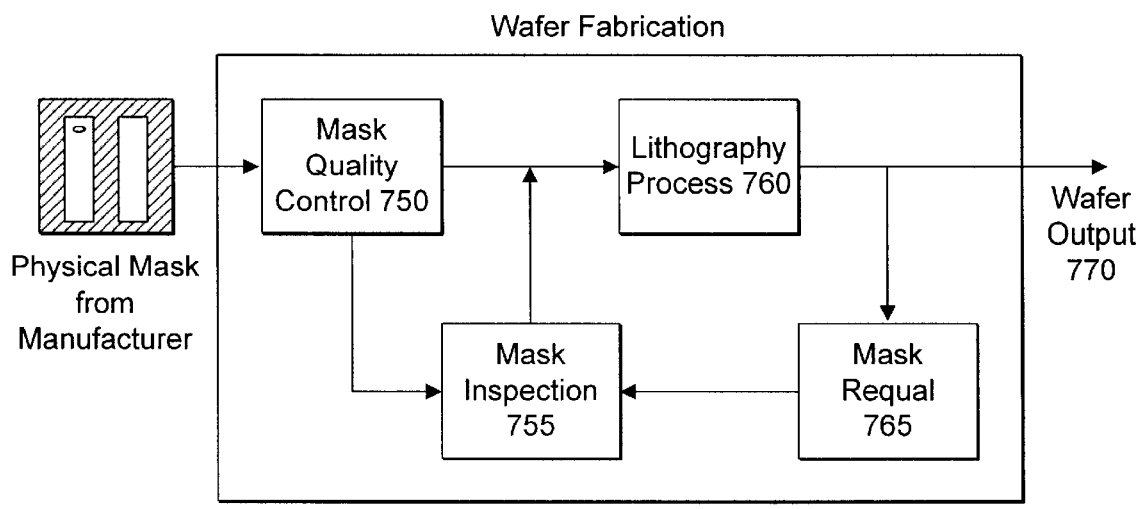

FIGS. 7(a)–(b) illustrate, in simplified mask manufacture and wafer fabrication process flow diagrams showing how an embodiment of the present invention could be integrated into these processes.

Figure 8:
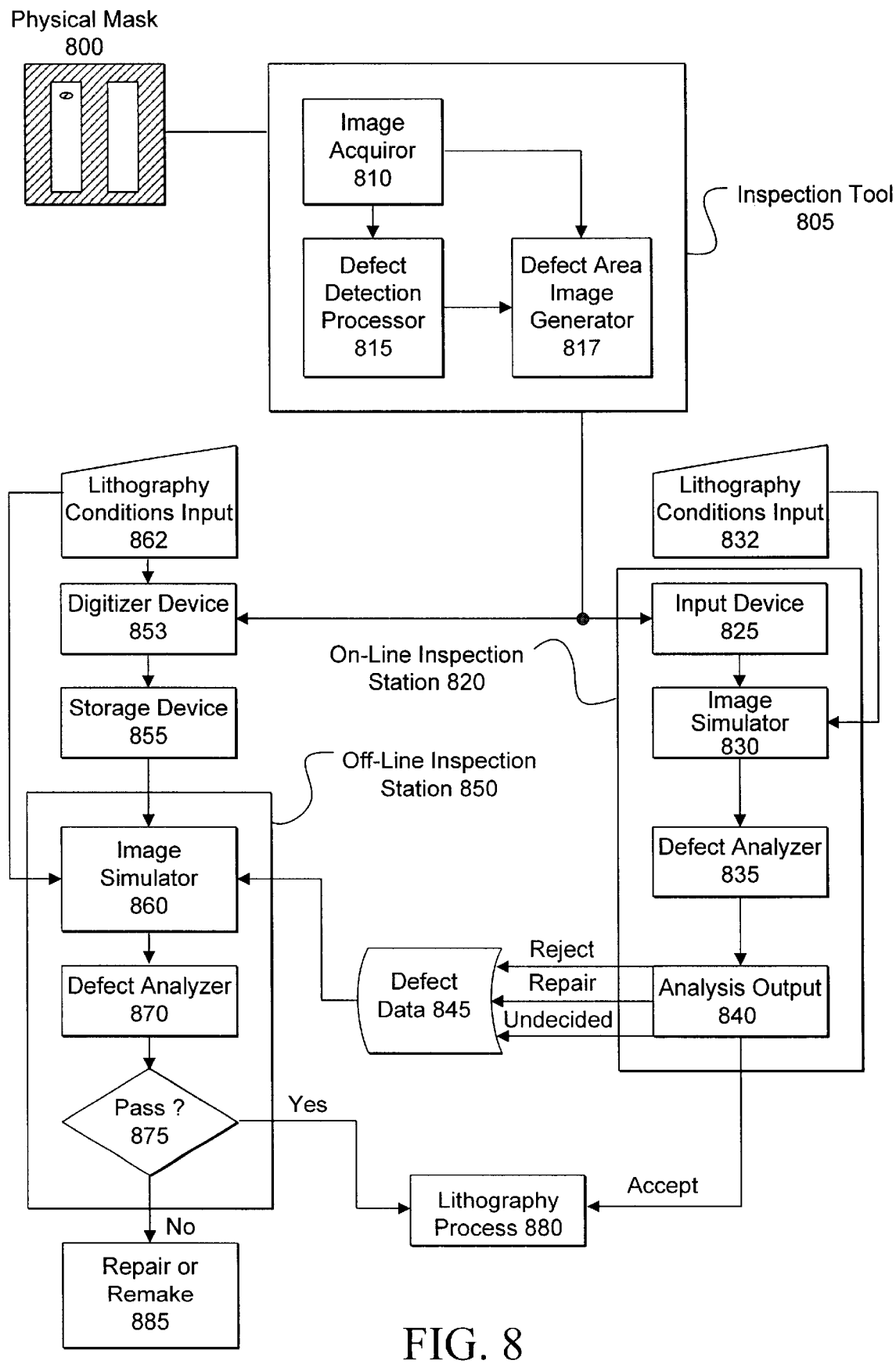

FIG. 8 illustrates a system for both on-line and off-line inspection of a mask in accordance with one embodiment of the present invention.

Figure 9:
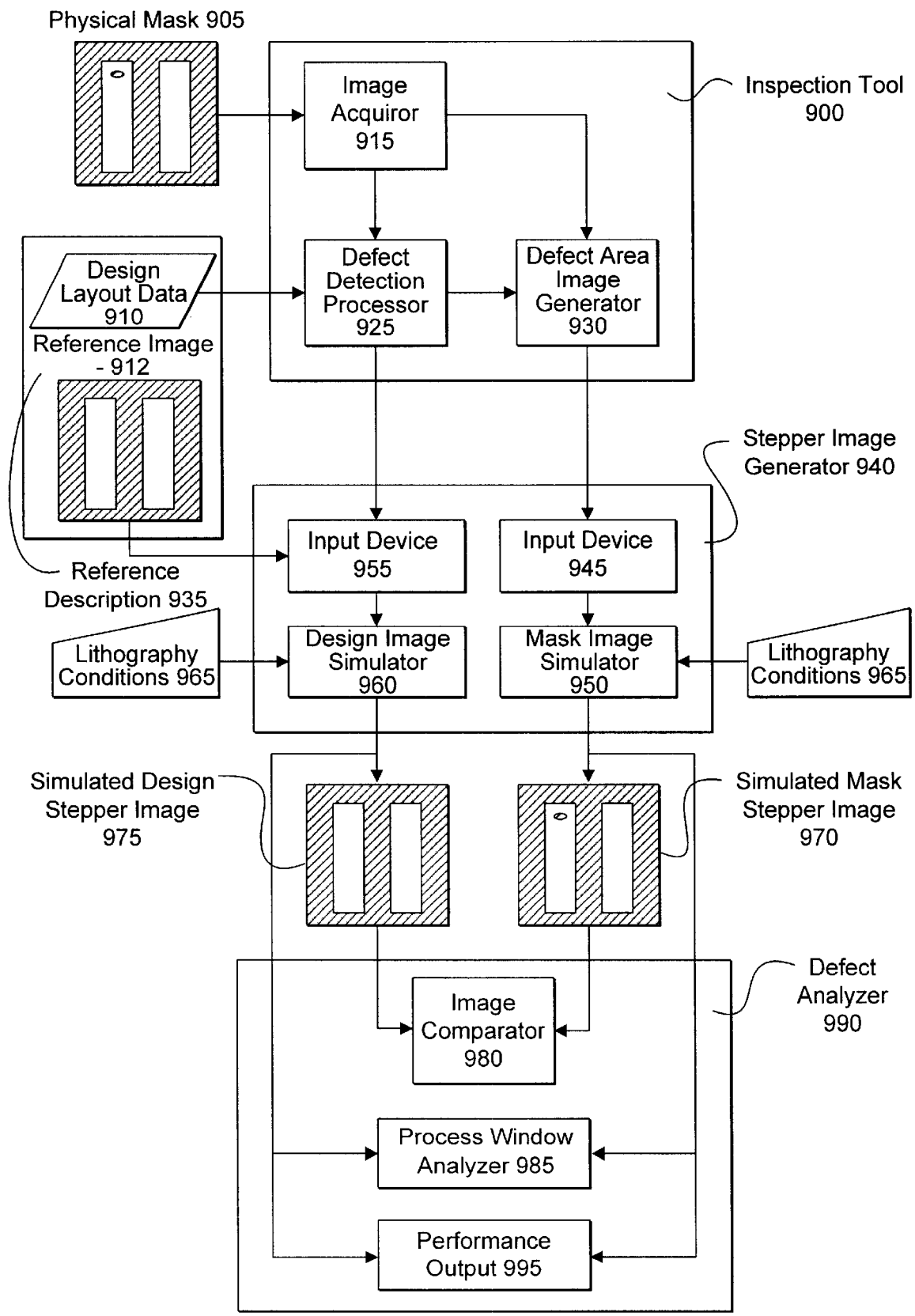

FIG. 9 illustrates a further system for the inspection of a mask in accordance with one embodiment of the present invention.

Figures 10A, 10B, 10C:
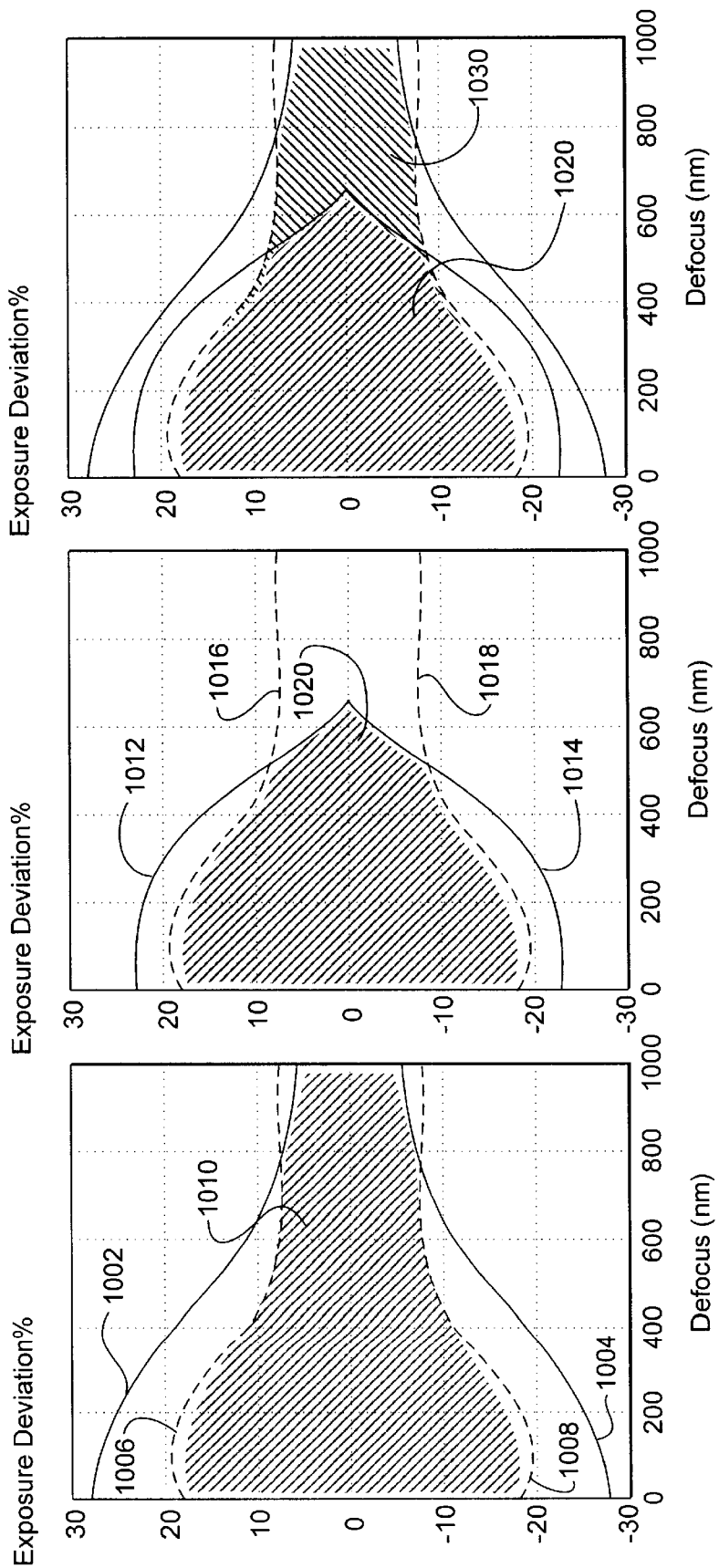

FIGS. 10(a)–(c) illustrate how an example of how a potential mask defect can affect the process window of the photolithography process.

Figure 11:
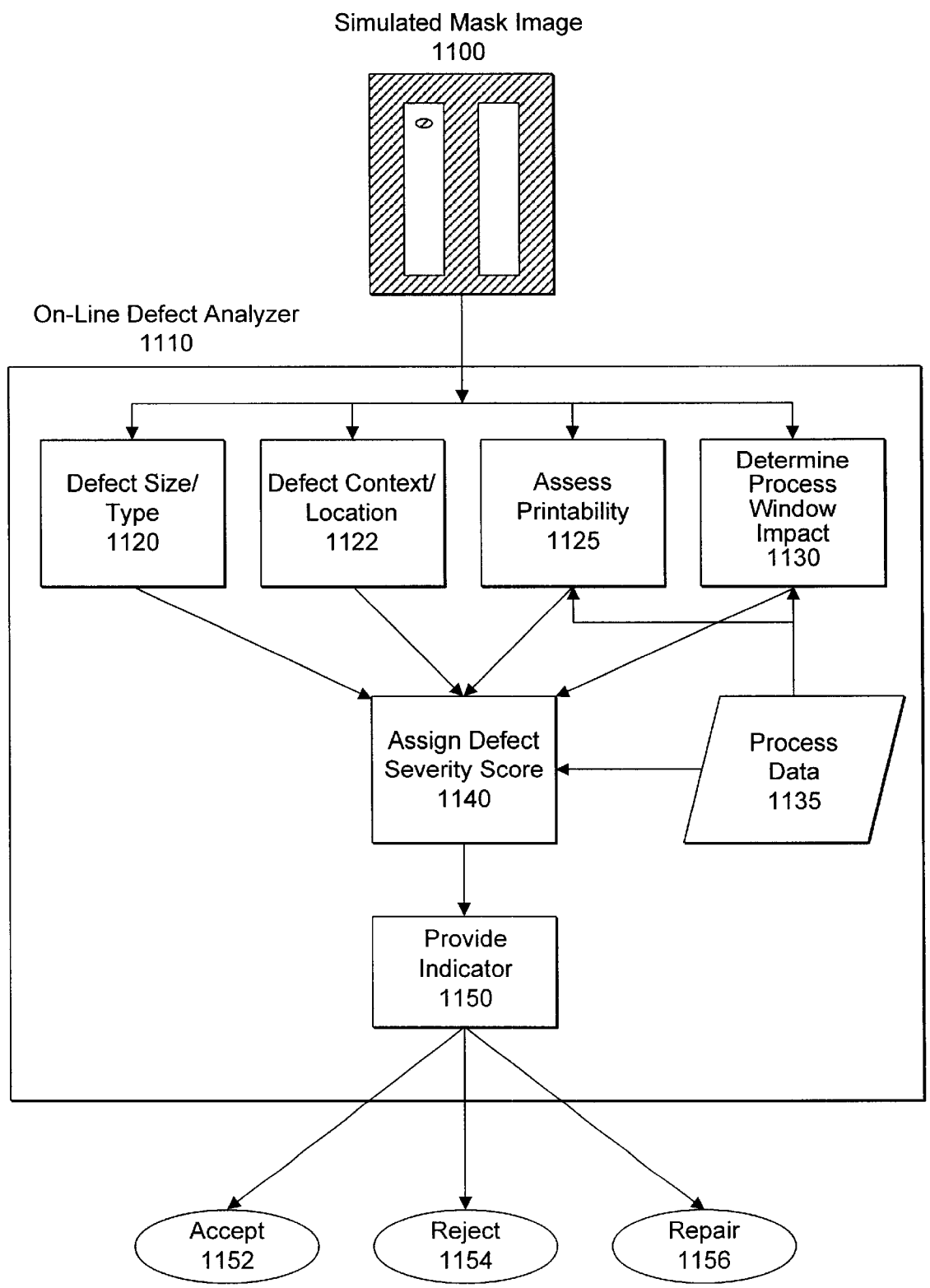

FIG. 11 illustrates a process flowchart representing one embodiment of the defect analyzer of FIG. 8.

Figure 12:
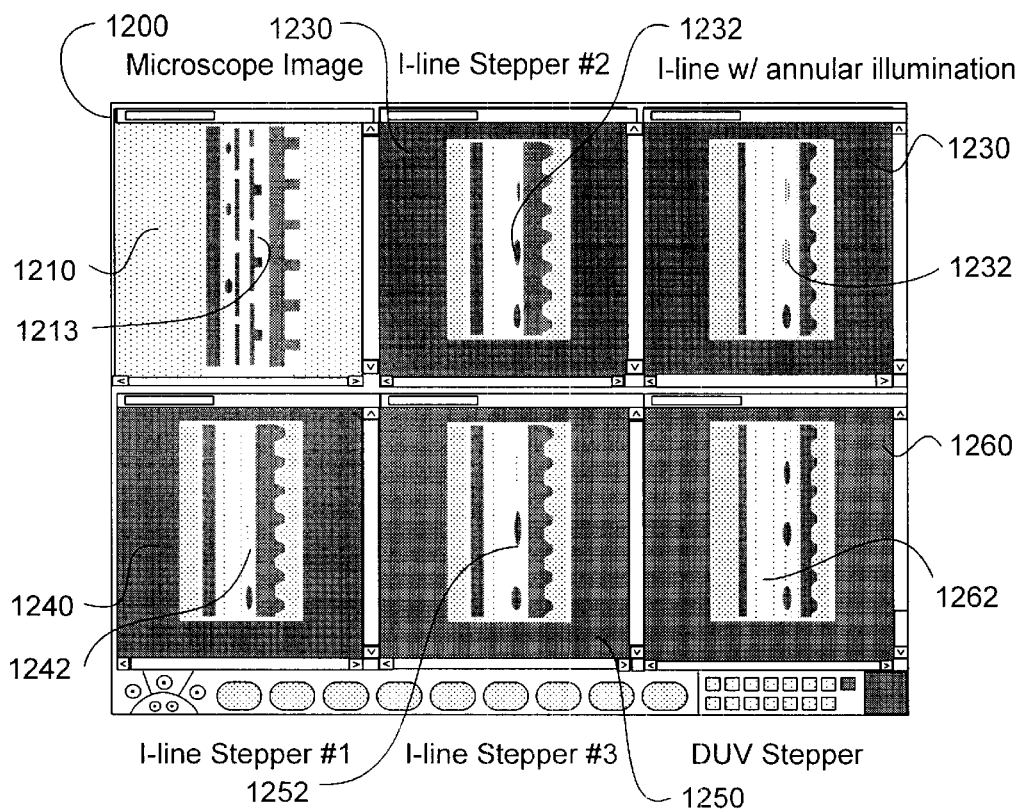

FIG. 12 illustrates a screen shot of a computer program operating in accordance with one embodiment of the present invention in which a mask with a defect is simulated to print under 5 different sets of stepper conditions.

Figure 13:
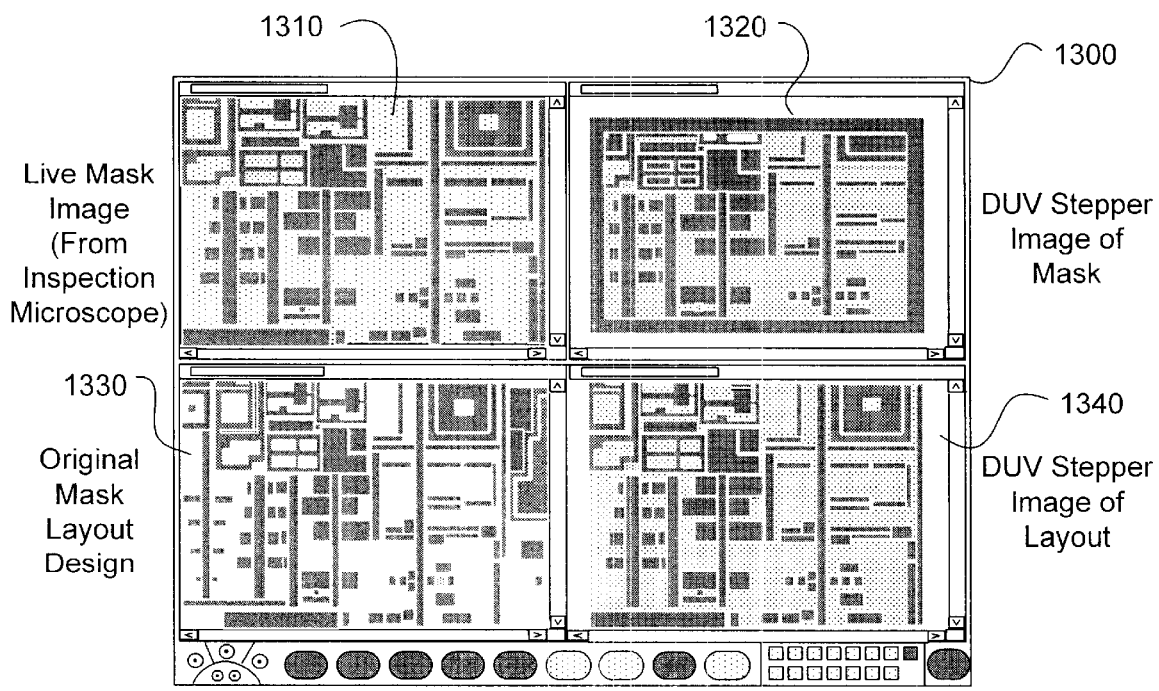

FIG. 13 illustrates a screen shot depicting the user interface of a computer program operating in accordance with one embodiment of the present invention.

Figure 14:
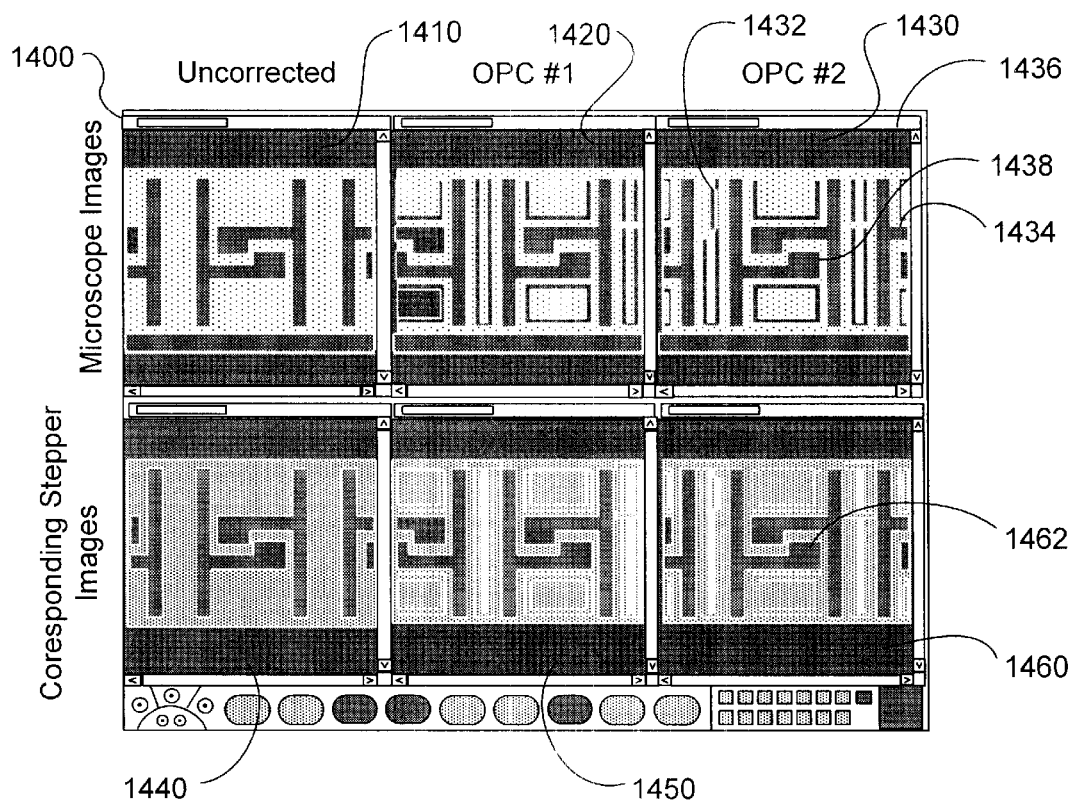

FIG. 14 illustrates a screen shot of a computer program operating in accordance with one embodiment of the present invention in which the mask being inspected has been OPC corrected.

Figure 15:
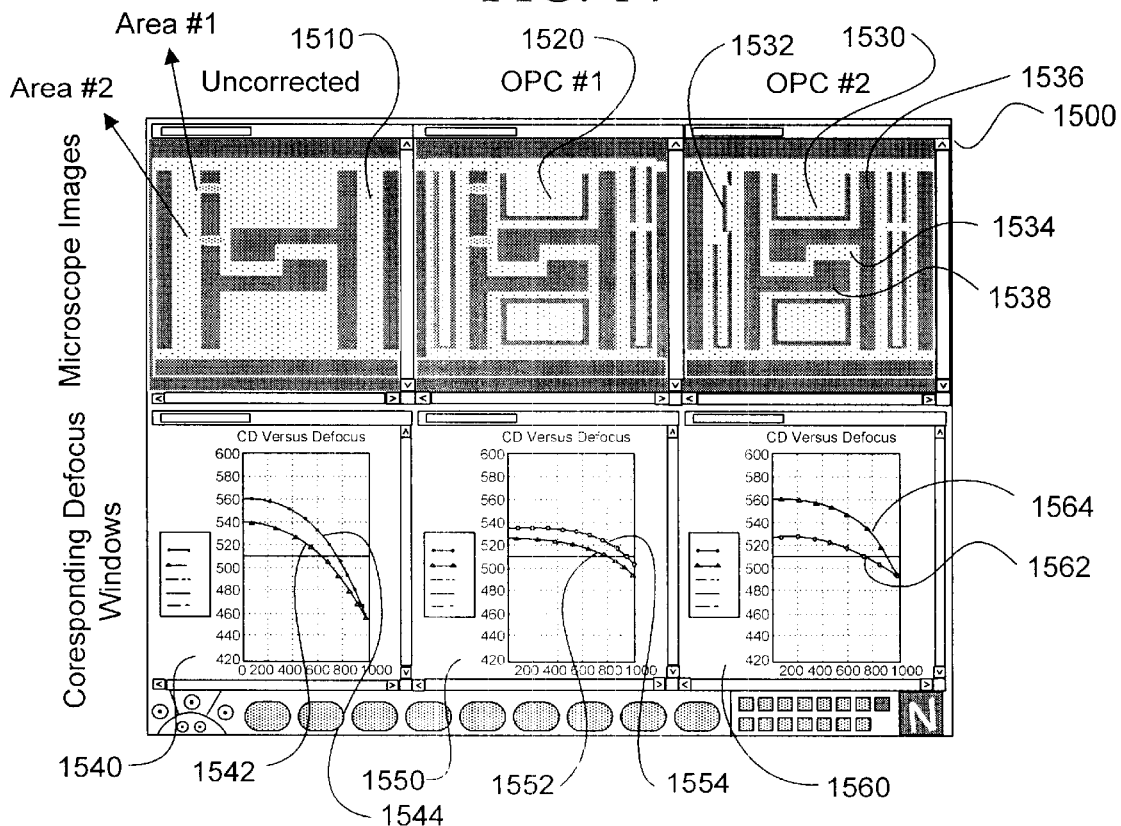

FIG. 15 illustrates a further screen shot of a computer program operating in accordance with one embodiment of the present invention in which the mask being inspected has been OPC corrected, in which a process window related output is shown.

Figure 16:
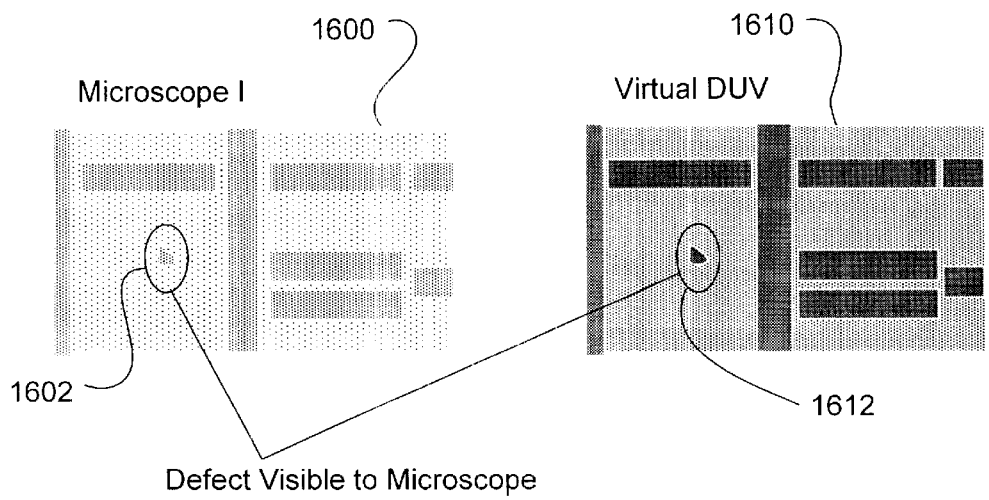

FIG. 16 illustrates a situation in which an identified mask defect is shown not to print under a particular set of stepper conditions by a computer program operating in accordance with one embodiment of the present invention.

Figure 17:
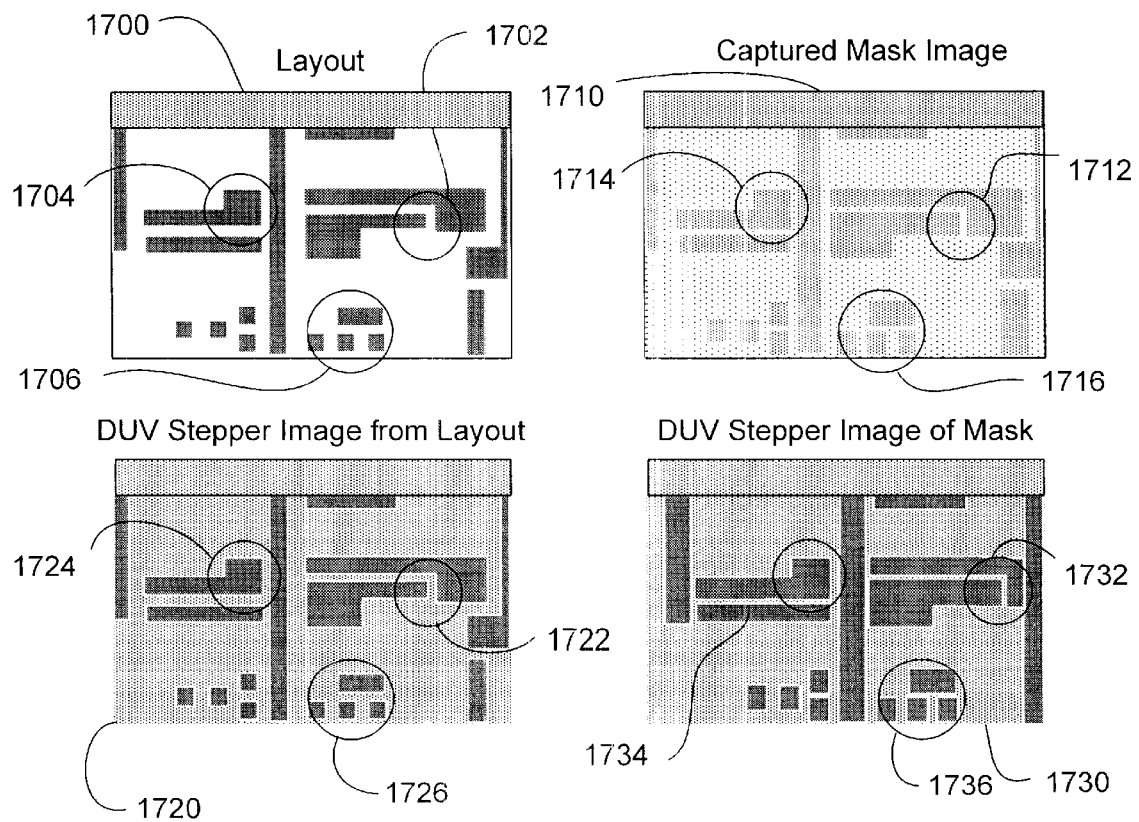

FIG. 17 illustrates several screen shots of a computer program operating in accordance with one embodiment of the present invention in which a simulated mask image is compared to a simulated design image in order to reveal potential defect areas.

Figure 18:
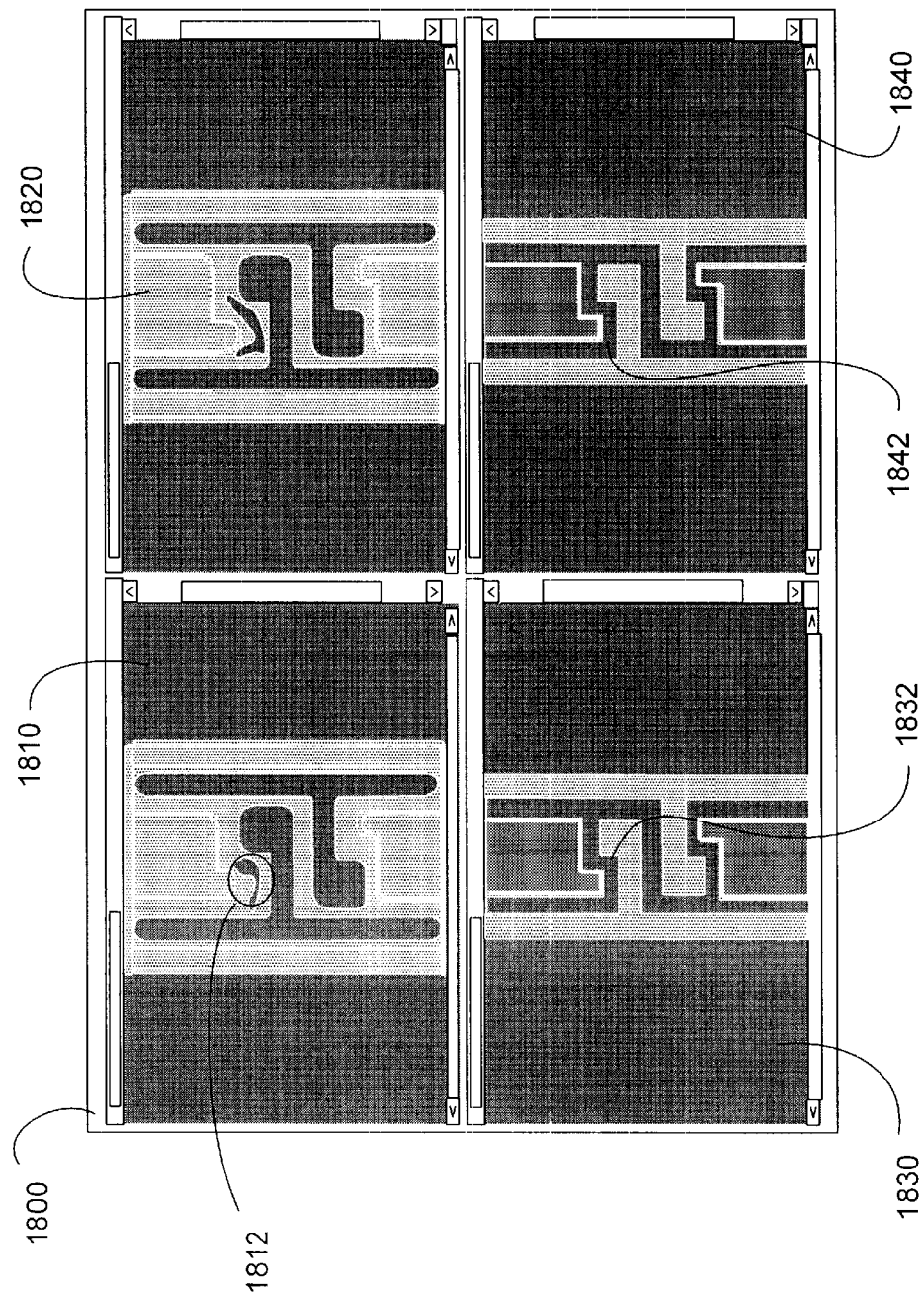

FIG. 18 illustrates a still further screen shot of a computer program operating in accordance with one embodiment of the present invention in which the mask being inspected has been OPC corrected.

Figure 19:
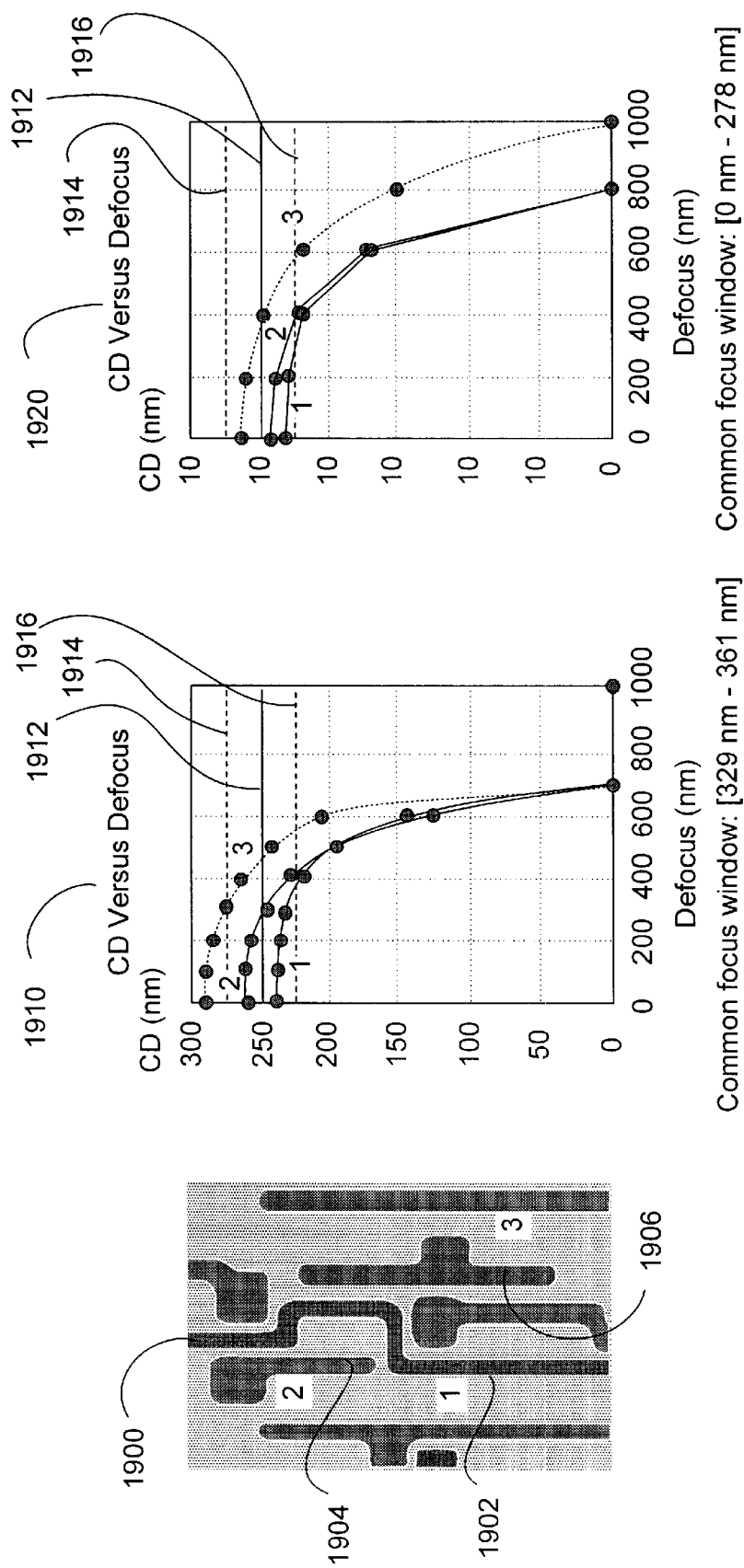

FIG. 19 illustrates several screenshots of a computer program operating in accordance with one embodiment of the present invention in which the effect of defects on the process window is demonstrated.

Figure 20:
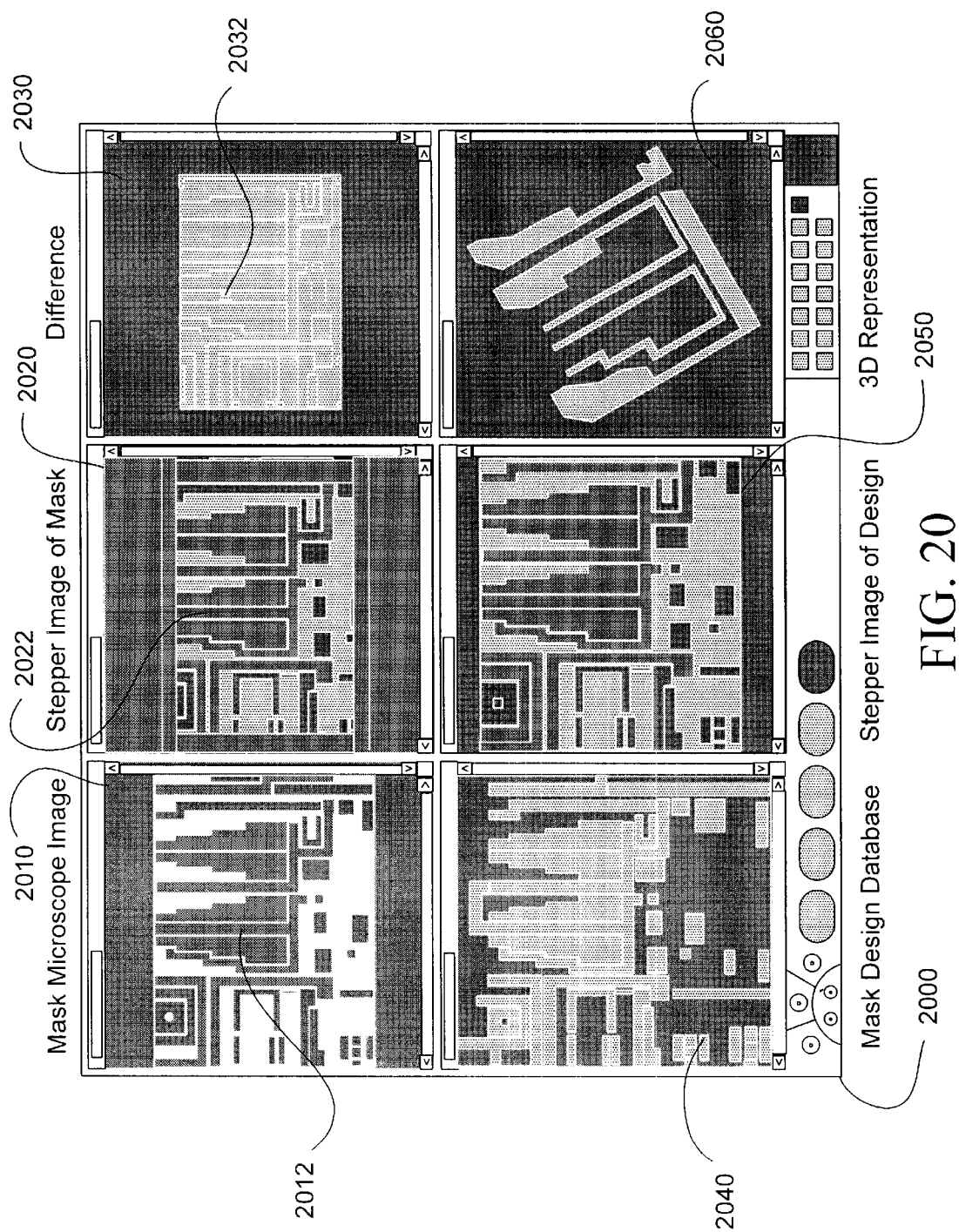

FIG. 20 illustrates a further screenshot of a computer program operating in accordance with one embodiment of the present invention in which a simulated mask image is compared to a simulated design image.

Figure 21:
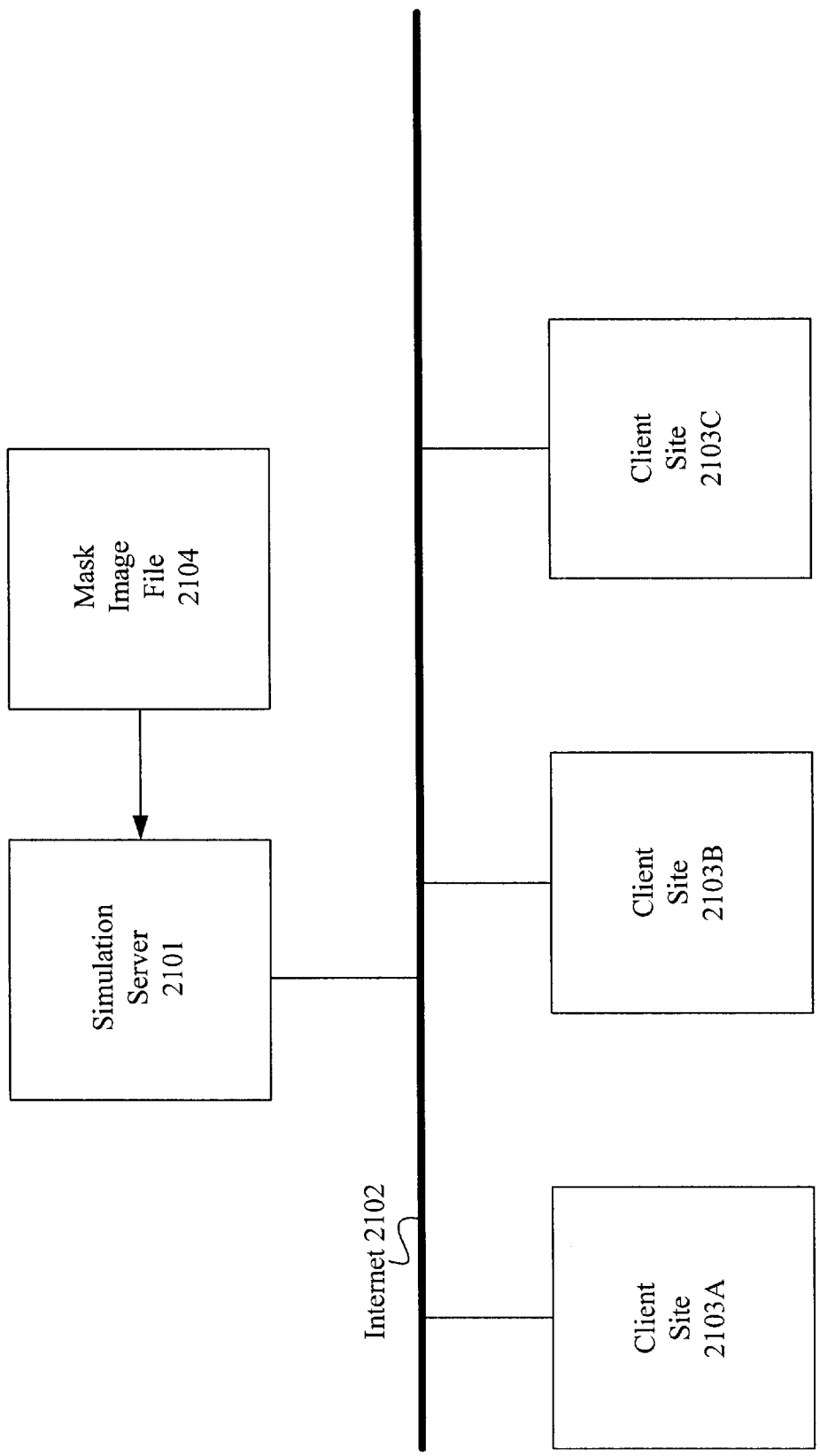

FIG. 21 illustrates a mask defect printability simulation system in accordance with the present invention.

Figure 22:
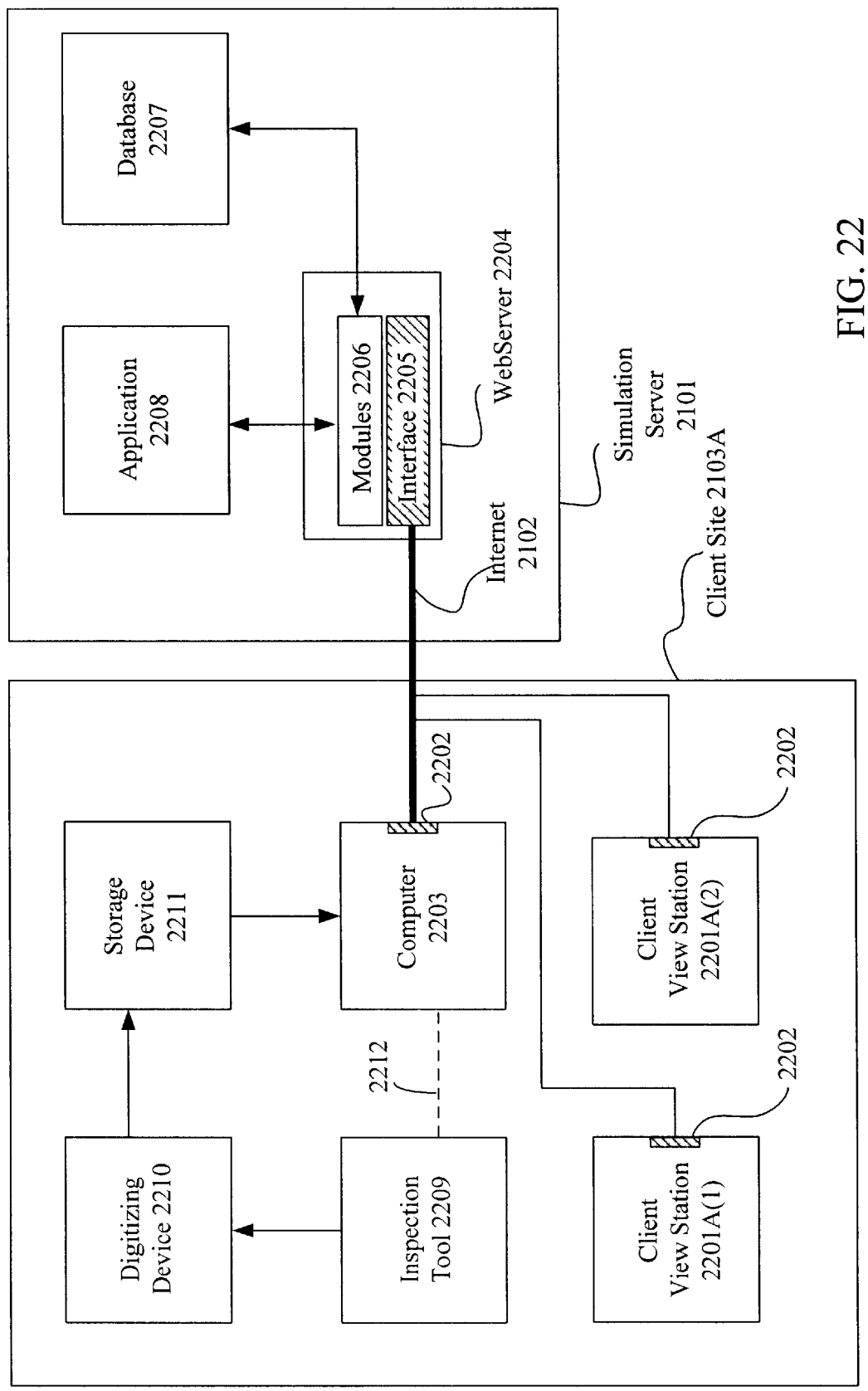

FIG. 22 illustrates the basic components comprising the simulation server and a client site coupled to the server via the Internet.

Figure 23A:
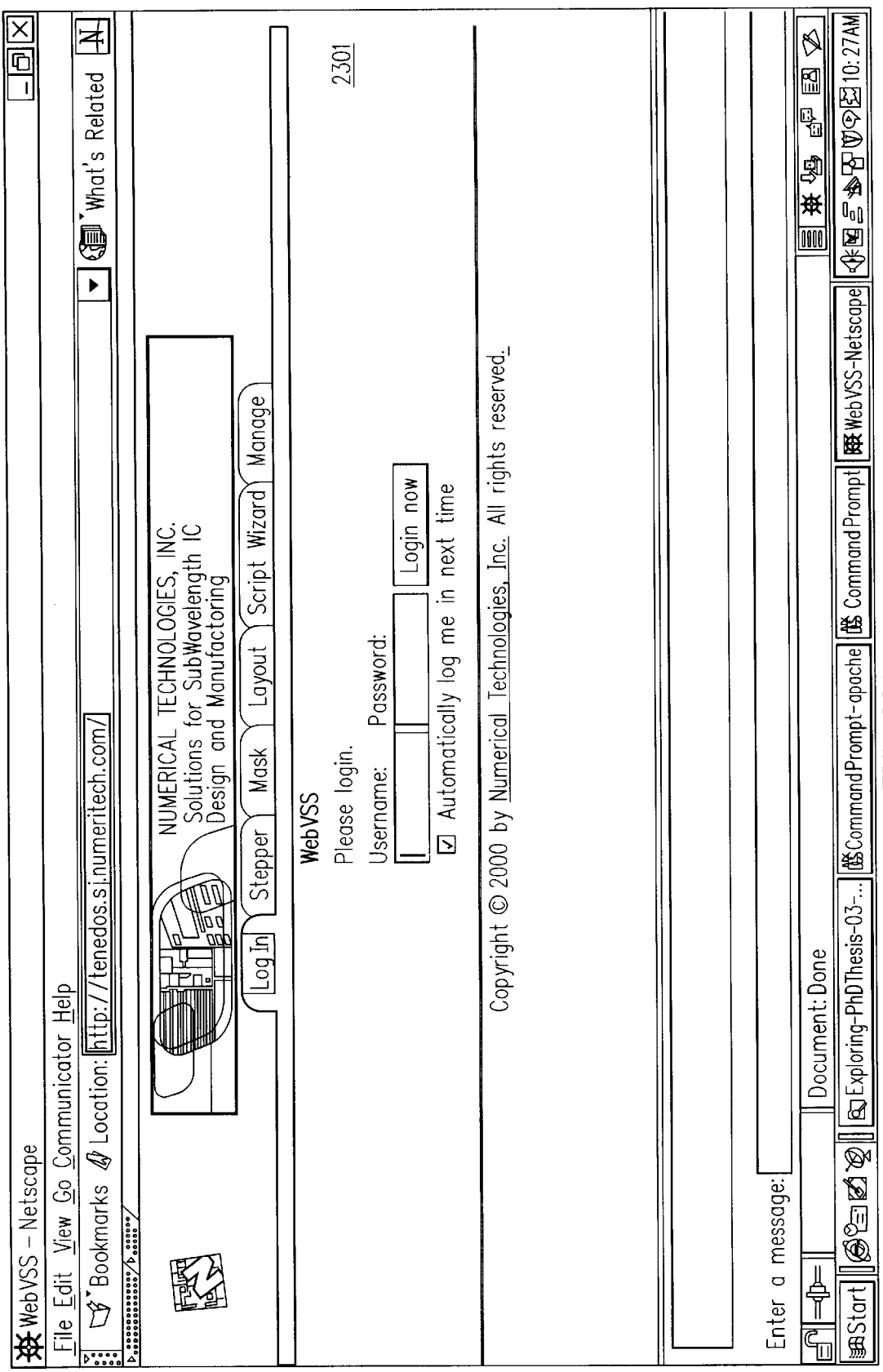
Figure 23B:
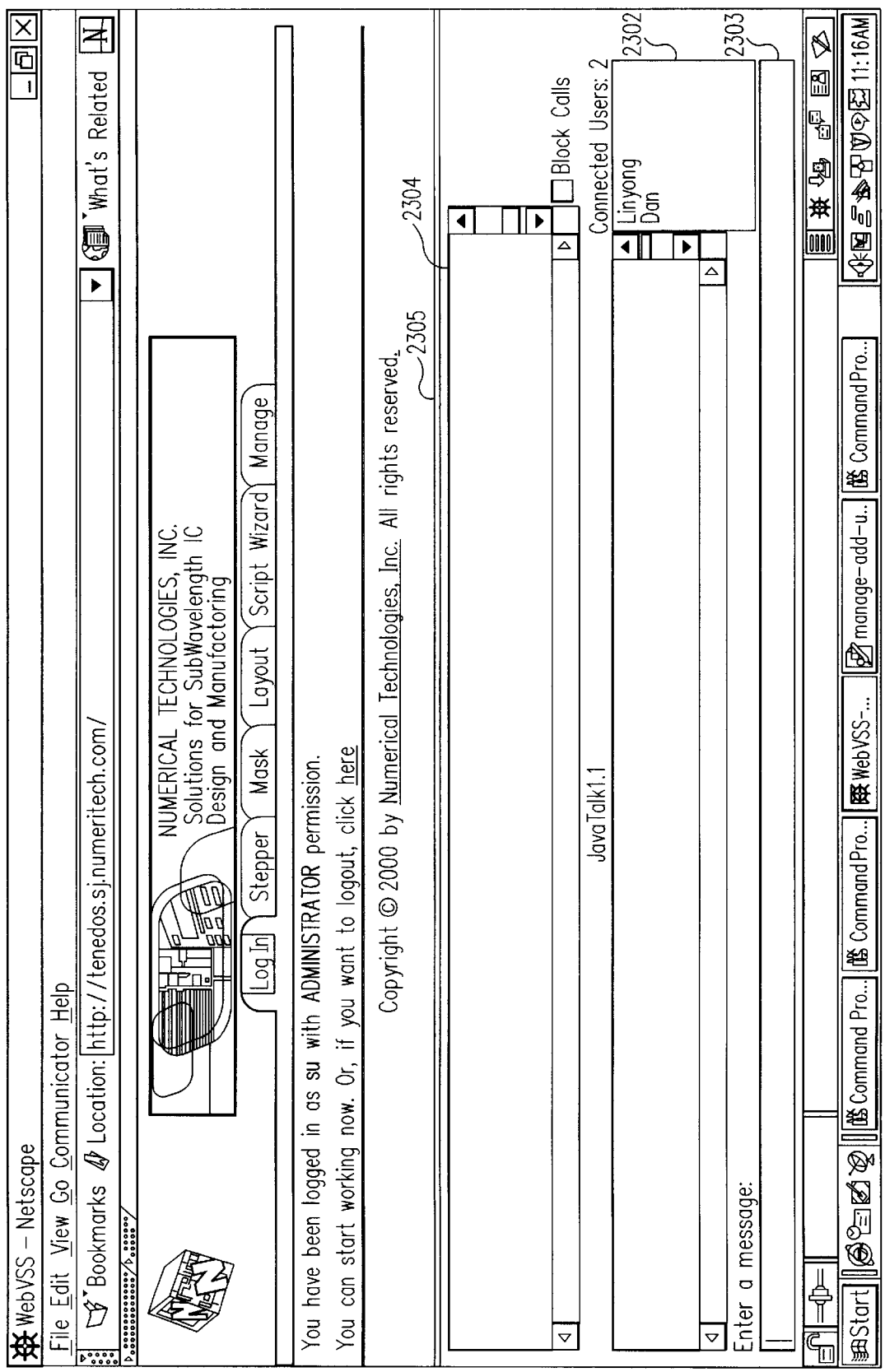
Figure 23C:
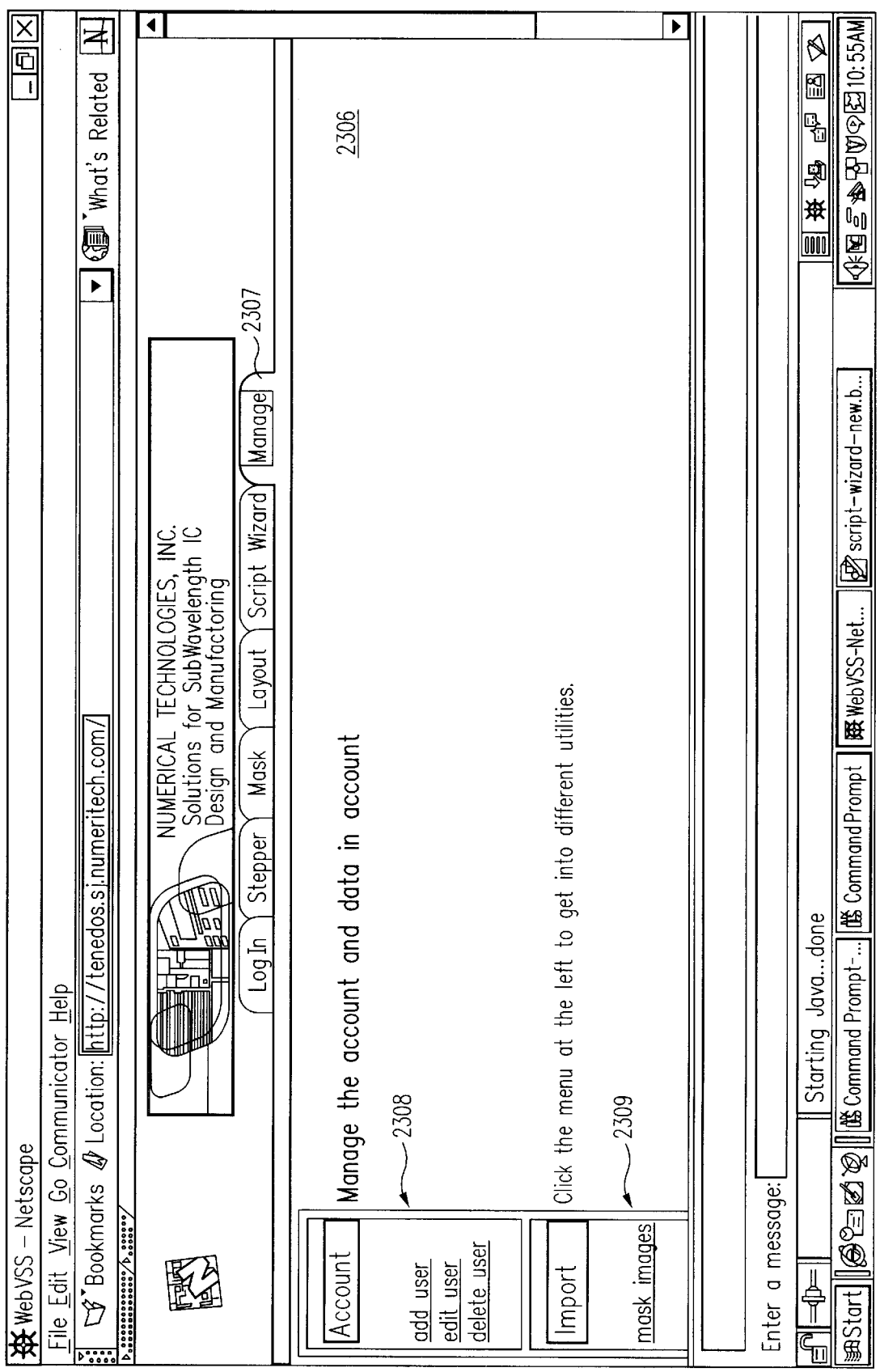
Figure 23D:
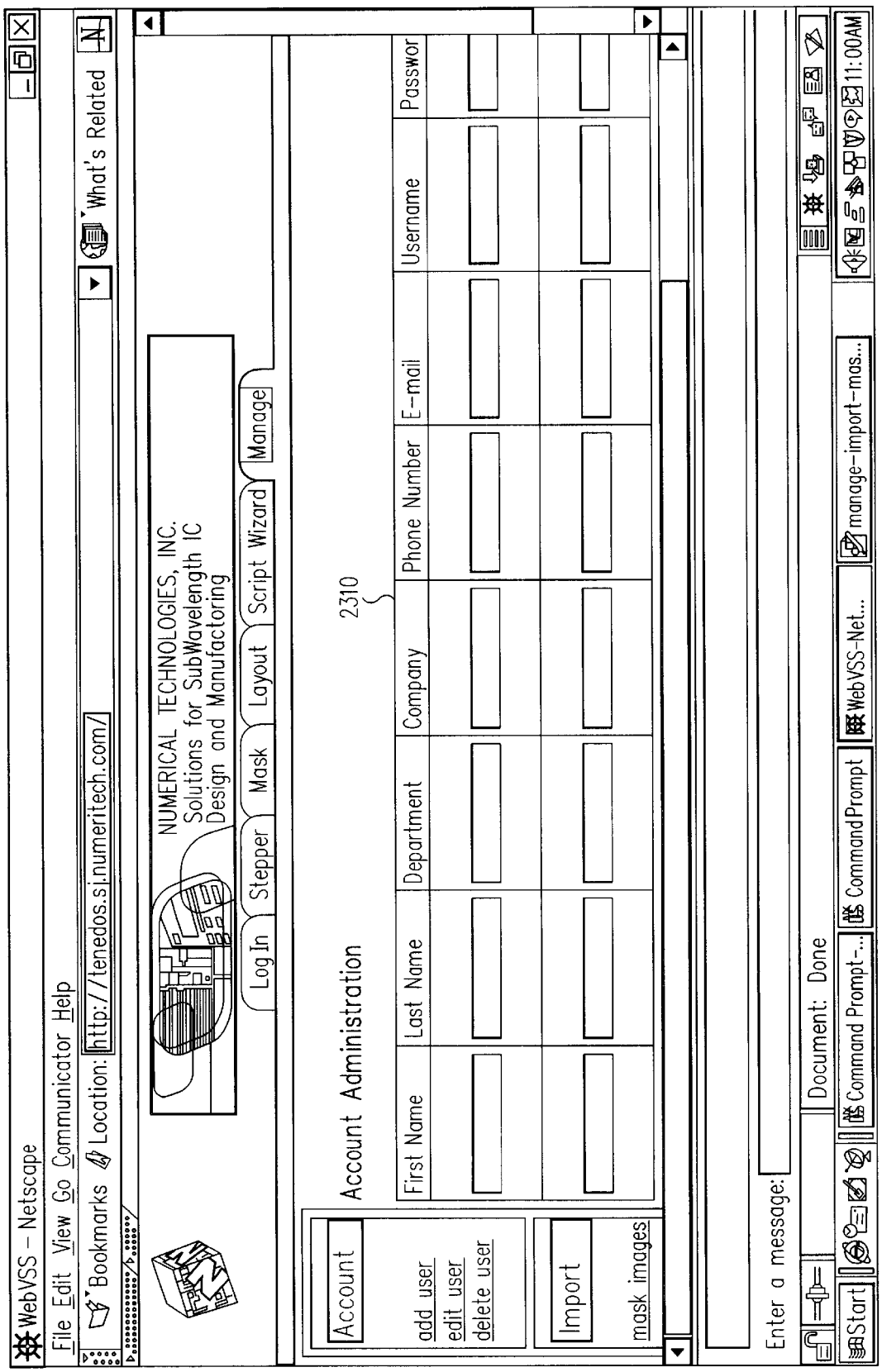
Figure 23E:
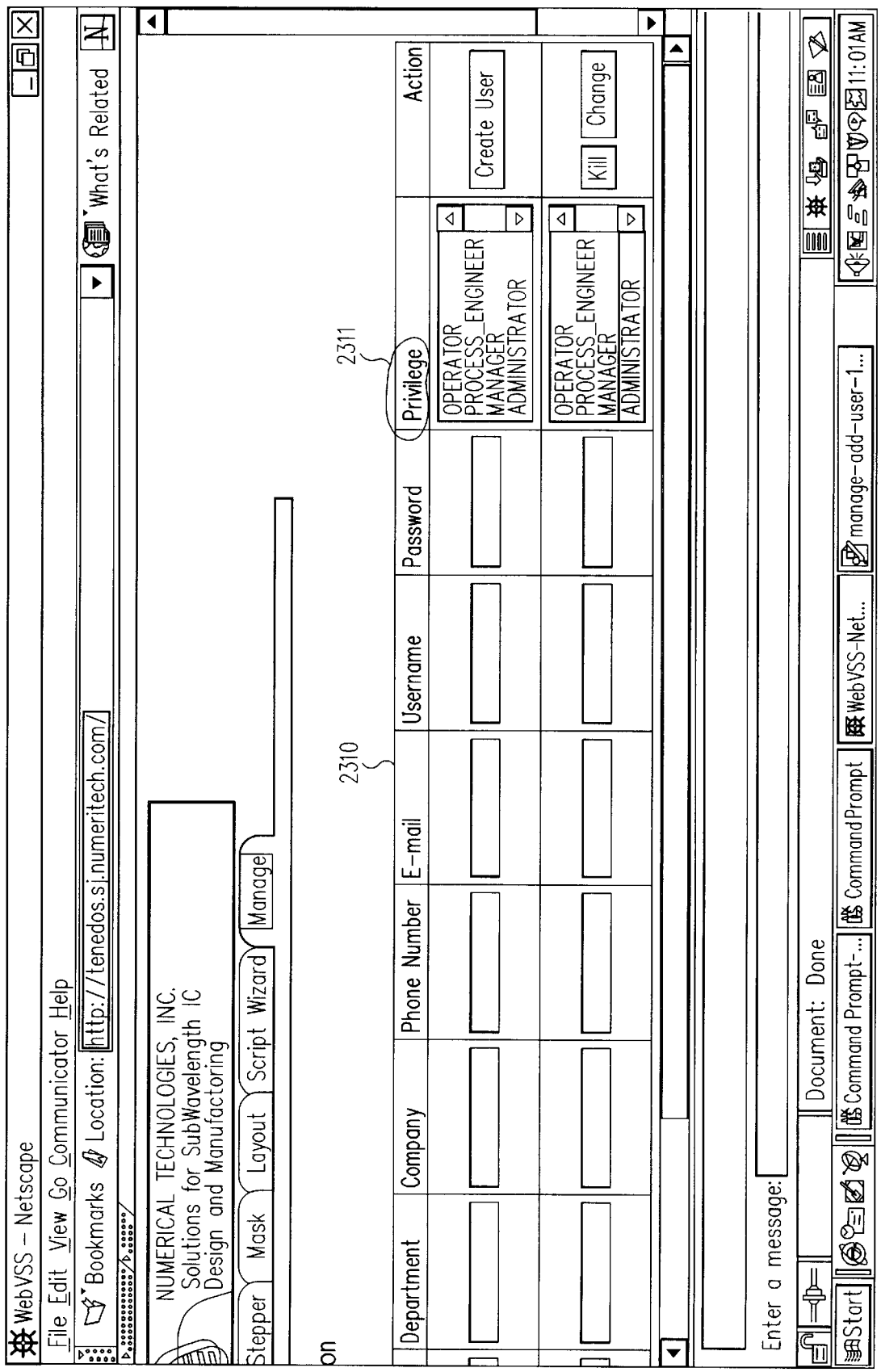
Figure 23F:
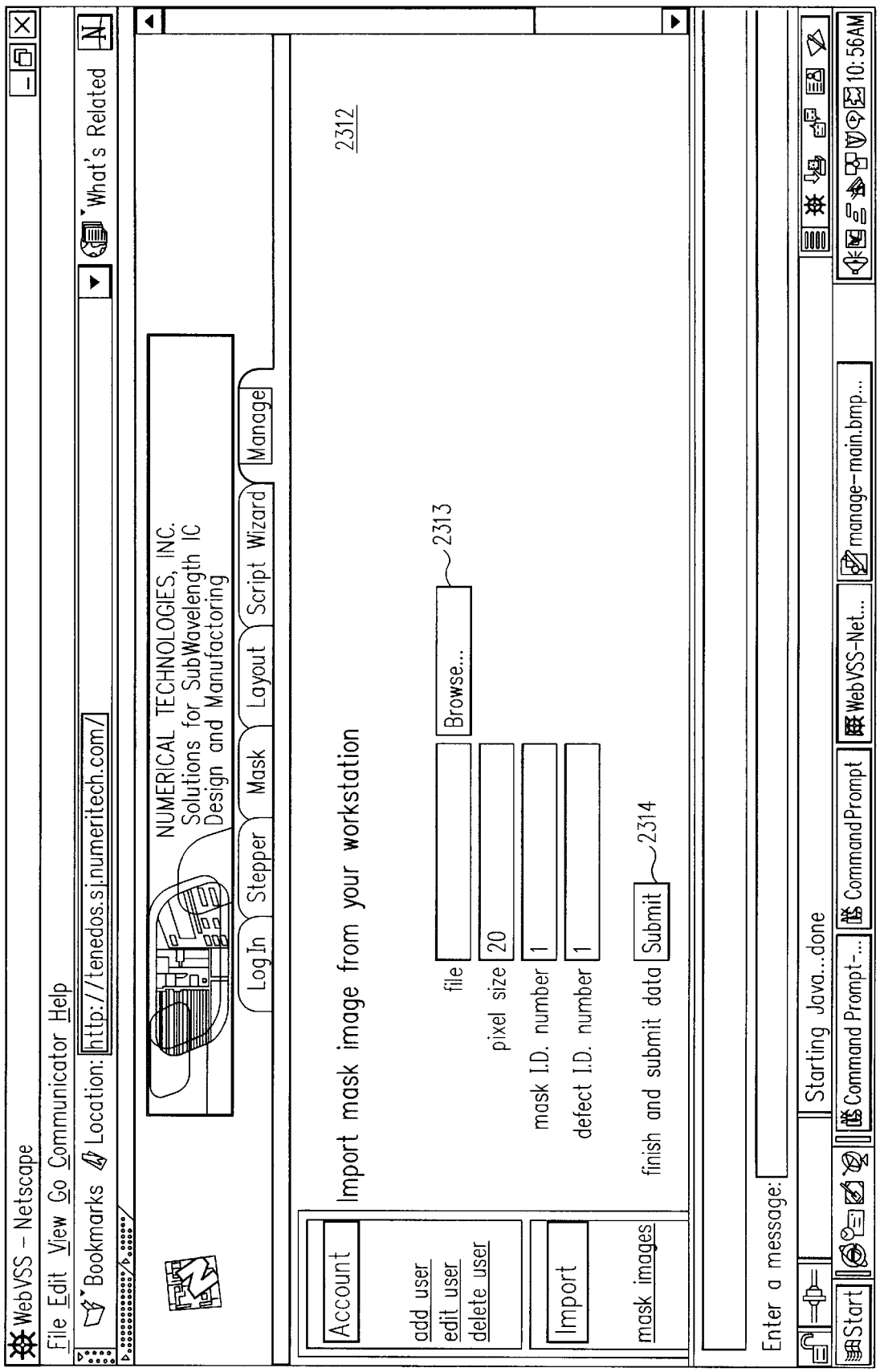
Figure 23G:
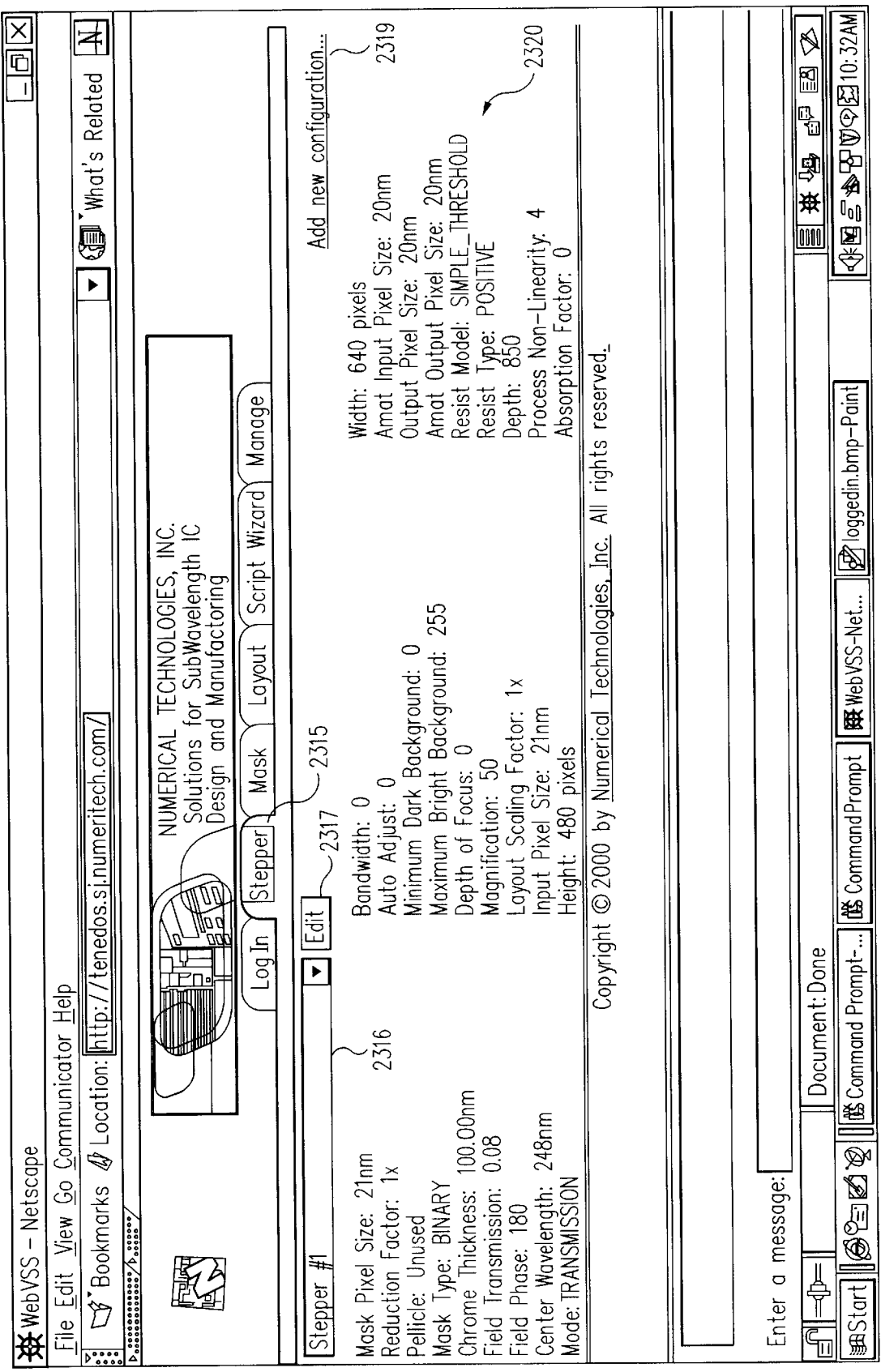
Figure 23H:
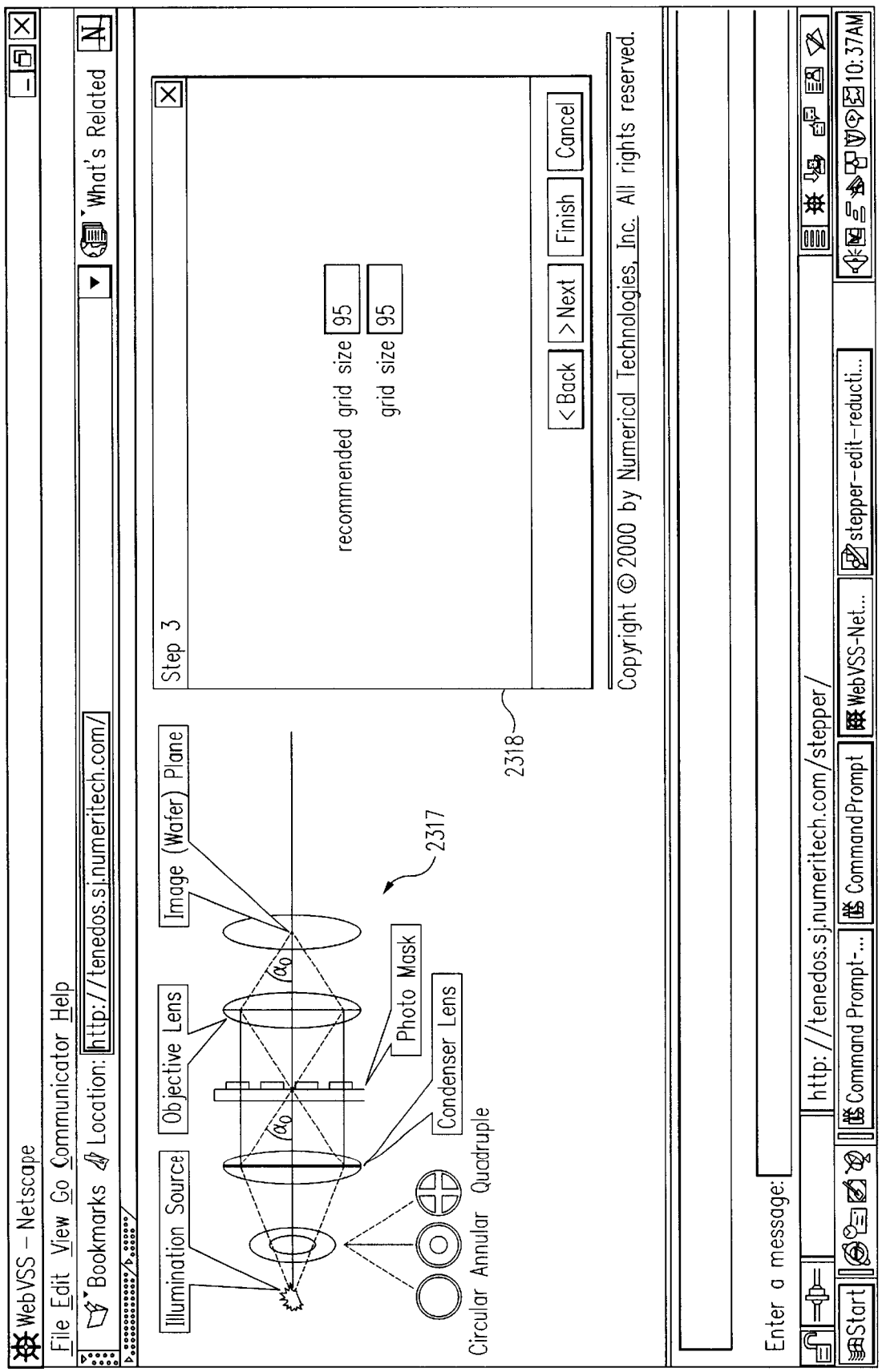
Figure 23I:
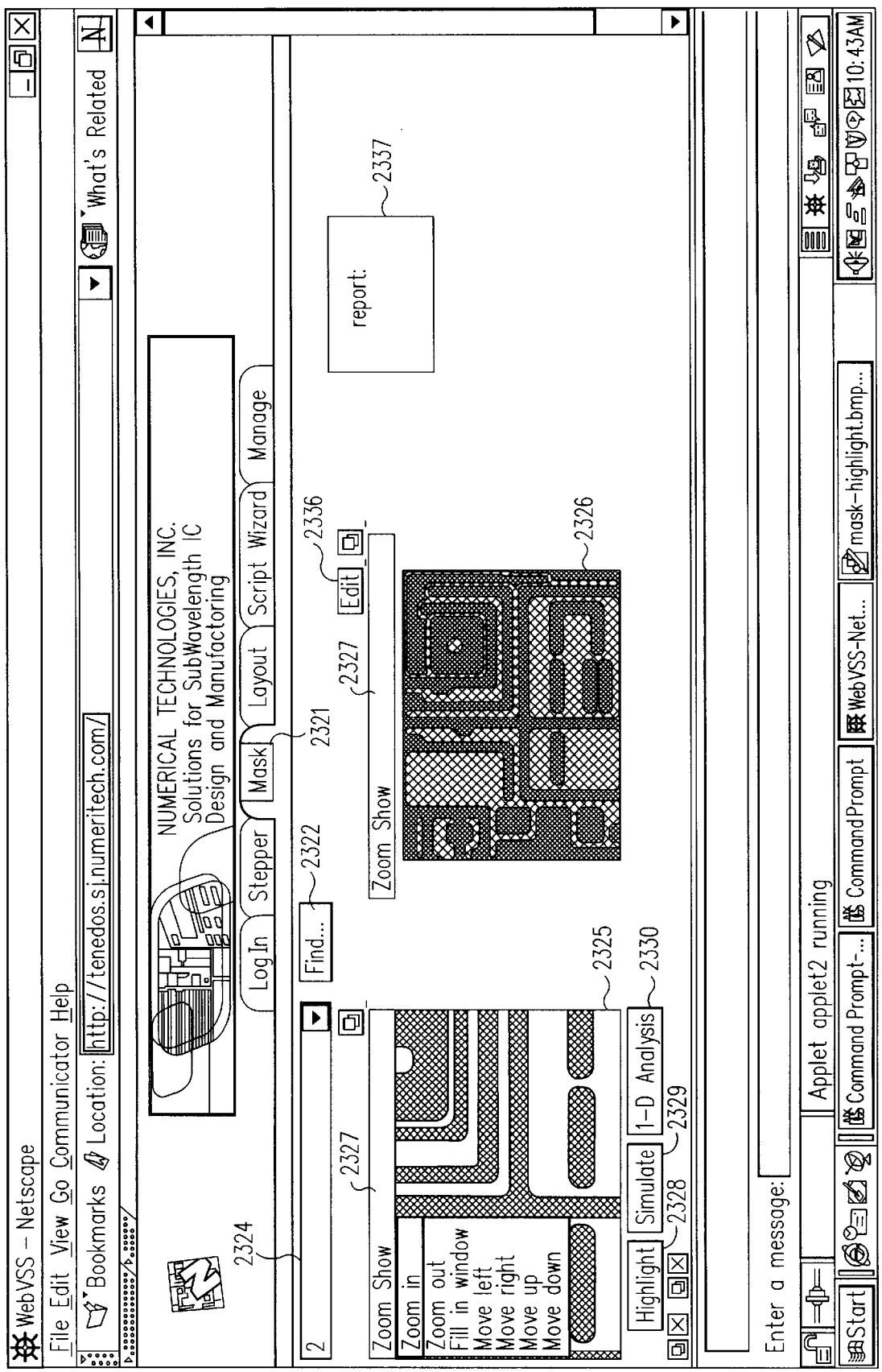
Figure 23J:
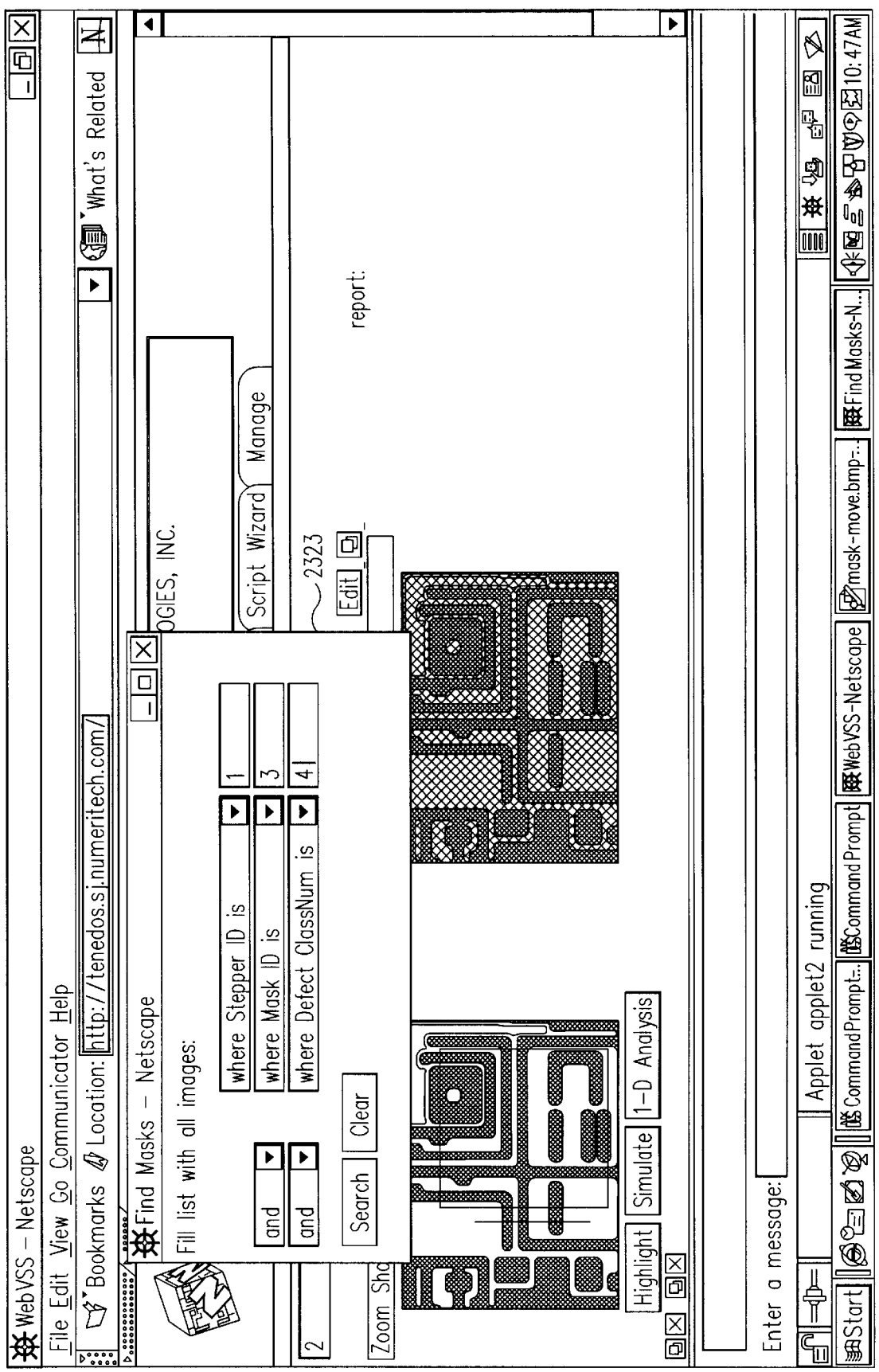
Figure 23K:
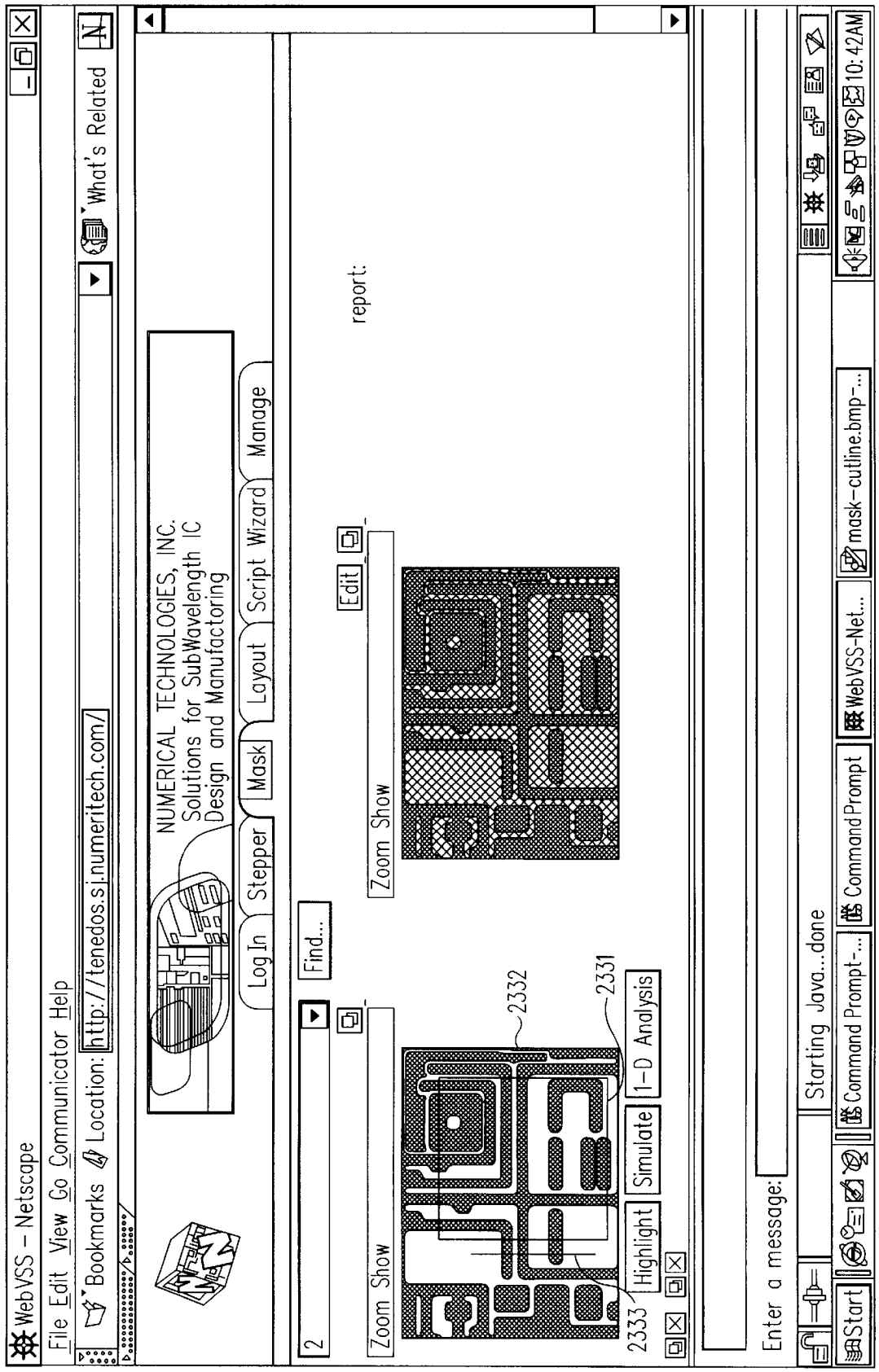
Figure 23L:
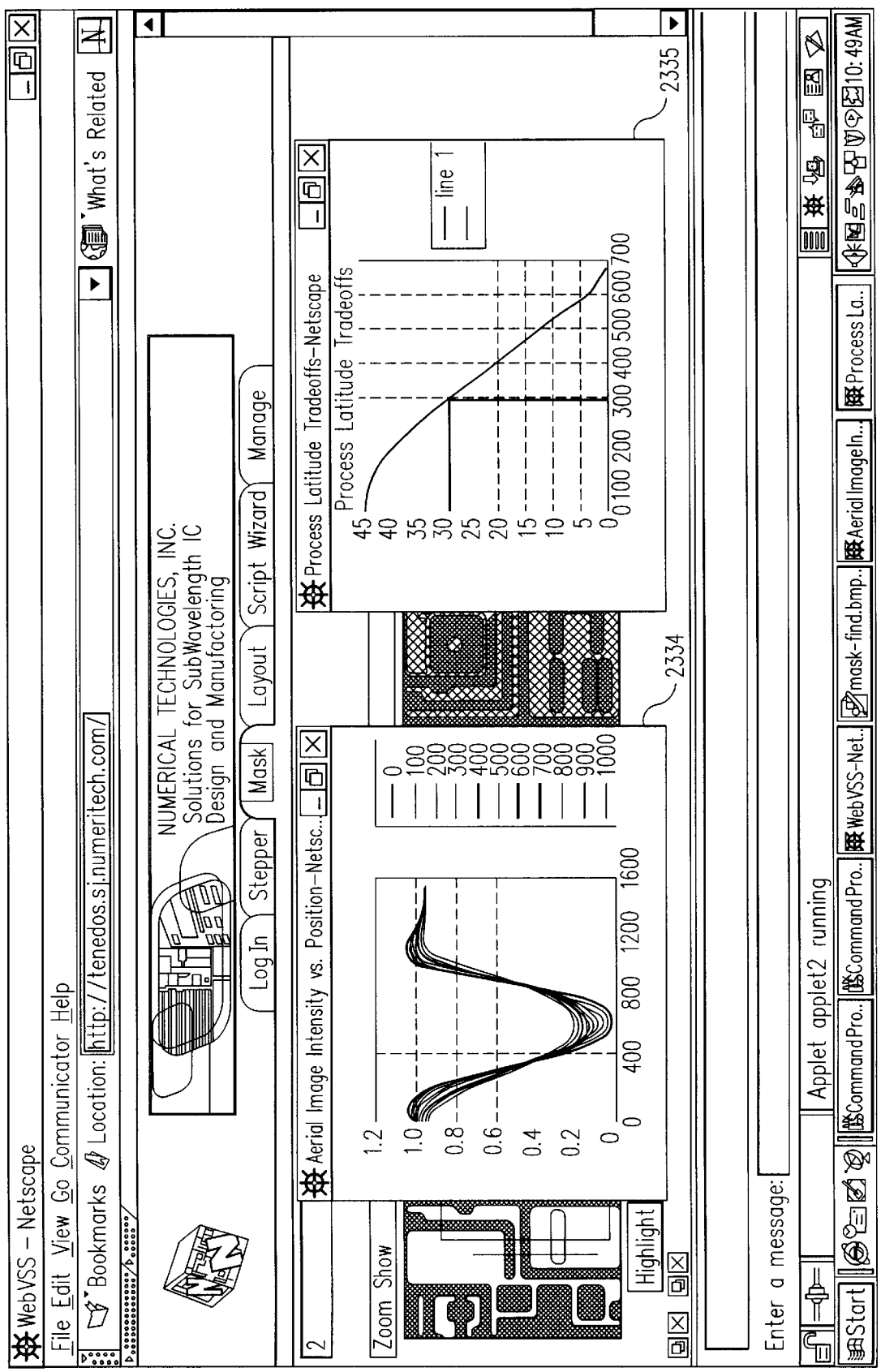
Figure 23M:
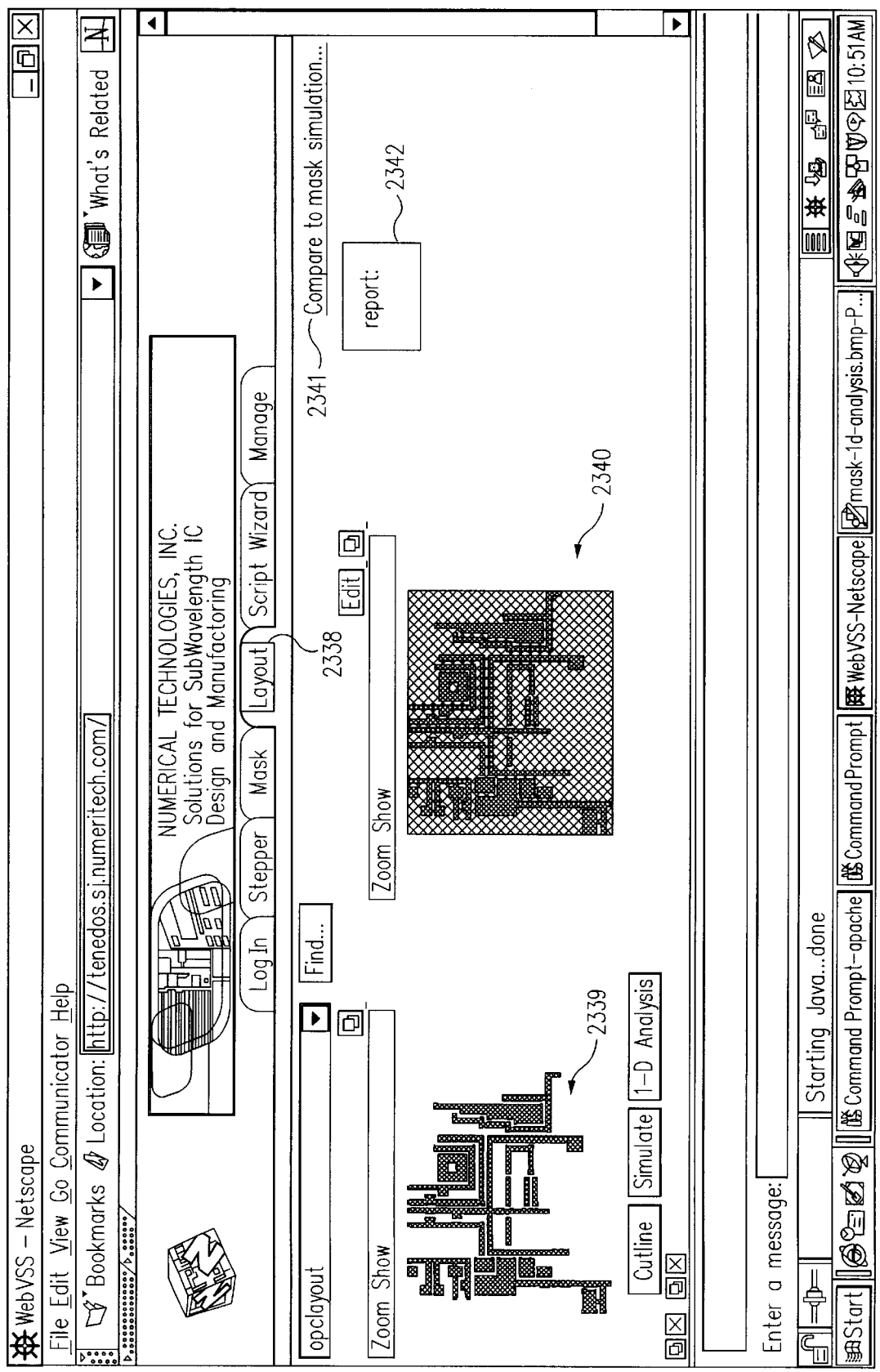
Figure 23N:
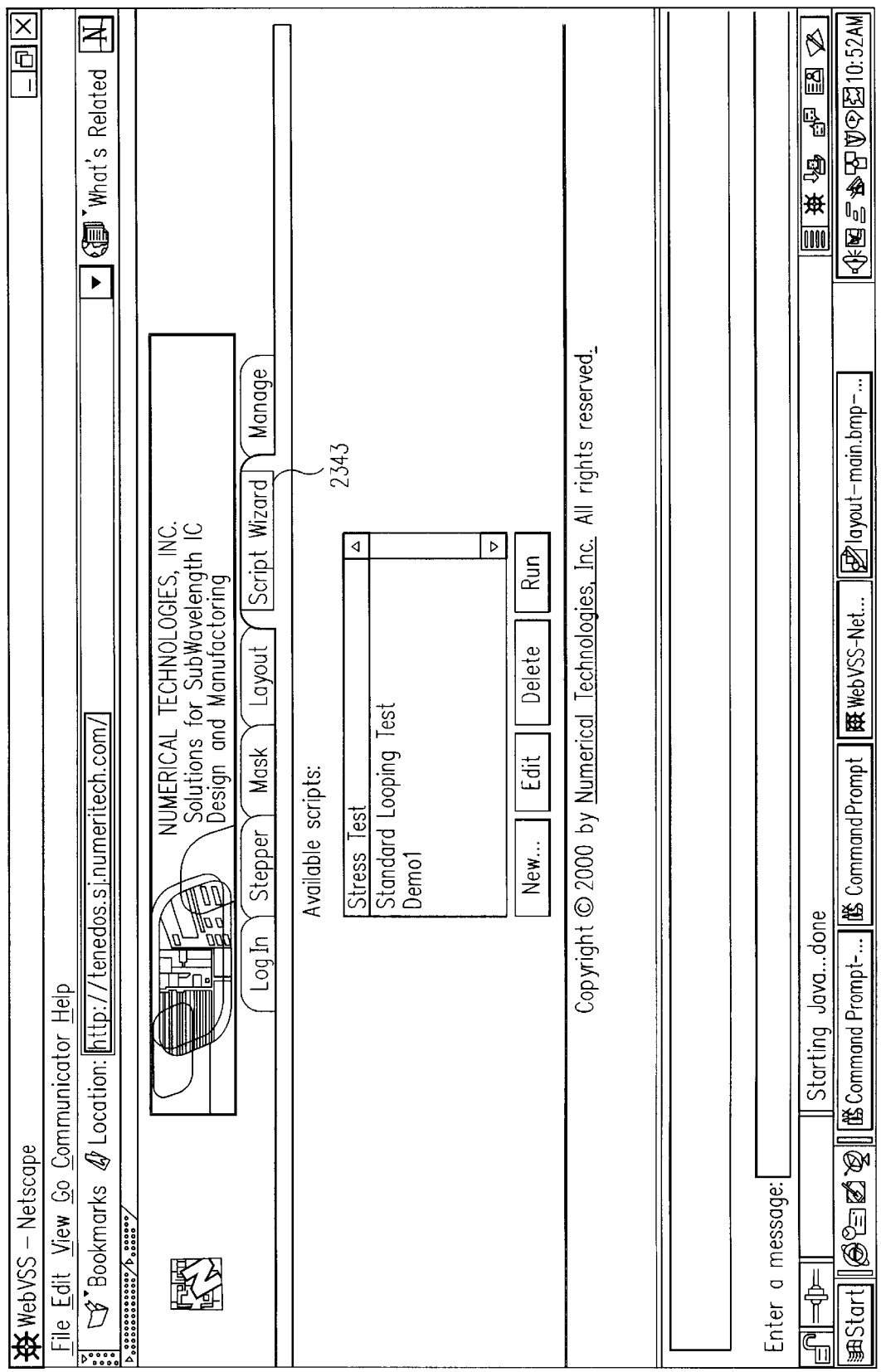

FIGS. 23A–23N illustrate screenshots of a computer program operating on the simulation server of the present invention.

Figure 24:
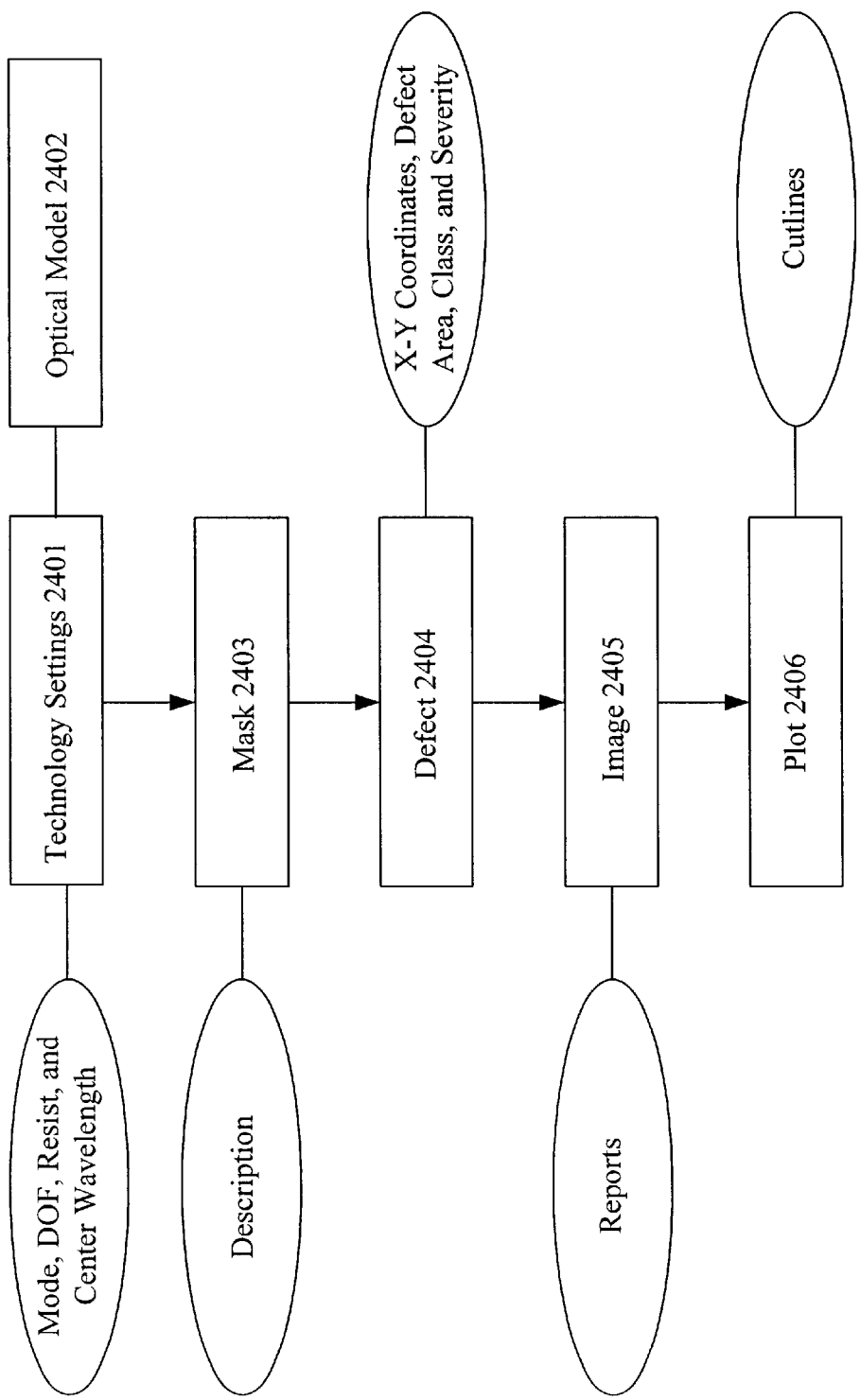

FIG. 24 illustrates the types of information stored in the database associated with the simulation server of the present invention.

Figure 25:
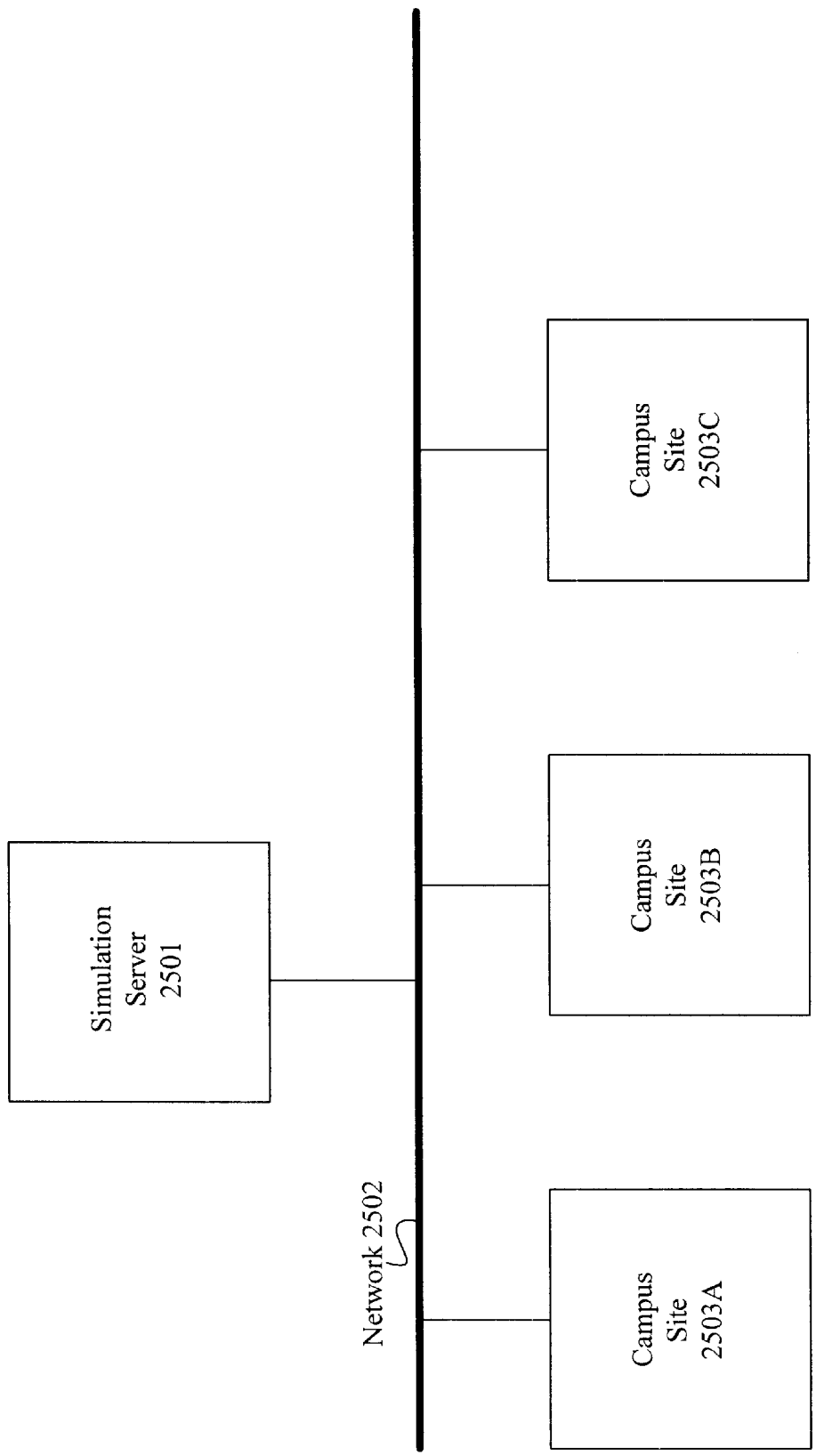

FIG. 25 illustrates a mask defect printability simulation system used in an Intranet application.

Figure 26A:
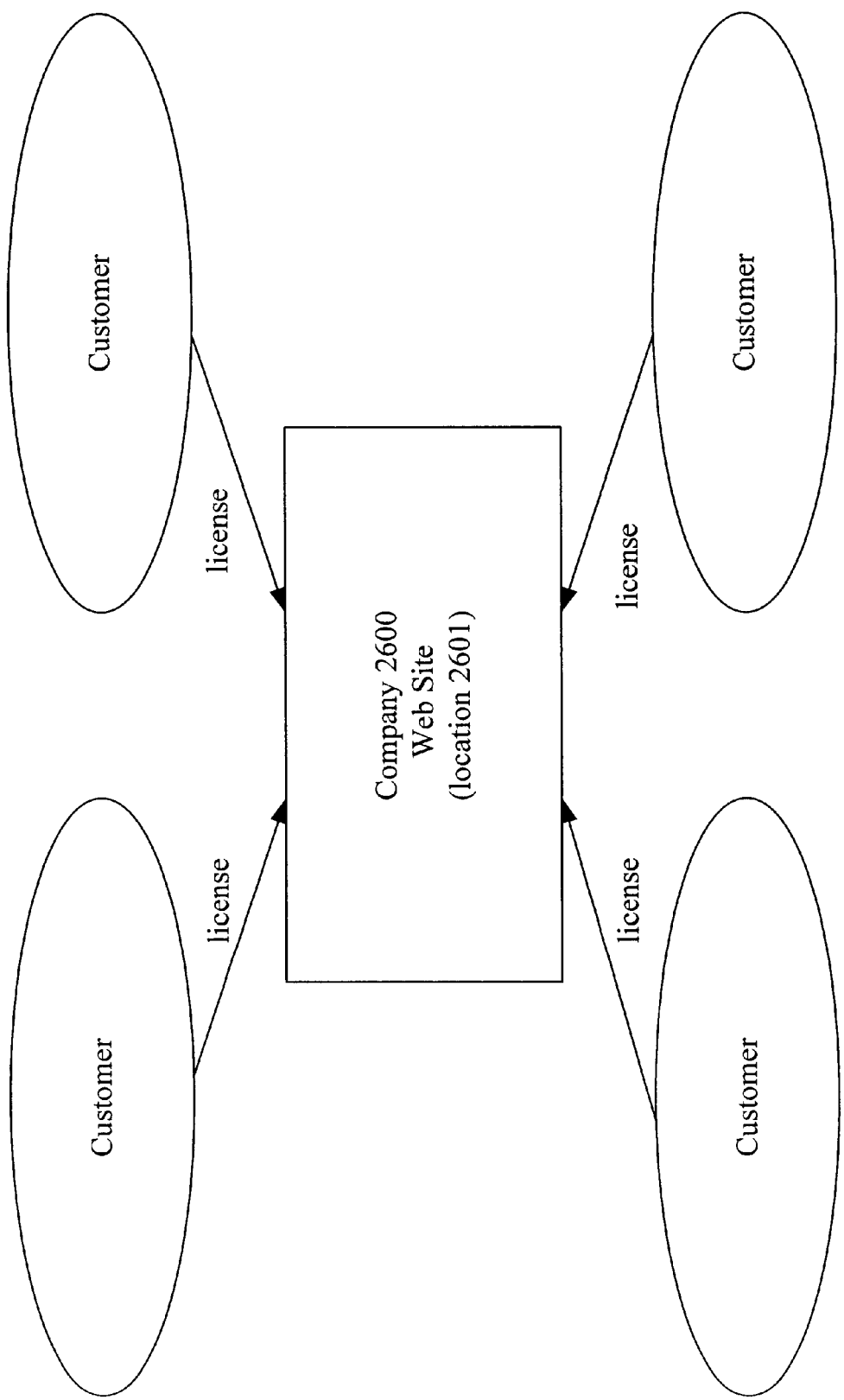
Figure 26B:
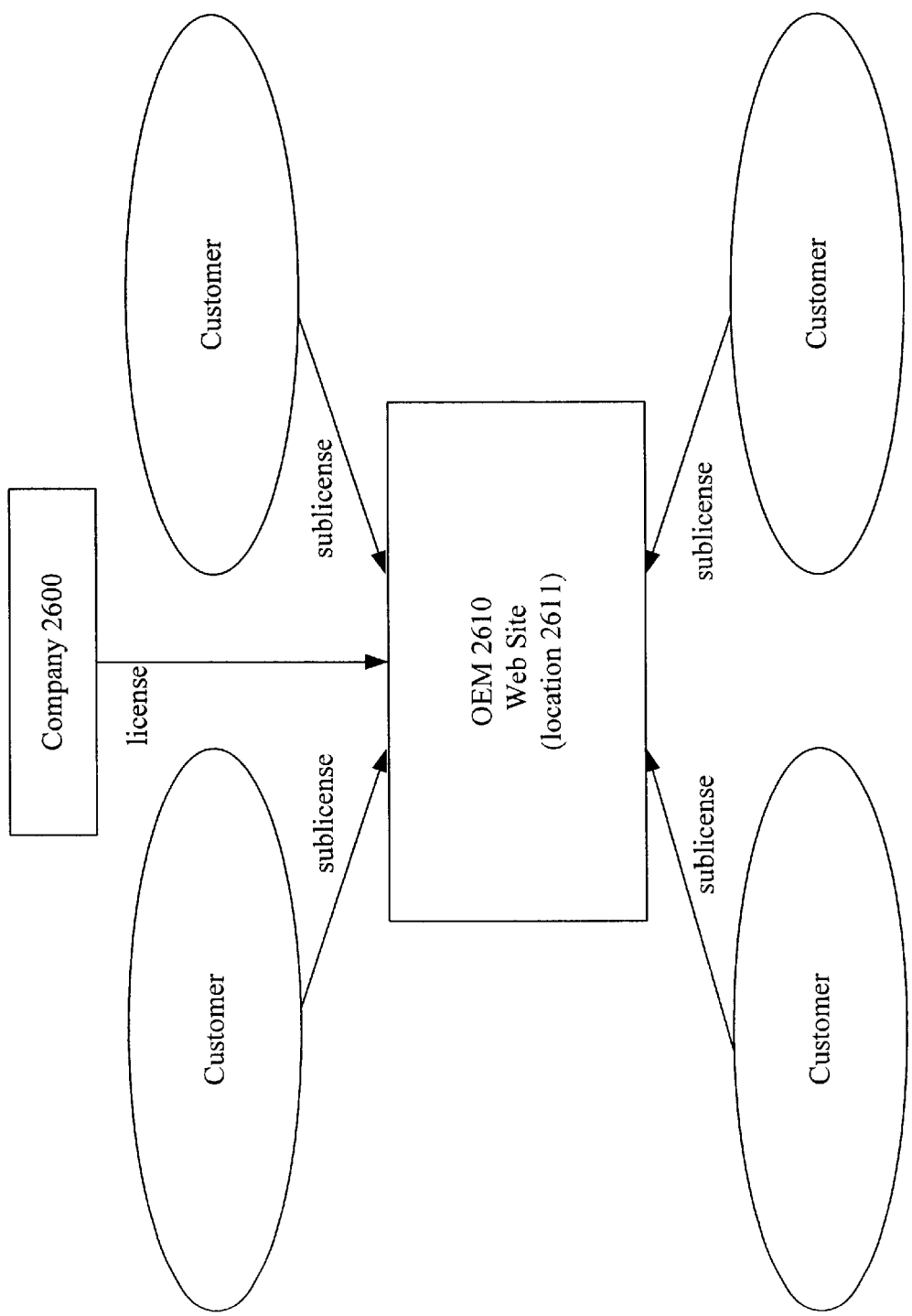
Figure 26C:
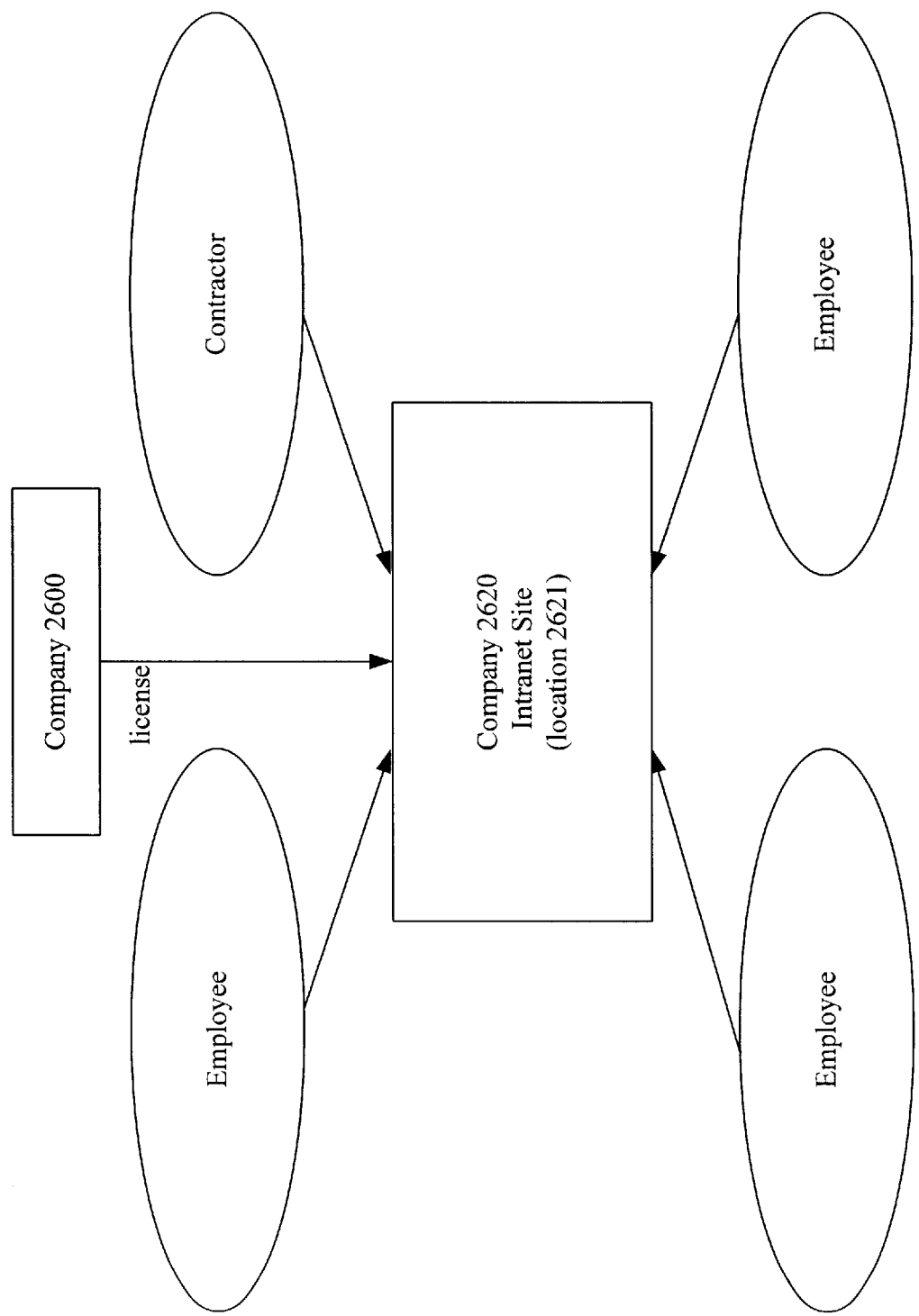

FIGS. 26A–26C illustrate three business models for using the present invention.

Although many details have been included in the description and the FIGS., the invention is defined by the scope of the claims. Only limitations found in those claims apply to the invention.

THE DETAILED DESCRIPTION

Photolithography is a process whose input is a mask and whose output is the printed patterns on a wafer. The printed result from a mask is what design engineers, lithographers, and mask manufacturers really care about. Using prior methods, the only way to inspect this printed result was to perform an actual wafer exposure and therefore incur potentially unnecessary costs in time and money. The present invention solves some of the problems of these prior methods by providing for mask inspection that takes printability into account without the need for the expensive steps of actually exposing a wafer. The present invention is capable of using a captured image of a mask——that accurately enough represents the physical mask (i.e. such as from a high resolution optical microscope or a scanning electron microscope)——and using that captured image to simulate the wafer exposure that the mask would provide under a given set of stepper conditions. Thus, when an initial mask inspection for defects has been performed and potential defects have been identified, the present invention can be used to simulate the wafer exposure based on captured images of the mask areas surrounding the potential defects. In this way, the printability of potential defects can be directly analyzed without taking the expense of an actual wafer exposure.

Further, the simulation can be controlled to take into account any number of parameters associated with the photolithography process, thereby making the printability determination process specific. Still further, the simulation of each defect can be performed at numerous values of certain process variables that might vary during actual exposure (such as defocus) in order to determine the effect the potential defects have on the wafer manufacturing process window. Subsequent processing can also be modeled with accuracy and with little loss of speed by calibrating the process to take into account photoresist process and etching process parameters.

Figure 1:
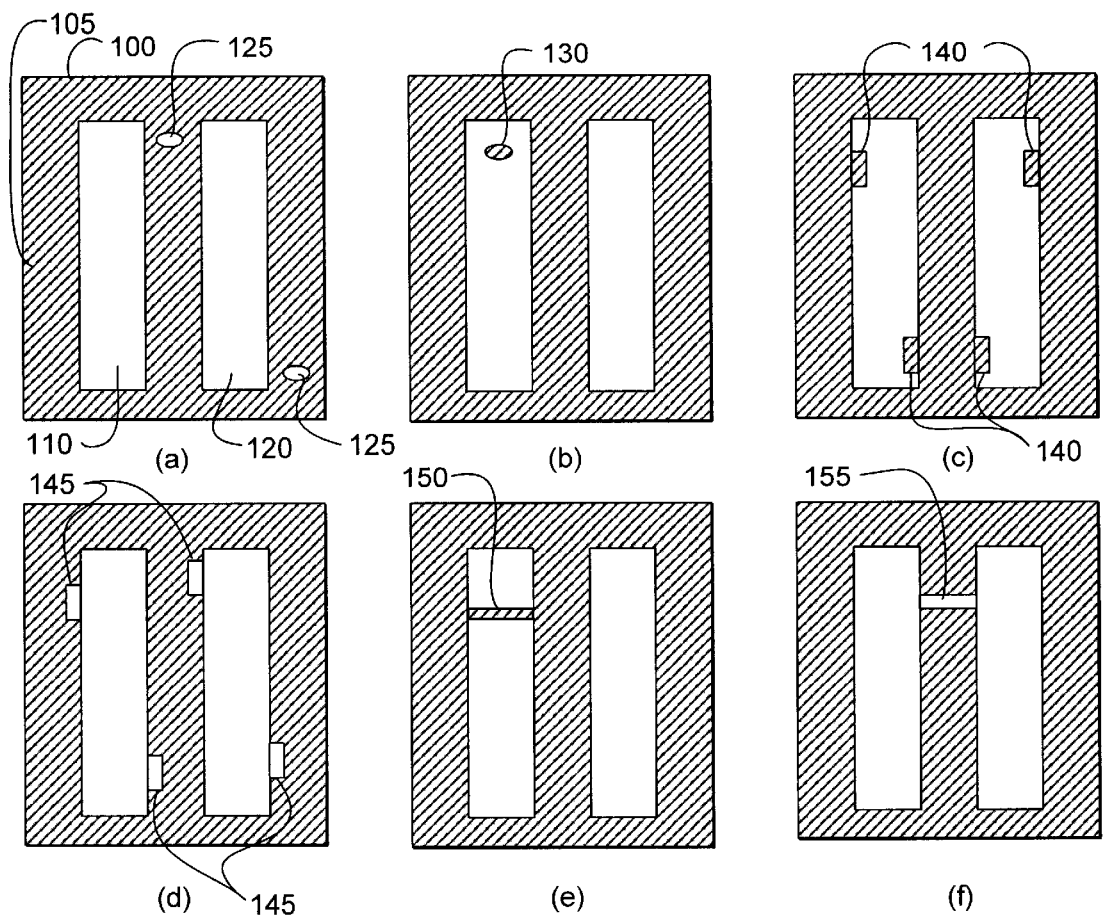
Figure 2:
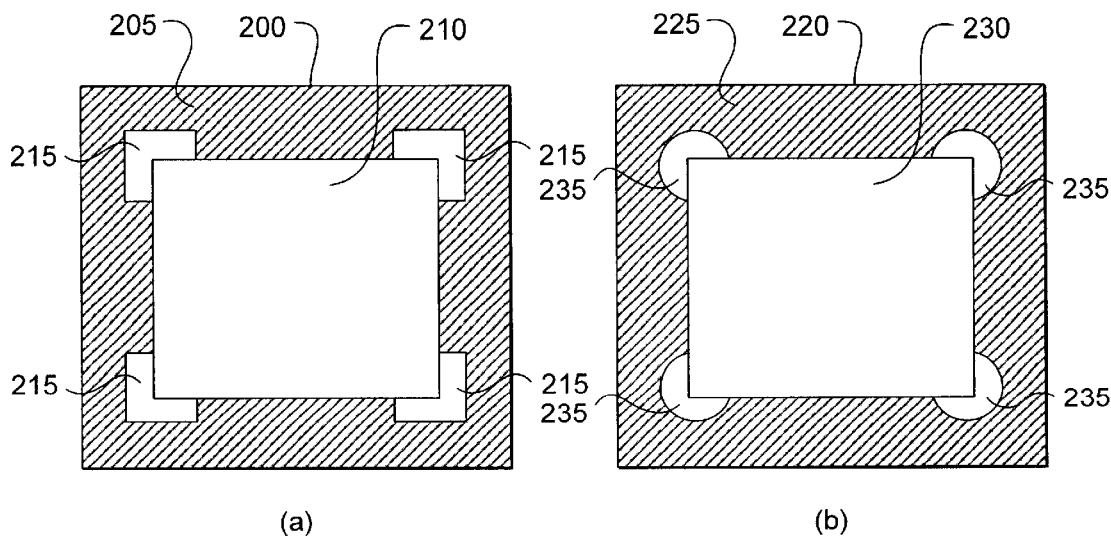
Figure 3:
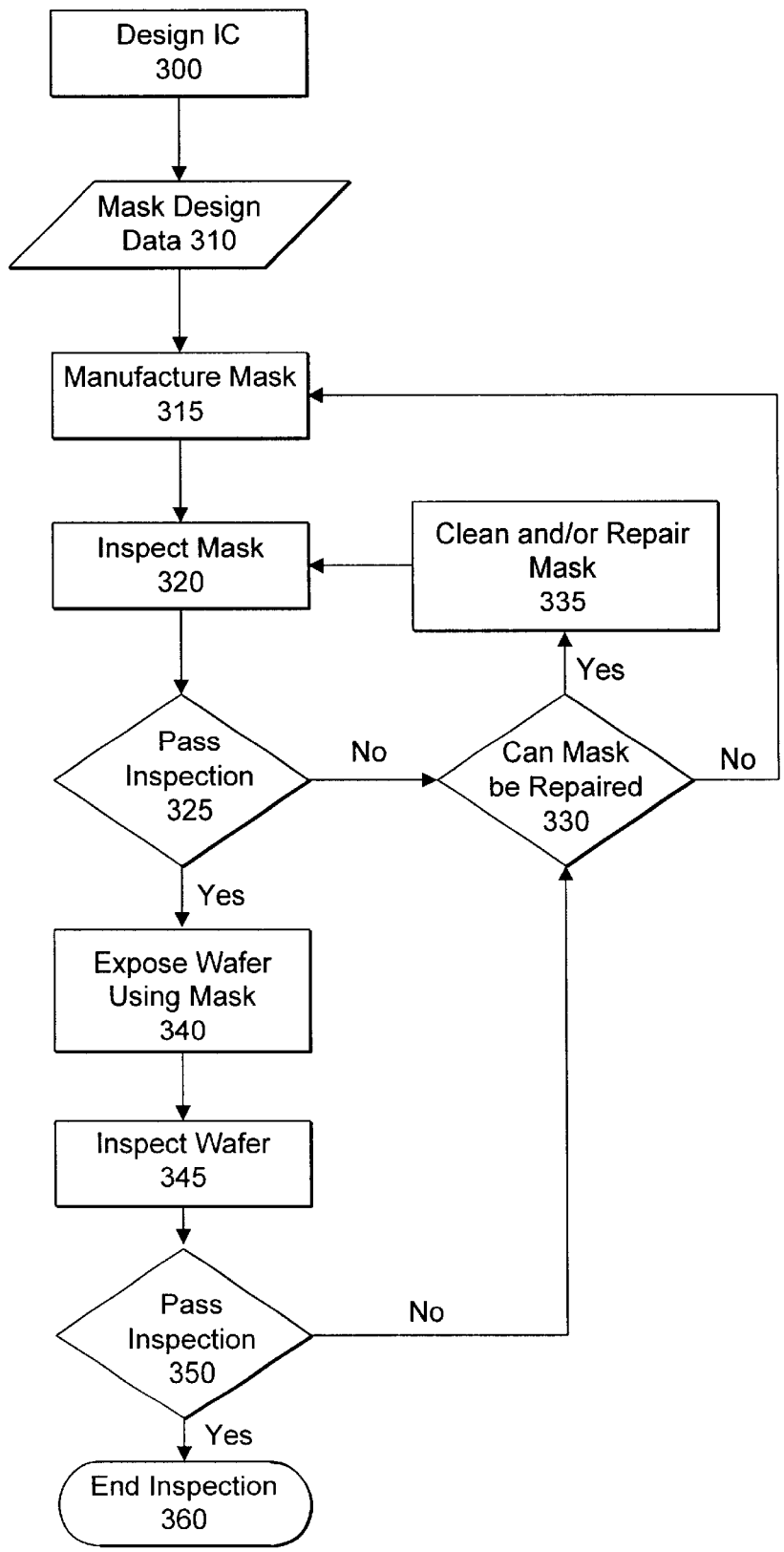
FIG. 3 illustrates, in flowchart form, a typical method used to inspect photolithography masks for defects.
Figure 4:
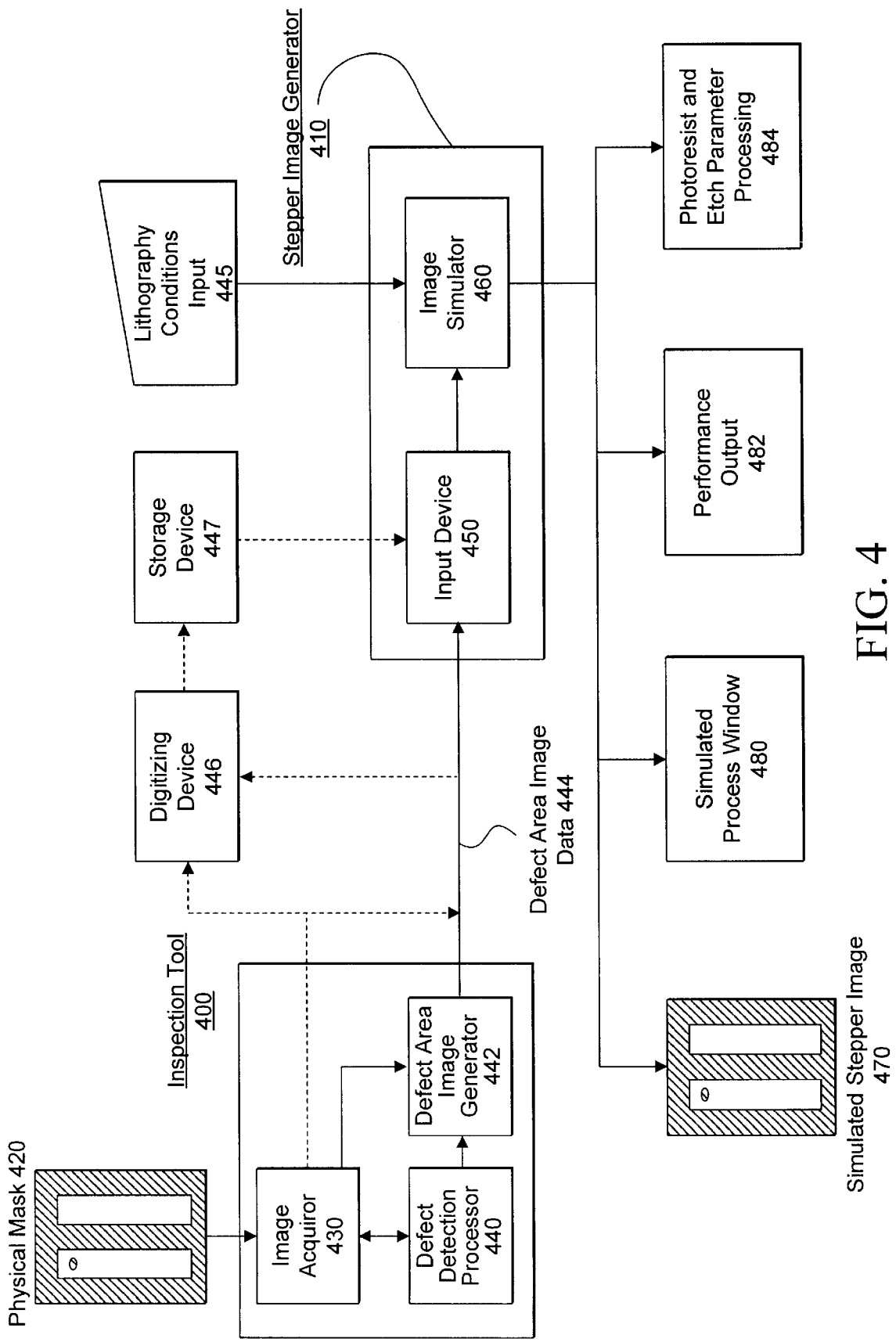
FIG. 4 illustrates, in simplified process flow diagram form, a process of inspecting a photolithography mask for defects in accordance with one embodiment of the present invention.

A detailed description of preferred embodiments is provided with respect to the figures in which FIG. 4 illustrates, in simplified process flow diagram form, a process of inspecting a mask for defects in accordance with one embodiment of the present invention. The process utilizes an inspection tool 400 and a stepper image generator 410. The inspection tool 400 may comprise an image acquiror 430, a defect detection processor 440, and a defect area image generator 442. In one embodiment, the inspection tool 400 may be all inclusive in that it contains each of the aforementioned elements in one package. This all-inclusive tool 400 setup is typically used in on-line mask inspection. In another embodiment, the tool 400 may comprise a number of separately existing elements which interface with each other as is typically used in off-line mask inspection. For example, in one embodiment, the image acquiror, 430 is a separate device from the defect detection processor 440.

The image acquiror, 430 may comprise a high resolution imaging device such as a high resolution optical microscope; a scanning electron microscope (SEM), a focus ion beam, an atomic. force microscope, and a near-field optical microscope such as is well known in the art of mask inspection. The image acquiror 430 scans all or a portion of the mask 420. The image acquiror may also comprise a device such as a CCD camera capable. of interfacing with the particular type of microscope used and digitizing the image information from the microscope. For instance, a CCD camera that creates n-bit gray scale image data that is representative of the image from the microscope may be used. The image data may be stored in a format such I as Windows BMP on any type of appropriate media including a computer hard disk drive, a CDROM, and a server.

The defect detection processor 440 controls the image acquiror 430. In one embodiment, the defect detection processor 440 provides control signals which control the manner in which the image acquiror 430 scans the mask. Further, the defect detection processor 440 compares the mask images provided by the image acquiror 430 to a set of potential defect criteria and determines what areas of the mask contain potential defects. In one embodiment, the defect detection processor 440 comprises a computer running a program of instructions and interfacing with the image acquiror 430 such that the scanning of the mask is done in the desired manner. In one embodiment, the program operates such that a user may change the parameters of the scanning performed on the mask 420. In another embodiment, the image acquiror 430 could be replaced with a preexisting image of a mask or a portion of a mask. Any representation of the physical mask 420 that is capable of being analyzed by the defect detection processor 440 is acceptable as an input.

The defect detection processor 440 also controls the defect area image generator 442 which provides images of those areas of the mask 420 which may contain defects. For instance, as the image acquiror 430 provides image input scanned from the mask 420 to the defect detection processor 440, the defect detection processor 440 determines whether that portion of the mask scanned contains any potential defect areas based on predetermined defect criteria. These criteria may, in one embodiment, be changed by a system user. If a potential defect is discovered, the defect processor 440 signals the defect area image generator 442 to provide a defect area image of the area surrounding the potential defect. The defect area image generator 442 thus provides defect area image data 444. In one embodiment, the defect area image generator 442 may be a part of the image acquiror 430, for instance, the defect area image generator 442 may comprise the CCD camera of the image acquiror 430. In another embodiment, the defect area image generator 442 may be a separate device which receives image input from the image acquiror 430.

The embodiments of the inspection tool 400 may be utilized to provide data for the stepper image generator 410 in a number of ways. First the image acquiror 430 could scan the entire mask 420 or a portion of the mask 420 without any control from the defect detection processor 440 and store the resulting image data in a storage device 447 such as a server after digitizing the data with a. digitizing. device 446 such as an image grabber. This same image data could also be provided directly to the stepper image generator 410 via a real time data feed. Second, in the case of the image acquiror 430 being under the control of the defect detection processor 440, the defect area image generator 442 may provide the defect area image data 444 either directly to the image generator 410 via a real time data feed (on-line inspection) or provide the image data 444 to the digitizing device 446 and then to the storage device 447 for later off-line inspection.

The stepper image generator 410 comprises an input device 450 and an image simulator 460. The input device 450, in the case of stored image data from the storage device 447, may comprise any hardware suitable for reading the type of media upon which the image data is stored, including a computer hard disk drive, a CDROM reader, and a personal computer attached to a server via a network, among others. In the case of a real time feed of image data from the defect area image generator 442 or image acquiror 430, the input device may comprise a digitizing device such as an image grabber. For instance, in one embodiment the input device may comprise an 8-bit frame grabber device such as those that are known in the art including the Matrox™ Meteor™ and Pulsar™. The input device 450 also receives other input data such as lithography conditions input 445. In one embodiment, the image simulator 460 comprises a computer implemented program which accepts the stored image data or real time feed from the input device 450, and produces a simulation of the stepper image 470 on a wafer for the physical mask 420. In this computer implemented embodiment,, the image simulator 460 program may be run on a variety of computer platforms including: a PC using the Windows 95™ or NT™. 4.0 operating system with 128 M3 of RAM and a 200 MHz Pentium Pro™ microprocessor, either stand alone or connected to a network, and a SUN™ workstation computer among others. In some cases, the amount of time required for one embodiment of the image simulator 460 to simulate an image of conventional CCD array size is less than a second.

In one embodiment, the inspection tool 400 and stepper image generator 410 operates to produce a simulated stepper image 470, a simulated process window 480 output for a physical mask 420, and/or other performance related output used to characterize, define, or measure the effect of a defect(s) on integrated circuit performance as follows. The physical mask 420 is first inspected by the inspection tool 400. The inspection tool 400 scans the physical mask 420 for possible defects and the defect area image generator 442, pursuant to direction from the defect detection processor 440, generates defect area image data 444 of those areas of the mask containing possible defects. The defect area image data 444 is then either fed to the input device 450 in real time, and/or stored in the storage device 447 via the digitizing device 446 for later inspection.

The input device 450 receives the defect area image data 444 from the defect area image generator 442 or the storage device 447. The defect area image data 444 is then output to the image simulator 460. The image simulator 460 receives lithography conditions input 445. The lithography conditions input 445 contains data that is specific to the lithography conditions and system parameters under which the physical mask is to be later exposed if it passes inspection. This data may include parameters such as the numerical aperture of the system (NA), the coherency value of the system ($\sigma$), the wavelength of the illumination being used in the system ($\lambda$), the defocus of the exposure, lens aberrations, substrate conditions and the critical dimensions of the design among others. Further, the lithography conditions input 445 may contain a range of these parameters such that the simulation can be performed a number of times for different combinations of these parameters. In this manner, the printability of a mask defect can be analyzed over a range of possible lithography conditions, and the effect of a potential mask defect on the process window can also be analyzed.

In one embodiment, the image simulator 460 receives the defect area image data 444 from the input device 450 and the lithography conditions input 445, and generates. a simulated stepper image 470 which is a simulation of the wafer exposure which the defect area of the physical mask 420 would generate if an optical lithography exposure had been performed under the same conditions as the lithography conditions input 445. Similarly, the image simulator 460 can generate a simulated process window 480 which represents the effect the potential defect area has on the process window, and/or a performance output 482 as discussed above. Furthermore, in one embodiment, the image simulator 460 is able to generate a simulated stepper image 470 for a potential defect area of a mask of a number of different types of mask design including bright field, dark field, and attenuated phase-shifting mask designs. The simulated stepper image 470, the simulated process window 480, and/or the performance output 482 may then be inspected to determine the printability of any identified potential defect area without actually taking the expense of exposing a real wafer with the mask, as will be explained in more detail with respect to FIGS. 8–11. Finally, in other embodiments, the image simulator 460 could take into account the parameters associated with the photoresist material to be used and/or the etching process to be used on the exposed wafer in order to simulate the end result of these processes as shown by block 484 and discussed more fully below with respect to FIG. 6.

FIGS. 5(a)–(b) illustrate in process flow diagram form, two embodiments of the image simulation process utilized in the present invention to produce simulated stepper images of an exposed wafer. FIG. 5(a) illustrates an embodiment of the process as it would be used on a design mask such as by the design image simulator 960 to be described below with respect to FIG. 9. FIG. 5(b) illustrates an embodiment of the process as it would be used on a captured image of a physical mask such as by the image simulator 460 of FIG. 4, the image simulators 830 and 860 of FIG. 8, and the mask image simulator 950 and design image simulator 960 of FIG. 9. Prior to discussing the specifics of FIGS. 5(a)–(b) however, it would be beneficial to lay some of the background. behind the simulation processes illustrated therein.

In overview, the simulation process as described with respect to FIGS. 5(a)–(b) makes use of what is referred to in the art as the Hopkins model in order to approximate the process of optical lithography. According to the Hopkins model, in a sufficiently general setting, the process of partially coherent. optical imaging (which is the exclusive process currently employed in optical lithography) may be described by the following nonlinear integral equation:

$$I(x, y) = |g(x, y)|^2 \quad (1)$$
$$= [T(f)](x, y)$$
$$= \int_R^4 f(\xi_1, \xi_2) J_0(\xi_1, \xi_2, \eta_1, \eta_2) f * (\eta_1, \eta_2)$$
$$= K(x, y, \xi_1, \xi_2,) K * (x, y, \eta_1, \eta_2) d\xi_1 d\xi_2 d\eta_1 d\eta_2$$

where, I(·) the intensity image at the image plane; g(·) amplitude image at the image plane; f(·) object being imaged (mask); K(·) coherent point spread function——describes properties of lithography system; $j_o(\cdot)$ mutual intensity function——describes coherence properties of the illumination.

However, the above nonlinear integral equation is far too complex to be applied efficiently to realistic integrated circuit patterns. Thus, the image simulations to be discussed with respect to FIGS. 5(a)–(b) are, in one embodiment, produced using a process that is a simplified approximation of the Hopkins model as applied specifically to integrated circuits. In this process, the Hopkins model is first effectively broken down into a number of low pass filters that are applied to the input data. The resulting images are then added to generate the simulated image.

The basic premise of this Hopkins model approximation is contained in Y. C. Pati et al., "Phase —shifting masks for microlithography: automated design and mask requirements", JOURNAL OF THE OPTICAL SOCIETY OF AMERICA, Vol. 11, No. 9, pp. 2438–52, (Sep. 1994), which is incorporated herein by reference as if set forth fully, and in Y. C. Pati et al., "Exploiting Structure in Fast Aerial Image Computation for Integrated Circuit Patterns", IEEE TRANSACTIONS ON SEMICONDUCTOR CIRCUIT MANUFACTURING, Vol. 10, No. 1, pp. 6274, (Feb. 1997) (hereinafter Pati et al., which is also incorporated by reference herein as if set forth fully.

The method referenced above is known as "Optimal Coherent Approximation's" (OCA's) or "Optimal Coherent Decompositions" (OCD's). This method makes use of a structure that can be extracted from the partially coherent Hopkins model in order to simplify the equation on a first order. The first order simplification obtained through OCA utilizes the fact that in the special case where illumination is completely coherent, the Hopkins model. simplifies to:

$$I(x,y) = |(f*K)|^2 \quad (2)$$

where "*" denotes the 2-D convolution operator, $$(p*q)(x,y) = \int\int p(\xi_1, \xi_2) q(x-\xi_1, y-\xi_2) d\xi_1 d\xi_2 \quad (3)$$

Thus, in the coherent case the computation required to compute the image reduces to $O(N\log_2 N)$ using the Fast Fourier transform (FFT), where N is the number of discrete sample points considered. This fact, combined with the utilization of an integrated circuit's inherent structure to drastically reduce the number of computations $<<O(N\log_2 N)$, as described in Pati et al. at 63-65, motivated the use of OCA's which approximate the intensity of the image of a partially coherent optical system as a finite incoherent sum of coherent images such that:

$$I(x,y) = |g(x,y)|^2 \approx \text{for } k=1 \text{ to } m\Sigma\alpha_k|(f*\phi_k)(x)|^2 \quad (4)$$

where the $\alpha_k$'s and the imaging kernels $\phi_k$'s are determined from the illumination mutual intensity function $J_O$ and the coherent point spread function K, and assuming spatial invariance of the imaging system being approximated (each $f*\phi_k$ convolution will be referred to hereinafter as a preimage).

From equation 4, note that the accuracy of the OCA method is dependent upon the number m of coherent images summed. For imaging systems with coherency factors ($\sigma$)<0.5 ——which is in the range of coherency factors commonly employed in optical lithography——it has been demonstrated that only five or six kernels $\phi_k$, and therefore only five or six coherent preimages, are required to provide an acceptable approximation. Therefore the OCA method reduces the problem of image computation to one of computing a small number (5 or 6) of 2-D convolutions and summing the resulting preimages.

The simulation process using OCA as described above is described below with respect to FIG. 5 (a) as it would be used on a design mask, which in one embodiment is described by a GDS-II datafile. As described fully in Pati et al. at 65–69, the computations required for a simulation of a design mask may be simplified to a second order by exploiting the geometrically primitive structures of the integrated circuit. This exploitation of the integrated circuit structure is generally accomplished by: 1) defining a small set of basis functions that can be used to represent integrated circuit patterns,2) computing the preimages of the defined basis functions using the imaging kernels, 3) using the preimages of the basis functions as a set of building blocks to construct the preimages of the mask pattern, and 4) combining the preimages to obtain the image of the mask pattern.

Referring then to FIG. 5(a), a data file containing the design data 500 of the mask is provided as an input, and the set of box widths existing in the design is extracted from the design data at block 505. The lithography conditions for the simulation are provided as an input at block 502, from which the imaging kernels $\phi_k$ are computed at block 515 as described above. A determination is then made if basis preimages for all of the extracted box widths have been precalculated and exist in a database library at block 510.

Basis preimages are then computed at block 520 for those widths whose basis, preimages have not been precalculated. At block 525, all of the basis preimages are combined, and at block 530 the intensity of each combined preimage is taken and added together to form the simulated ideal design stepper image 535. The details of the calculations performed at each block are found in Pati et al. at 65–69. Of note here is that for the design mask simulation, in computing each of the basis preimages at block 520, the full convolution of equation 4 is not performed. Instead, use is made of the knowledge of the spatial bandwidth of the chosen basis functions such that the convolution need only be computed in the spatial domain at a number of desired sample widths.

The simulation process using QCA as described above is described below with respect to FIG. 5(b) as it would be used on a captured image of a physical mask such as by the image simulator 460 of FIG. 4 and the mask image simulator 950 of FIG. 9. The embodiment of the process described below is substantially different than the one described above with respect to FIG. 5(a) because of the form of the input data file. The input image data 550, which comprises digitized image data that in one embodiment is an 8-bit gray scale image file in a: format such as Windows BMP, is first provided to block 555. This data is then processed at block 555 in order to increase the sensitivity of the overall process and to produce a data file whose image is closer to what a mask actually looks like. This is done because of the numerous (256) intensities which may exist in an 8-bit image file taken from a microscope when in reality, the actual mask has only two intensities, dark or clear. Thus in one embodiment, the processing at block 555 may comprise a multiple thresholding process in which the 256 possible intensity levels of the 8-bit file are folded into 4 or 6 levels. Alternatively, the processing at block 555 could comprise a type of non-linear filtering to increase the process sensitivity such as taking the logarithm of the image intensity which would enhance the lower intensities.

The lithography conditions for the simulation are provided as an input at block 552, from which the imaging kernels $\emptyset_k$ computed at block 560 as descrlbed previously. Using the processed image data from block 555 and the imaging kernels $\emptyset_k$ input, the preimages of the wafer image are computed at block 565, and at block 570 the intensity of each preimage is taken and added together to form the simulated stepper image of the physical mask representation 575 in accordance with equation 4.

Note that since the mask function $f$ is defined entirely by pixel data, there is no spatial structure which can be taken advantage of as with a design mask. However, since each pixel is of the same size, the step of block 525 of FIG. 5(a) can be avoided since there is only one basis preimage to be calculated for each of the imaging kernels $\emptyset_k$. The computation of preimages at block 565 also differs from its corresponding block 520 of FIG. 5(a). For, there is no preexisting knowledge from which one could limit the convolution to only a small number of sample points and still get an accurate approximation of the preimage. Thus, the full convolution of equation 4 needs to be performed using the mask function $f$——which consists of processed pixel data——in order to approximate each preimage and therefore the final mask image accurately. A straight convolution in the spatial domain would result in an enormous amount of data, and large amounts of processing time for each preimage. This embodiment of the invention solves these problems by performing each convolution in the time domain using a Fast Fourier Transform (FFT) on equation 4 in order to compute each preimage. Thus, by taking the FFT of both $f$ and $\emptyset_k$, the value of the kth preimage can more easily be solved as shown below, where $I(x,y)_k$ is equal to the kth preimage:

$$\text{Since } I(x, y)_k \propto (f * \emptyset_k) \tag{5}$$

$$\text{Then } F(I_k) \propto F(f) \cdot F(\phi_k) \tag{6}$$

Although an FFT is used in one embodiment of the invention, any transformation could be used to remove the convolution from the spatial domain and perform the underlying preimage calculations of equation 4.

As noted previously with respect to FIG. 4, the image simulation process of the present invention may, in alternate embodiments, take into account the parameters associated with the photoresist material to be used and/or the etching process to be used oh the exposed wafer in order to simulate the end result of these processes. FIGS. 6(a)–(b) illustrate, in simplified process flow diagram form, two alternate embodiments of the invention which take these parameters into account. For instance, FIG. 6(a) illustrates the use of additional simulation models in conjunction with the lithography simulation discussed above to produce images which take photoresist and/or etching parameters into account. In this embodiment a physical mask 604 to be simulated is provided as an input along with lithography conditions 602 to the stepper image generator 600 which produces a simulated mask stepper image 606 in the manner discussed above with respect to FIGS. 4 and 5. Data representing the simulated mask stepper image 606 —which may be in the form of image intensity data—is then provided along with photoresist parameters 612 to a photoresist image simulator 610 which in turn produces a simulated photoresist image 616. The simulated photoresist image 616 represents an image of a wafer exposed through the physical mask 604 wherein the wafer was coated with a photoresist material described by the photoresist parameters 612. Data representing the simulated photoresist image 616 may then be provided along with etching process parameters 622 to an etching image simulator 620 which in turn produces a simulated etching image 626. The simulated etching image 626 represents an image transferred on a wafer after the wafer was exposed through the physical mask 604 wherein the wafer was coated with a photoresist material described by the photoresist parameters 612 and then etched in accordance with the etching process parameters 622.

In one embodiment, these photoresist parameters 612 and etching process parameters 622 are able to be changed by a user to match those which will be used in the actual production of a wafer. The photoresist parameters 612 may include thickness, contrast, pre-bake time, post-bake time, development time, photoresist concentration, developer solution concentration, and light absorption of the photoresist among others. The etching process parameters 622 may include etching time, etching method, and concentration among others. In one embodiment of this invention, the photoresist image simulator 610 comprises a computer implemented program which accepts image data provided by the stepper image generator 600 and produces the simulated photoresist image 616. As before with respect to FIG. 4, the image data may be provided in real time or from a storage device which has previously stored the simulated mask stepper image data 606. Similarly, in one embodiment of this invention, the etching image simulator 620 comprises a computer implemented program which accepts image data——either in real time or previously stored——provided by the photoresist image simulator 610 and produces the simulated etching image 626.

In these computer implemented embodiments, the photoresist image simulator 610 and the etching image simulator 620 programs may be run on a variety of computer platforms including: a PC using the Windows 95™ or NT™4.0 operating system with 128 MB of RAM and a 200 MHz Pentium Pro™ microprocessor, either stand alone or connected to a network, and a SUN™ workstation computer among others. The photoresist image simulator 610 program described above, may in one embodiment utilize the photoresist model developed by T. A. Brunner and R. A. Ferguson of IBM as set out in "Approximate Models for Resist Processing Effects", SPIE, Vol. 2726, p. 198, which is incorporated herein by reference as if set forth fully. The etching image simulator 620 program described above, may in one embodiment utilize the model developed by TMA as set out in "Accurate Modeling of Deep Submicron Interconnect Technology", TMA TIMES, Vol. IX, No. 3, (Fall 1997) which is incorporated herein by reference as if set forth fully.

FIG. 6(*b*) illustrates an alternate embodiment in which photoresist or etching parameters can be accounted for in the simulation by calibrating the lithography image simulation discussed previously with respect to FIGS. 4 and 5. In general the process illustrated in FIG. 6(*b*) comprises calibrating the stepper image generator 600 with the calibrator 660 such that a desired real result 650——for instance, a photoresist image or etching image——is obtained when a physical mask is provided as an input to the system. The process comprises first initializing the system by providing a reference data 655 to the stepper image generator 600 and the calibrator 660. The reference data 655 may comprise any data which is representative of a known mask such as the design layout data for the mask to be simulated, or an image of a similar mask which has been determined to be free from defects.

The stepper image generator 600 provides an image simulation output to a summing device 675 where it is added to the output of the calibrator 660. The output of the summing device 675 is provided to a difference device 680 along with a real result 650. The desired real result 650 which is provided to the difference device 680 may, in one embodiment, comprise either an etch result 640 or a photoresist result 630, which in one embodiment is chosen by the user. Similarly, the photoresist result may comprise either an actual photoresist image 636 or a simulated photoresist image from a photoresist image simulator 610 which again, may be chosen by the user in one embodiment. The actual photoresist image 636 could be an actual image of a wafer which has been exposed under the photoresist conditions the user wishes to simulate. As discussed above with respect to FIG. 6(*a*), the photoresist image simulator 610 generates a simulation of the image on a photoresist coated wafer which has been exposed through a mask. In this case the reference data 665 is provided to an uncalibrated stepper image generator 600 which provides its output to the input of the photoresist image simulator 610 which generates a photoresist simulation as discussed above——in this manner a proper comparison can be performed between the real results 650 data and the summing device 675 output.

Similarly, the etch results may comprise either an actual etching image 646 or a simulated etching image from an etching image simulator 620 at the choice of the user. The actual photoresist image 646 could be an actual image of a wafer which has been exposed under the photoresist conditions the user wishes to simulate, and then etched in accordance with the etching parameters desired to be simulated. As discussed above with respect to FIG. 6(*a*), the etching image simulator 620 generates a simulation of the image transferred on a photoresist coated wafer which has been exposed through a mask and then etched. As discussed above, the initial input to the etching simulation is the reference data 655——in this manner a proper comparison can be performed between the real results data and the summing device 675 output.

The difference device 680 takes the difference between the real result 650 and the output of the summing device 675, and the output of the difference device 680 is provided to the minimizer 670. The minimizer 670 acts to zero the output of the difference device 680 by adjusting the output of the summing device 675. The minimizer 670 performs this by generating feedback signals to the stepper image generator 600 and the calibrator 660 such that the values assigned to particular physical and non-physical variables respectively are altered in a predetermined manner to zero the output of the difference device 680.

This initialization procedure is continued until the system achieves a zero output from the difference device 680, at which time, the proper variable settings in the stepper image generator 600 and calibrator 660 have been achieved. At this point, the variables within the stepper image generator 600 and calibrator 660 have been set by the minimizer 670 such that the output of the summing device 675 is substantially equal to the desired real result 650 which may, as stated above, in one instance be a photoresist simulation and in another an etching simulation. These variable settings are then, in one embodiment, "locked in" while simulations are performed on real physical masks 604 to obtain the desired results. Once the system has been initialized with the reference data 655, simulation of a physical mask 604 then comprises simply providing image data of defect areas to the stepper image generator 600 and calibrator 660 as discussed earlier with respect to FIG. 4, and then summing the output of these two devices. The end result is the calibrated simulation output 690 which reflects the desired simulation result such as a photoresist or etching processes.

The calibrator 660 may comprise, in one embodiment, a computer program which provides an output comprising a set of non-physical variables whose values are dependent upon the reference data 655 input and the feedback from the minimizer 670. Similarly, the summing device 675, difference device 680 and minimizer 670 may also, in one embodiment, comprise a computer program which executes the steps set out above.

FIGS. 7(*a*)–(*b*) illustrate, in block diagram form; various situations in which the present invention could be used in the areas of photolithography mask manufacture and wafer fabrication. For instance, referring to FIG. 7(*a*), a mask manufacturer uses design data 700 supplied by an integrated circuit designer to produce a physical mask 705 which must be inspected prior to being sent to a wafer fabrication plant 730. If the mask fails inspection, it must be either repaired 720 or reprinted 725 and then reinspected. This inspection could be done on-line 710 or off-line 715 using various embodiments of the present invention. For instance, an on-line 710 embodiment of the present invention could be configured to work in parallel with a conventional mask inspection tool where the inspection is on-the-fly. All such an embodiment would need is a feed of image data representative of any potential defects the mask inspection tool detects in orders to produce wafer simulations of the current microscope image. Another embodiment of the present invention could be implemented directly within an on-line, inspection system, to provide quick real time assessment of potential defect areas flagged by a SEM for instance. With respect to off-line inspection 715, one embodiment of the invention can utilize previously stored defect data independently of, or together with, an off-line microscope review station. Finally, an embodiment of the present invention could be utilized by mask manufacturers to inspect the repair site of a mask undergoing repair 720 in an in situ manner to qualify individual repair sites separately on the mask.

Turning now to FIG. 7(b), a wafer fabricator receives a physical mask from a manufacturer, and quality checks 750 the mask to ensure that it meets the required specifications prior to being used in lithography 760 to produce wafers 770. This quality checking 750 step can be enhanced by inspecting the mask 755 with an embodiment of the invention similar to those discussed above with respect to FIG. 7(a). Furthermore, a wafer fabricator can use an embodiment of the present invention to periodically requalify 765 a mask that has been used for a number of exposures. This becomes necessary because masks can be damaged or contaminated with particles after repeated use. Thus, an embodiment of the invention can be used to assist in overseeing this quality control process to decide whether the mask needs to be cleaned or remade.

FIG. 8 illustrates, in a process flow diagram, one embodiment of a system for both on-line and off-line inspection of a photolithography mask in accordance with one embodiment of the invention. The system includes an inspection tool 805, an on-line inspection station 820, and an off-line inspection station 850. The inspection tool 805 includes an image acquiror 810, a defect detection processor 815 and a defect area image generator 817 each of which may operate as discussed above with respect to FIG. 4. The on-line inspection station 820 includes an input device 825 such as discussed previously with respect to FIG. 4, an image simulator 830 such as described previously with respect to FIGS. 4 and 5(b), and a defect analyzer 835. The off-line inspection station 850 includes an image simulator 860 such as described previously with respect to FIGS. 4 and 5(b), and a defect analyzer 870.

The system of FIG. 8 operates to provide a number of possible outputs with respect to the inspection of a mask as follows. The physical mask 800 is first inspected by the inspection tool 805. As described earlier with respect to FIG. 4, the inspection tool 805 scans the physical mask 800 for possible defects and the defect area image generator 817 generates defect area images of those areas of the mask containing possible defects. The defect area image data is then analyzed by either the off-line inspection station 850, the on-line inspection station 820, or both.

When inspected by the off-line inspection station 850, the defect area image data is provided to a digitizer device 853 as previously discussed, and then stored in storage device 855 in any suitable image data format, such as Windows BMP, and on any suitable storage media as discussed previously. The defect area image data is then input to the image simulator 860 along with lithography conditions input 862, and a simulation of the stepper image on a wafer for the mask defect area is produced. The lithography conditions input 862 contains process specific data as discussed previously with respect to FIG. 4. In one embodiment this simulation is performed as discussed with respect to FIG. 5(b). The simulation of the stepper image is then provided to the defect analyzer 870 so that the potential defect can be analyzed for printability and process window effects. The defect analyzer 870 may comprise a device which allows viewing the image of the simulation by an operator such as a lithography engineer who can then make judgements as to the severity of the potential defect. The defect analyzer 870 may also comprise a device which allows comparison of the simulated image of the defect area with a simulation of an area on the design layout which corresponds to the defect area as will be discussed with respect to FIG. 9. After the defect area is inspected, a decision 875 is made as to whether or not the mask passed the inspection. If the mask passes the inspection it is then used in the lithography process 880, while if the mask fails the inspection it is either remade or the defect(s) is/are repaired 885.

When inspected by the on-line inspection station 820, the defect area image data may be provided in real time to the input device 825, which in turn outputs this data to the image simulator 830. The image simulator 830 also receives lithography conditions input 832 which contains process specific data as discussed previously with respect to FIG. 4. The image simulator 830 generates a simulation of the stepper image on a wafer for the mask defect area, which, in one embodiment is generated in accordance with the process discussed with respect to FIG. 5(b). Similarly, the image simulator 830 can generate a number of simulations for the defect area using ranges of input lithography conditions, and then generate a simulated process window which represents the effect the potential defect area has on the process window. The output of the image simulator 830 is provided to the defect analyzer 835 which analyzes the defect area simulation and/or the simulated process window and provides an analysis output 840. In one embodiment, the defect analyzer 835 is a computer implemented program which processes the simulation data in light of user input defect criteria to determine whether the defect is severe enough to warrant further inspection, or whether the defect area does not print or otherwise effect the process window over a user defined set of possible lithography conditions.

In one embodiment, to be discussed further with respect to FIG. 11, the analysis output 840 comprises one of a number of different decision indicators. For instance, these indicators may include "reject", "repair", "accept", and "undecided" based upon a number of different criteria that the user may input into the defect analyzer 835. In the case that the analysis output is "accept", the mask is sent on to the lithography process 880 without further inspection. If the analysis output is "reject", "repair", or "undecided", the defect area image data may be stored at block 845 and then input to the off-line inspection station 850 for further analysis by a more skilled operator such as a lithography engineer.

FIG. 9 illustrates, in a process flow diagram, another embodiment of a system for inspection of a photolithography mask in accordance with one embodiment of the present invention. The system includes an inspection tool 900, a stepper image generator 940, and a defect analyzer 990. Inputs to the system include a physical mask 905, a reference description 935, and lithography conditions 965. The reference description 935 comprises data which represents a defect free design layout of the physical mask 905. In one instance this data may comprise reference image 912 which could be an image of a physical mask which has been previously inspected and determined to be free from defects. In another instance, this reference description may comprise the design layout data 910 for the physical. mask 905. The inspection tool 900 includes an image acquiror 915, a defect detection processor 925 and a defect area image generator 930 each of which may operate as discussed above with respect to FIG. 4. The stepper image generator 940 includes input devices 945 and 955 such as discussed previously with respect to FIG. 4, a mask image simulator 950 such as described previously with respect to FIGS. 4 and 5(b), and a design image simulator 960 which operates as discussed with respect to FIG. 5(a) and/or FIG. 5(b) depending on the input to the input device 955. The defect analyzer 990 may include an image comparator 980, a process window analyzer 985, and a performance output device 995.

The system of FIG. 9 operates to inspect a physical mask 905 as follows. The physical mask 905 is first inspected by the inspection tool 900. As described earlier with respect to FIG. 4, the inspection tool 900 scans the physical mask 905 for possible defects and the defect area image generator 930 generates defect area images of those areas of the mask containing possible defects. The defect detection processor 925 may also receive design layout data 910 as an input. In this instance, for each defect area image that is generated, the defect detection processor 925 may operate to locate the corresponding area on the design layout data 910 and provide this information to input device 955. In one embodiment the design layout data 910 is in GDS-II format. The defect area image generator 930 provides the defect area image data to the input device 945 of the stepper image generator 940 which processes the data as discussed previously. The mask image simulator 950 receives the processed image data from the input device 945 and lithography conditions input 965, and generates a simulated mask stepper image 970 and simulated process window information in a manner described above with respect to FIG. 5(b).

The input device 955 of the stepper image generator 940, in one instance, receives the design layout data 910 corresponding to the defect area from the defect detection processor 925 and provides the design image simulator 960 with design data representing an area to be simulated that corresponds to the defect area being simulated. The design image simulator 960, using the same lithography conditions input 965, generates a simulated design stepper image 975 and simulated process window information in a manner described above with respect to FIG. 5(a). Similarly, in another instance, the reference image 912 may be provided to the input device 955, and the design image simulator 960 may then use the reference image data to generate the simulated design stepper image 975 and simulated process window information in a manner described above with respect to FIG. 5(b).

The simulated mask stepper image 970 and the simulated design stepper image 975 are provided to the image comparator 980 of the defect analyzer 990. In one embodiment the defect analyzer 990 includes a computer implemented program that is capable of displaying the images 970 and 975, and displaying the differences between the two such that an operator can visually detect any differences the output of an embodiment of such a program is illustrated in FIGS. 17 and 20 below. The simulated process window data from the stepper image generator 940 is provided to the process window analyzer 985 of the defect analyzer 990. The process window analyzer 985 in one embodiment is a computer implemented program capable of displaying the effect that a potential defect area has on the overall process window of the lithography process as compared to the "perfect" design mask. Such a process window output will be described further with respect to FIGS. 10(a)–(c) below, and is also illustrated in FIGS. 15 and 19. The outputs of the stepper image generator 940 for the physical mask 905 and the reference description 935 are also provided to a performance output device 995. The performance output device 995 in one embodiment is a computer implemented program capable of determining and displaying the effect that one or more defects have on the overall performance of the integrated circuit for which the physical mask 905 will be used to produce.

FIGS. 10(a)–(c) illustrate an example of how a potential defect area could affect the overall process window of the photolithography process. FIG. 10(a) is an illustration of an x–y coordinate plot of data with exposure deviation % on the x-axis and lithography defocus (in nanometers) on the y-axis. Data curves 1002 and 1004 represent a typical plot of data for a first chosen area on a mask in which the area has no defect. The area between the curves 1002 and 1004 represents the range of defocus and exposure deviation values which would still give acceptable lithography results at the first chosen area in accordance with a user defined set of acceptance criteria. Data curves 1006 and 1008 represent a typical plot of data for a second chosen area on a mask in which the area has no defect. The area between the curves 1006 and 1008 represents the range of defocus and exposure deviation values which would still give acceptable lithography results at the second chosen area in accordance with the same user defined set of acceptance criteria. Area 1010 defines the overlap of the above two bounded areas, and represents the range of defocus and exposure deviation values which would give acceptable lithography results at both areas in accordance with the user defined set of acceptance criteria. The process window plot depicted in FIG. 10(a) could contain additional curves representing additional chosen areas on the mask in order to define the range of acceptable lithography conditions more finely. Further, different parameters could be plotted on the x-axis and the y-axis including critical dimension, temperature and exposure dose in order to determine the sensitivity of the acceptable lithography conditions to variations in the parameters affecting the lithography process.

FIG. 10(b) is an illustration of a process window for the same mask as in FIG. 10(a), except that the first chosen area contains a defect. Thus, data curves 1012 and 1014 represent a typical plot of data for a first chosen area on a mask in which the area has a defect. The area between the curves 1012 and 1014 represents the range of defocus and exposure deviation values which would still give acceptable lithography results at the first chosen area in accordance with a user defined set of acceptance criteria. Data curves 1016 and 1018 correspond directly with curves 1006 and 1008 of FIG. 10(a), as does the area between curves 1016 and 1018. Area 1020 defines the overlap of the above two bounded areas, and represents the range of defocus and exposure deviation values which would give acceptable lithography results at both areas in accordance with the user defined set of acceptance criteria. Note that the defect at the first chosen area, in this example, has decreased the range of lithography conditions which will give an acceptable result. Note also that this could be the case, in some examples, even if the defect did not print. FIG. 10(c) is provided to clearly illustrate the effect that a defect at a mask area can have on the process window. Area 1030 represents the difference between area 1010 and area 1020, and therefore represents the range of lithography conditions that are effectively made unavailable to the lithographer as a result of the defect.

FIG. 11 illustrates a process flow chart representing one embodiment of the on-line defect analyzer 835 of FIG. 8. A simulated mask image 1100, such as provided by the image simulator 830 of FIG. 8, is provided to the on-line defect analyzer 1110. The defect analyzer 1110 provides an indicator 1150 to a user, such as a mask fabrication line worker, as to the status of any defect area on the mask image 1100. This indication, in one embodiment, comprises one of the three indicators "accept", "reject", or "repair", and may be implemented with any means that alerts the user as to the status of the mask. This means may consist of an illuminated red light when the indicator is either "reject" or "repair", and an illuminated green light when the indicator is "accept". The defect analyzer 1110 generates the indicator based upon an analysis of the mask image 1100 with respect to user input inspection criteria. In one embodiment, the defect analyzer 1110 assigns a defect severity score 1140 to the defect on the simulated mask image, and provides one of the three indicators in response to the defect severity score 1140. This defect severity score 1140 may be a weighted score which takes into account various parameters associated with the defect including, defect size and type 1120, defect context and location (i.e. for instance if the defect is near a transistor gate, it might be weighted more heavily) 1122, printability of the defect 1125, process window impact 1130 of the defect, and the wafer process data 1135 such as the lithography conditions. As discussed earlier, the wafer process data 1135 may also be used in determining the printability 1125 and process window impact 1130 of a defect. In one embodiment of the invention, each of the aforementioned inputs to the severity score 1140 may be weighted according to user preference. The defect analyzer 1110 is, in one embodiment, a program implemented by a computer which interfaces with a set of indicator lights to provide the output indicator 1150. As discussed previously with respect to FIG. 8 the defect analyzer may also provide for the storage of defect data such that it may be later analyzed by an inspection engineer off-line.

The remaining figures illustrate sample screen shots taken of a computer implemented program which utilizes one embodiment of the present invention. All images described as microscope images in the remaining figures-were taken with a transmission mode microscope. Thus, bright areas represent quartz (clear) areas on the mask, and dark areas represent chrome (opaque) areas. The images described as simulated wafer images in the remaining figures are similarly represented in that bright areas represent areas on the photoresist that will be exposed to light, and dark areas represent areas on the photoresist that have not been exposed to light.

For instance, FIG. 12 illustrates a screen shot 1200 comprising windows 1210, 1220, 1230, 1240, 1250, and 1260 in which a defective mask is simulated to print under 5 different stepper conditions. Window 1210 illustrates a captured microscope image of a mask containing various defects of different sizes such as defect 1212. Window 1220 illustrates the simulated wafer exposure of the mask of window 1210 under a particular set of I-line stepper conditions. Window 1230 illustrates the simulated wafer exposure of the mask of window 1210 under a set of I-line stepper conditions in which annular illumination is used. Window 1240 illustrates the simulated wafer exposure of the mask of window 1210 under a another particular set of I-line stepper conditions. Window 1250 illustrates the simulated wafer exposure of the mask of window 1210 under still another set of I-line stepper conditions. Finally, window 1260 illustrates the simulated wafer exposure of the mask of window 1210 under a particular set of Deep Ultra-Violet (DUV) stepper conditions.

FIG. 12 illustrates the problem of identifying defect printability that is associated with the prior art. Note how all of the defects present in window 1210 do not show up or "print" in the final simulated wafer exposure under the various stepper conditions illustrated in windows 1220–1260. In particular, it is of note that defect 1212 does not print under some conditions as shown by defect simulation marks 1232 and 1242, while under other conditions defect 1212 does print as shown by defect simulation marks 1222, 1252, and 1262. Without the information provided in FIG. 12, an inspection engineer would have to rely on his experience, or use actual wafer exposures to determine whether a defect will print (or otherwise detrimentally affect the process window as will be explained below) under a particular set of lithography conditions.

FIG. 13 illustrates a screenshot 1300 of one embodiment of the graphical user interface of a computer implemented program utilizing one embodiment of the present invention. The screenshot 1300 comprises windows 1310, 1320, 1330, and 1340. Window 1310 illustrates a captured microscope image of a portion of a mask while window 1320 illustrates the simulated wafer exposure of the mask of window 1310 under a particular set of DUV stepper conditions. Window 1330 illustrates the original mask layout design of the portion of the mask shown in window 1310, and window 1340 illustrates the simulated wafer exposure of the original mask layout design of window 1330 using the same stepper conditions as for the simulation displayed in window 1320. As can be seen from FIG. 13, the present invention allows one to compare directly the stepper image of the original design with the stepper image of the manufactured mask in order to determine the affect of a defect on the original design.

FIG. 14 illustrates a screenshot 1400 of a computer implemented program utilizing one embodiment of the present invention in which the mask being inspected has been OPC corrected. The screenshot 1400 comprises windows 1410, 1420, 1430, 1440, 1450 and 1460. Window 1410 illustrates a captured microscope image of a portion of a mask. Window 1420 illustrates a captured microscope image of the same portion of an OPO corrected mask. Window 1430 illustrates a captured microscope image of the same portion of an OPC corrected mask with a defect 1432 in one of the OPC assist bar features. Window 1430 also shows other OPC features including positive serifs such as serif 1436 to counter line end shortening and serif 1438 to counter comer under exposure, and negative serifs such as serif 1434 to counter comer over exposure. Window 1440 illustrates the simulated wafer exposure, of the mask of window 1410 under a particular set of stepper conditions. Window 1450 illustrates the simulated wafer exposure of the OPC corrected mask of window 1420 under the same set of stepper conditions, and window 1460 illustrates the simulated wafer exposure of the defective OPC corrected mask of window 1430 under the same set of stepper conditions.

As can be seen from FIG. 14, the present invention allows an operator to visually detect whether an OPC defect would print on the stepper image of the manufactured mask by looking at the window 1460. In this example, defect 1432 shows up in the stepper image of window 1460 as defect print 1462. Whether or not this defect will have any detrimental effect on the operation of the designed circuit can also be determined as described previously above. Further, by looking at the simulated wafer exposure image, the operator can see if the designed OPC corrections, even if not defectively reproduced on the mask, are performing their OPC function correctly. For instance, if the simulated wafer exposure shows primitive geometries with comers that are not square enough, the operator can determine that the serifs 1436, 1438, and negative serifs 1434, are not properly sized. Similarly, if the operator determines that the OPC features are over or under sized, then the operator can use this information to try and determine if their was a problem in the conversion of OPC features during data conversion or mask write.

Although defective sub-resolution OPC features may not print, they may affect the manufacturing process window in ways which are important to the overall process. For instance, the defocus variable in the photolithography process may change slightly from exposure to exposure with a given stepper system. Previously, one would have to compare actual exposures for each defocus value of interest in order to determine the overall effect of a defect throughout this range. The application of the present invention to this problem is shown in FIG. 15 which illustrates a screenshot 1500 of a computer implemented program utilizing one embodiment of the present invention in which the mask being inspected has been OPC corrected. The screenshot 1500 comprises windows 15 10, 1520, 1530, 1540, 1550 and 1560. Window 1510 illustrates the same captured microscope image of a portion of a mask as shown in window 1410 of FIG. 14. Window 1520 illustrates the same captured microscope image of a portion of an OPC corrected mask as shown in window 1420 of FIG. 14. Window 1530 illustrates the same captured microscope image of a portion of an OPC corrected mask with a defect 1532 in one of the OPC assist bar features as shown in window 1430 of FIG. 14. Window 1530 also shows other OPC features including positive serifs such as serif 1536 to counter line end shortening and serif 1538 to counter comer under exposure, and negative serifs such as serif 1534 to counter corner over exposure.

Window 1540 illustrates a process window which has been calculated for a range of simulated wafer images of the captured mask image of window 1510 in which a number of different defocus values were used. The process window illustrated in window 1540 displays Critical Dimension vs. Optical Defocus for two areas of the captured mask shown in window 1510. Curve 1542 displays data obtained from the range of simulations for Area #2, and curve 1544 displays data obtained for Area #1. Window 1550 illustrates a similar process window obtained for the OPC corrected mask image of window 1520. Again, curve 1552 displays data obtained from the range of simulations for Area #2, and curve 1554 displays data obtained for Area #1. Lastly, window 1560 illustrates a similar process window obtained for the defective OPC corrected mask image of window 1520. Again, curve 1562 displays data obtained from the range of simulations for Area #2, and curve 1564 displays data obtained for Area #1. Note that the although the defect 1532 was not shown to be significantly printable in window 1460 of FIG. 14, the same defect 1532 could still have a large effect on the available process window as shown by a comparison of the curves in windows 1550 and 1560.

FIG. 16 illustrates a situation in which an identified defect is shown not to print under a particular set of stepper conditions by a computer implemented program incorporating one embodiment of the present invention. FIG. 16 comprises a portion of a screenshot 1600 from the aforementioned computer program which shows a captured microscope image of a portion of a mask with a defect 1602. FIG. 16 further comprises a portion of a screenshot 1610 from the aforementioned computer program which shows the simulated wafer exposure of the mask of window 1610 under a particular set of DUV stepper conditions. Area 1612 of window 1610 corresponds to defect 1602, and shows that the defect 1602 will not print under the particular stepper conditions. Therefore, in this situation it would be unnecessary to discard this mask based on defect 1602. Further, it would also be unnecessary to perform a repair of defect 1602 while risking unseen damage to the repaired site.

FIG. 17 illustrates several screenshots 1700, 1710, 1720, and 1730 of a computer implemented program utilizing one embodiment of the present invention in which it is demonstrated that the comparison of a stepper image directly from the layout database and a stepper image simulated from the captured mask image may yield problem areas. The screenshot 1710 illustrates a captured microscope image of a portion of a mask while screenshot 1730 illustrates the simulated wafer exposure of the mask of screenshot 1710 under a particular set of DUV stepper conditions. Screenshot 1700 illustrates the original mask layout design of the portion of the mask shown Mi screenshot 1710, and screenshot 1720 illustrates the simulated wafer exposure of the original mask layout design of screenshot 1700 using the same stepper conditions as for the simulation displayed in screenshot 1730. Looking at areas 1732, 1734, and 1736 of screenshot 1730 it becomes apparent to an operator that there are problem areas to be considered. However, without the simulated mask exposure image these areas would not be as readily apparent as one would have, to compare the captured mask image of screenshot 1710 with the original layout image of screenshot 1700. For when one compares areas 1712, 1714, and 1717 of screenshot 1710 to areas 1702, 1704, and 1706 of screenshot 1700, these problems are not as easily discovered.

FIG. 18 illustrates a screenshot 1800 of a computer implemented program utilizing one embodiment of the present invention in which the mask being inspected has been OPC corrected. The screenshot 1800 comprises windows 1810, 1820, 1830, and 1840. Window 1830 illustrates an original layout of a portion of an OPC corrected mask with a small defect on an assist line as shown in area 1832. Window 1840 illustrates an original layout of a portion of the same OPC corrected mask but without the defect as shown in area 1842. Window 1810 illustrates the simulated wafer exposure of the mask of window 1830 under a particular set of stepper conditions. Window 1820 illustrates the simulated wafer exposure of the mask of window 1840 under the same set of stepper conditions.

It is of note that the small defect shown in area 1832 prints under the particular stepper conditions simulated in FIG. 18. This small defect might be overlooked by conventionally used methods for inspecting OPC corrected masks. For, as stated previously, the OPC feature sliding tolerance scale used by some previous methods would not consider this slight deviation a defect if its size was smaller than the arbitrarily set scale. However, as shown here, because of the location and purpose of OPC features such as the defective assist line shown in area 1832, such small defects could print and therefore affect the operation of the end product circuit.

FIG. 19 illustrates several screenshots 1900, 1910, and 1920 of a computer implemented program utilizing one embodiment of the present invention in which the effect of defects on the photolithography process window is, demonstrated. The screenshot 1900 illustrates the simulated wafer exposure of a mask in which an area with no defect 1902 and. two defect areas 1904 and 1906 are shown. Screenshot 1910 illustrates a simulated process window plot of Critical Dimension vs. Defocus for each of the areas 1902, 1904, and 1906, where data line 1 corresponds to the non defect area 1902, data line 2 corresponds to the defect area 1904, and data line 3 corresponds to defect area 1906. Line 1912 represents the user defined value of target CD for the mask, while lines 1914 and 1916 represent the upper and lower bounds of acceptable CD for the mask. The simulation illustrated in screenshot 1910 was performed for a lithography system with a Numerical Aperture of 0.50. Screenshot 1920 illustrates the same simulation as screenshot 1910, except that the Numerical Aperture of the simulated system was 0.42. From the process windows illustrated in screenshots 1910 and 1920 a user can determine the range of acceptable defocus values of an exposure utilizing the mask under inspection. For instance, with respect to screenshots 1910 and 1920, the range of acceptable defocus values is that range within which the CD value of each of the three areas 1902, 1904, and 1906 falls within the upper and lower CD bounds 1914 and 1916.

Finally, FIG. 20 illustrates another screenshot 2000 of a computer implemented program utilizing one embodiment of the present invention. The screenshot 2000 comprises windows 2010, 2020, 2030; 2040, 2050 and 2060. Window 2010 illustrates a captured microscope image of a portion of a mask with a defect in area 2012. Window 2020 illustrates the simulated wafer exposure of the mask of window 2010 under a particular set of stepper conditions, and shows the defect 2012 at area 2022. Window 2040 illustrates the original design layout of the captured mask image of window 2010. Window 2050 illustrates the simulated wafer exposure of the original design layout of window 2040 under the same particular set of stepper conditions. Window 2030 illustrates the difference between the simulated image of window 2020 and the simulated image of window 2050, and illustrates at area 2032 the overall effect of the defect 2012 on the design image. Window 2060 illustrates a 3D representation of the stepper image near the defect area.

In accordance with the present invention, a mask defect printability simulation server provides simulation results and analysis to multiple clients over a wide area network, such as the Internet. This network-based simulation server provides a number of distinct advantages. For example, any simulation tool is an extremely complicated tool to learn and to use effectively. Therefore, clients have typically had to use dedicated employees for using these tools. Because the simulation server of the present invention is accessible via the Internet, clients not having the financial resources to add such specialized employees can now leverage a core of highly-trained engineers who work for the simulation server provider.

Additionally, the network-based simulation server can be easily supported since only a single source for the tool is necessary for multiple clients. Although the impact of a service disruption is potentially greater for the network-based simulation server, more safeguards can be implemented for this server at less cost than maintaining multiple simulation tool sites.

A simulation tool also needs a large memory to organize the mask images and their associated reports/information, thereby requiring a high-end personal computer or a workstation. Because a client need only access, not run, the simulation server in the present inventions, a standard personal computer having a browser is sufficient, thereby eliminating a significant expense to the client.

Finally, using standard simulation tools, users have no way to communicate with each other as the mask simulation and analysis is being done. In the network based simulation server, multiple users can literally view the same mask image and provide real-time comments to each other as simulation and analysis are performed. Thus, the present invention encourages invaluable problem-solving dialogue among users.

FIG. 21 illustrates a simulation server 2101 in accordance with the present invention connectable to a plurality of client sites 2103A–2103C via a wide area network 2102 (for example, the Internet). In accordance with the present invention, a client can upload a mask image from the client site 2103 to the simulation server 2101 via the Internet 2102 or, alternatively, can provide a physical mask image file 2104 readable by the simulation server 2101.

In one embodiment of the present invention, the mask image includes only defect area image data (see defect area image data 444 described in reference to FIG. 4). Because this data in and of itself would not typically be considered confidential information, the data can be transmitted without encryption. In another embodiment, the mask image includes significantly more than the defect area image data. Under these circumstances, encryption can be used to protect the confidential nature of the transmission from the client. Note that any standard encryption can be used.

FIG. 22 illustrates the client site 2103A and the simulation server 2101 in greater detail. (Note that the other client sites 2103B and 2103C are substantially similar to the client site 2103A and therefore are not described in detail.) The client site 2103A typically includes an inspection tool 2209 that scans the mask for potential defects and identifies the location of each defect found. In most cases, a digitizing device 2210 converts the image into a digital file (i.e. the mask image) which is stored in a storage device 2211 (typically in JPEG or GIF format) for later use by the client. (For more detailed information regarding inspection tool 2209, digitizing device 2210, and storage device 2211, the reader's attention is directed to the description of the inspection tool 400, the digitizing device 446, and the storage device 447 in FIG. 4.)

When the client wishes to import the mask image to simulation server 2101, the client uses a computer 2203 to access the appropriate file in storage device 2211. In accordance with the present invention, the computer 2203 need not be a powerful personal computer (PC) or a station with a big memory. However, to perform an import function via the Internet 2102, the computer 2203 must have a browser 2202. In general, a browser interprets HTML code to generate a graphical screen display that includes text, images, and hypertext links. This browser allows the client to view the screens including the mask images and reports described in detail below. As known by those skilled in the art, HTML (HyperText Mark-up Language) or Java are the standard languages used to ensure correct display in a web browser. In accordance with the present invention, any standard browser, such as Netscape Navigator or Microsoft Explorer, can be used.

Client site 2103A further includes a plurality of client view stations 2201A. In one embodiment, stations 2201A are implemented with standard personal computers; however, note that each station 2201A includes its own browser 2202 that connects to the Internet 2102. In this manner, station 2201A(1) may be at a location different than station 2201A(2). Indeed, stations 2201A may also be at locations different from computer 2203, inspection tool 2209, digitizing device 2210, and storage device 2211. In one embodiment, at least one client view station is used by a mask house or a fab that provides services to the client. Irrespective of location, the users of stations 2201A and computer 2203 are associated with one client, which provides distinct advantages as described in detail below.

To communicate with the client view stations 2201A and computer 2203 (all having Web browsers 2202), the simulation server 2101 includes a Web server 2204. In one embodiment, the Web server 2204 is programmed with open source software, such as mySQL, Apache, or PHP3. Open source software has several advantages over proprietary software including no development or acquisition cost, no licensing fees, the availability of source code to directly make improvements or fix bugs, its platform independence, and industry standardization. Therefore, by using open source software, the code for implementing the Web server is extremely robust with minimal additional cost to the total system.

Web server 2204 includes a standard Web interface 2205 that receives and transfers the mask image to the appropriate module 2206, which in turn stores the mask image in a database 2207. When the client wants to perform operations on the mask image, the appropriate module retrieves the necessary information from the database 2207 and transfers that information to an application 2208. The application 2208 includes the simulation software as well as all test and report generation software. After the application 2208 operates on the information and outputs results in the form of simulations, one-dimensional plots, or reports, these results are provided to the modules 2206 for display by interface 2205 and for storing in database 2207. Note that in one embodiment, one of the modules 2206 acts as the server for application 2208.

In one embodiment, the mask image generated by inspection tool 400 can be provided directly to the computer 2203 in a real time data feed via line 2212. In this embodiment, one of the modules 2206 includes a digitizing device 2210 to capture and digitize the image data (which is then stored in database 2207).

The application 2208 creates a different account for each client. To access a proprietary account, a user is asked to login with a username and a password as shown in the window 2301 (FIG. 23A). In a preferred embodiment of the present invention, multiple users can access the simulation server 2101 simultaneously, each user having his/her own authorization access. In this example login request, the user has an administrator authorization, the highest authorization as shown in FIG. 23B. Other authorizations include, in descending order: manager, process engineer, and operator (all authorizations described in detail below).

In accordance with the present invention, once the login process is successful, an "enter" box as well as a "talk" box are provided on all subsequent windows. This feature of the present invention provides multiple users with the opportunity to communicate in real-time with each other. The users currently on-line, i.e. Linyong and Dan, are listed in user box 2302. (Note that the unlabeled box adjacent user box 2302 merely provides a "welcome" message from JavaTalk 1.1, the applet used in this embodiment of the invention.) All messages between Linyong and Dan are captured in talk box 2304. Specifically, the user types in a message in the enter box 2303. After pressing the "Enter" key of the user's keyboard, the message is transferred to talk box 2304. To minimize the area taken up by boxes 2302–2304, the user can pull down bar 2305, thereby causing only enter box 2303 and talk box 2304 to be displayed in subsequent windows.

This feature is particularly advantageous for coordination and negotiation between the client, the mask house, and the fab. For example, the client may recommend repairing mask defects with a severity level of at least 6, whereas the fab may require that mask defects of severity level 5 also be repaired. Providing this real-time communication while simulation and analysis on the mask image are being done allows decisions to be mutually agreed upon by the appropriate parties. Therefore, the present invention significantly improves the decision-making process and provides an invaluable communication tool for all users. Moreover, this communication can be stored in database 2207, thereby providing a record of the decision-making process if needed by the parties at a later point in time.

As noted above, each user has an access authorization. The operator has authority only to access a stored mask image, perform simulations on the mask image, and generate one-dimensional plots and analysis reports on that mask image. The process engineer has authority to perform all of the functions performed by the operator, and can also input stepper, photoresist, and etching parameters used in the simulation (explained in detail in reference to FIG. 23G). The manager has authority to perform all of the functions performed by the process engineer, and can also add a new mask image and delete a mask image. Finally, the administrator has authority to perform all of the functions performed by the manager, and can also change the authorization of any user. Normally, the administrator is given the responsibility to manage that account.

To input or amend account information or to import data (i.e. a mask image) into the account, the user clicks on the "Manage" tab 2307 shown in the window 2306 (FIG. 23C). Assuming the user has the appropriate authorization, the user can add users, edit users, or delete users in the account by clicking on the hyperlinks in the Account menu section 2308. FIGS. 23D and 23E show the account administration table 2310 that facilitates the user adding, editing, or deleting users. In one embodiment, with the exception of the "Privilege" designation 2311 (i.e. authorization), any user can edit his or her own, information in the table 2310. In one embodiment, the user information includes name, department, company (recall that at least one client view station 2201 may be used by a third party, such as a mask house or a fab that provides services to the client), phone number, email, username, and password. To facilitate effective account management, typically only the administrator (one individual) is given authorization to change the Privilege designation, to add users, and to delete users. Moreover, the administrator can also be given access to all the users' passwords, thereby providing additional security for the client.

Referring back to FIG. 23C, an "Import" menu 2309 in window 2306 allows a user to import a mask image from the client's computer 2203 to the simulation server 2101. After clicking on the "mask images" hyperlink, a window 2312 is displayed (FIG. 23F). Importing the mask image requires certain information including file name, pixel size, mask I.D. number, and defect I.D. number. In one embodiment, only a user having access to the computer 2208 can provide this information. By clicking on the Browse button 2313 and assuming access to the computer 2203, the files present on computer 2203 are displayed.

The user selects the desired mask image by double clicking on that file, thereby writing the file name in the box provided in window 2312. Note that the pixel size information, the mask I.D. number (wherein each mask has a unique identification number), and the defect I.D. number (wherein each defect is identified by an X–Y coordinate position on them ask as well as a class of defect (i.e. spot defect, warping defect, etc.)) are output data from the inspection tool 2209. After the data regarding the mask image is complete, the user clicks on the "finish and submit data" button 2314 to import the mask image.

By clicking on the "Stepper" tab 2315 shown in FIG. 23G, the user can enter new information or review stored information specific to the stepper, photoresist, and etching process that the client will use in the manufacturing of the mask. As indicated previously, the printability of a defect is highly dependent on the stepper conditions. Therefore, providing accurate and detailed information regarding the stepper is integral to the success in simulating the effects of the mask defect.

Stored information regarding various stepper can be accessed by pulling down a menu bar 2316. In this example, the parameters 2320 of a Stepper#1 are displayed. Clicking on the Edit button 2317 allows the user to change one or more parameters of the stepper. In one embodiment shown in FIG. 23H, the editing process is facilitated by a diagram 2317 which illustrates a typical optical system in a stepper. If the parameter value requested in box 2318 affects one of the elements of diagram 2317, then the appropriate element(s) of that diagram are highlighted in red. In this manner, the present invention can educate those users with less expertise. In this example, the requested parameter is grid size (i.e. the output pixel size). Therefore, the image (wafer) plane element would be highlighted. In another embodiment, the user clicks on the element of the diagram 2317 and the box 2318 having the parameters relating to that element is displayed.

Certain parameters are considered critical for any simulation. Referring back to FIG. 23G, the critical parameters include the mask pixel size, the reduction factor, the mask type, the center wavelength, and the mode (i.e. transmission or reflection). Therefore, the user should at least confirm the accuracy of the values associated with these parameters to ensure a satisfactory simulation.

To add a new set of parameters, the user clicks on the hyperlink 2319. In the event that any parameter value cannot be confirmed or the user simply fails to enter a value, the present invention provides default (i.e. recommended) parameters as shown in box 2318 (FIG. 23H). These default values include typical parameter values for steppers, photoresist, and etching processes currently available in the industry. In one embodiment, these default values are periodically updated to reflect new technology. Although not every parameter is critical to simulation results, each parameter does calibrate the simulation results to some extent. Thus, by providing at least default values for the parameters 2320, the present invention ensures the best simulation possible.

In the present invention, the parameters 2320 include parameters relating to the stepper, the photoresist, and the etching process. For example, the critical parameters listed above relate to the stepper; the parameters "Resist. Model" and "Resist Type" relate to the photoresist; and the parameter "Process Non-Linearity" relates to the etching process. The parameters 2320 are meant to be illustrative only and not limiting. Those skilled in the art will recognize other parameters that further calibrate the simulation.

When the user is ready to begin a simulation, the user clicks on the "Mask" tab 2321 shown in FIG. 23I. Clicking on the "Find" button 2322 displays a box 2323 illustrated in FIG. 23J. By providing information regarding the Stepper ID, the Mask ID, and the Defect ClassNum (classification number, also referenced herein as the class or severity of the defect) and the desired logic function (i.e. AND/OR), the modules 2206 can find the appropriate file(s) in database 2207. Referring back to FIG. 23I, the list of found files is displayed in pull-down menu 2324.

At this point, the application 2208 automatically simulates the accessed mask image and displays the original mask image 2325 and the corresponding simulated wafer image 2326 (before photoresist and etching) (both aerial images). The "Zoom Show" bars 2327 allow the user to move these images in various three-dimensional directions (i.e. in, out, fill in window, right, left, up, and down). In this example, the "Zoom In" command was selected for mask image 2325 as compared to wafer image 2327.

In one embodiment of the present invention, only one defect is provided on each mask image. However, in other embodiment, multiple defects can be shown on the mask image. Therefore, to select a particular defect or to see a defect more closely, the user can click on the "Highlight" button 2328 and use a mouse to graphically surround the defect with a highlighted rectangle (see, for example, rectangle 2331 in mask image 2332 of FIG. 23K). At this point, the user can click on the "Simulate" button 2329 (FIG. 23I) to trigger the application 2208 to simulate the effects of the highlighted defect on the wafer.

Alternatively, the user can click on the Highlight button 2328 again, thereby changing the mode to "Cutting Line" (see, for example, cutting line 2333 in mask image 2332 of FIG. 23K). At this point, the user can generate various one-dimensional plots by clicking on the "1-D Analysis" button 2330 (FIG. 23I). FIG. 23L illustrates two industry standard one-dimensional plots. Specifically, graph 2334 plots aerial image intensity versus position, whereas graph 2335 plots various process latitudes. Note that in one embodiment graphs 2334 and 2335 are automatically generated after button 2330 (FIG. 23I) is clicked. Graph 2335, which shows process latitudes, is particularly helpful to access the affects of certain parameters on the process window. To obtain other graphs, an edit button 2336 is clicked. Other graphs that may be plotted by the present invention include, but are not limited to, feature size versus exposure level and feature size versus defocus. Note that in accordance with the present invention, the same simulation engine is used to provide all analyses, i.e. the simulated mask (two-dimensional) images and the one-dimensional plots. As known by those skilled in the art, the one-dimensional plot requires a post-processing step after simulation is performed.

After either simulation or one-dimensional analysis is performed, the application 2208 displays a report in area 2337. For example, after simulation is performed, a typical report includes defect severity. In one embodiment, the range of defect severity is 0 to 10, wherein 10 indicates that the defect must be repaired, otherwise the device on the wafer will not function properly, and 4–6 indicate that the defect may print, but may not affect the function of the device on the wafer. In accordance with the present invention, comments provided by one or more users can be added to the report area 2337. Therefore, as one example, in the case of a defect severity of 5, the decision whether to repair that defect is written in the report area 2337.

For reference purposes, having a simulation of an actual layout is helpful. By clicking on the "Layout" tab 2338 and the "Find" button to locate the appropriate reference layout image in database 2207 (i.e. the actual layout of the area on the wafer including the defect in question), both shown in FIG. 23M, the application 2208 displays a reference layout image 2339 and generates a corresponding simulated layout image 2340. The user can then compare the simulated layout image 2340 with the simulated wafer image 2326 (FIG. 23I) by clicking on the "Compare to mask simulation" hyperlink 2341. At this point, both simulation images are placed on the same window and the application 2208 calculates the difference between the two images and displays that difference in the report area 2342.

Finally, due to the repetition of various steps in both simulations and tests, the user may wish to take certain "short-cuts" to do those tasks more efficiently. Using the "Script Wizard" tab 2343 shown in FIG. 23N, the user can then create templates which automate many steps in these tasks, thereby eliminating the clicking of certain buttons or hyperlinks, such as those described above. The templates generate scripts for certain simulations or tests. In FIG. 23N, the user has three available scripts: a first script for the stress test, a second script for the standard looping test, and a third script for a demonstration test.

FIG. 24 shows a list of illustrative tables 2401–2406 and attributes provided in one embodiment of the database 2207. The technology settings table 2401 identifies the mode (transmission or reflection), the photoresist model and type, the depth of focus (DOF), and center wavelength, for example. The optical model table 2402 includes wavelength, numerical aperture, coherence factor, and illumination type. Note that an arrow in FIG. 24 indicates a 1:N relationship. Thus, one (1) technology setting can apply to N masks. The mask table 2403 includes a description and a reference to the technology settings table 2401. The defect table 2404 describes the x–y coordinates to locate the defect on the wafer, a defect size, a class number, and a severity score. The image table 2405 determines whether the image is a one dimensional plot, an aerial, or a layout image. In one embodiment, the image table 2405 also identifies the mask image generator, i.e. optical microscope or SEM. The plot table 2404 determines the type of one-dimensional plot is provided and identifies the location of the cutline on the mask image. In another embodiment, a user table (not shown) describes the information provided in the window shown in FIGS. 23D and 23E.

In a preferred embodiment of the invention, the users provide actual wafer images of identified defects in the mid-range severity, i.e. 4–6, to the simulation server 2101. These actual wafer images can be compared to the simulations generated by the application 2208. Therefore, the customer feedback can be advantageously used to improve the algorithms that implement the application 2208.

Other Applications p The simulator server of the present invention can be used in any system with multiple users. Therefore, in one embodiment shown in FIG. 25, a simulation server 2501 at a company's headquarters is connectable to multiple campus sites 2503 via a network 2502. The campus sites may be across the world, across the city, or across the street from one another. In one embodiment, the network 2502 is an Intranet connection using dedicated lines.

Business Models

FIGS. 26A, 26B, and 26C show three illustrative business models using the present invention. In FIG. 26A, Company 2600 runs the simulation server software on its own computers at location 2601. After obtaining a license from Company 2600, customers use their web browsers to log into the web site of Company N. In this model, all mask images, simulations, and analyses are stored at location 2601.

In FIG. 26B, an OEM for Company 2600, OEM 2610, licenses (or alternatively buys) the simulation server from Company 2600. After obtaining a sublicense from OEM 2610, customers use their web browsers to log into the web site of OEM 2610. In this model, all mask images, simulations, and analyses are stored on the web server of OEM 2610 at location 2611.

In FIG. 26C, a customer of Company 2600, Company 2620, licenses (or alternatively buys) the simulation server from Company 2600. Employees of Company 2620 (or contractors doing work for Company 2620) log into the Intranet site of Company 2620. In this model, all mask images, simulations, and analyses are stored on an internal server of Company 2620.

The licenses and sublicenses described above in reference to FIGS. 26A, 26B, and 26C can be contractually defined: for example, single computer, floating license, per use, or time limited.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art. Accordingly, it is intended that the scope of the invention be defined by the following claims and their equivalents.

What is claimed is:

1. A method for providing a mask defect analysis to a first user, the method comprising:
   creating a database for storing a plurality of simulation models;
   creating a wide area network server for receiving a mask defect image from the first user;
   generating a simulation image of the mask defect image using at least one simulation model; and
   providing the simulation image to the first user via the wide area network server.

2. The method of claim 1, further including receiving parameters regarding a stepper for calibrating the at least one simulation model.

3. The method of claim 1, further including storing the mask defect image in the database.

4. The method of claim 3, wherein a second user and the first user simultaneously view generating the simulation image via the wide area network server.

5. The method of claim 4, wherein the first and second users communicate during the step of generating the simulation image using the wide area network server.

6. The method of claim 3, wherein the first user has a first authorization to operate on the mask defect image.

7. The method of claim 6, wherein a second user has a second authorization to operate on the mask defect image, and wherein the first and second authorizations are different.

8. The method of claim 1, further including:
   storing a plurality of analysis plots in the database;
   generating a one-dimensional report on a cutline of the mask defect image using at least one analysis plot; and
   providing the one-dimensional report to the first user via the wide area network server.

9. The method of claim 8, wherein the first user designates the cutline of the mask defect image for generating the one-dimensional report.

10. The method of claim 9, further including at least one of panning and zooming the mask defect image to designate the cutline of the mask defect image for generating the one-dimensional report.

11. The method of claim 8, wherein the one-dimensional report includes at least one of an aerial image intensity plot, an intensity versus defocus plot, an intensity versus exposure plot, a process window plot, and a latitude curve.

12. The method of claim 1, wherein the first user designates a portion of the mask defect image for generating the simulation image.

13. The method of claim 12, further including at least one of panning and zooming the mask defect image to designate a portion of the mask defect image for generating the simulation image.

14. The method of claim 1, wherein the mask defect image is encrypted, and further including decrypting the mask defect image.

15. The method of claim 14, further including encrypting the simulation image.

16. The method of claim 1, further including:
   receiving an actual layout of an area corresponding to the mask defect image;

generating a layout simulation image of the actual layout using at least one simulation model; and comparing the layout simulation image to the simulation image.

17. An apparatus for providing mask defect analysis, the apparatus comprising:

a wide area network server for receiving a mask defect image and outputting a simulation image of the mask defect image;

a database for storing the mask defect image and a plurality of mask simulation models; and an application for operating on the mask defect image and at least one simulation model, and generating the simulation image.

18. The apparatus of claim 17, wherein the database further stores the simulation image.

19. The apparatus of claim 18, wherein the wide area network server includes at least one module for accessing a stored element in the database and transmitting the stored element to the application.

20. A system for providing mask defect analysis, the system comprising:

means for receiving a mask defect image transmitted via a network;

means for storing the mask defect image and a plurality of mask simulation models;

means for operating on the mask defect image and at least one simulation model, and generating a simulation image; and means for outputting the simulation image of the mask defect image onto the network.

21. The system of claim 20, wherein the network includes an Internet line, and wherein the means for receiving includes a Web server.

22. The system of claim 20, wherein the network includes an Intranet line, and wherein the means for receiving includes an internal server site.

23. The system of claim 20, further including means for transmitting the mask defect image and receiving the simulation image.

24. The system of claim 23, wherein the means for transmitting includes a computer.

25. The system of claim 23, wherein the means for transmitting includes at least one Web browser.

26. The system of claim 23, wherein the means for transmitting includes a plurality of stations.

27. An integrated circuit fabricated using an improved mask, the improved mask including one of a mask defect and a corrected mask defect analyzed using the following steps:

storing a plurality of simulation models in a database;

receiving a mask defect image via a wide area network server;

generating a simulation image of the mask defect image using at least one simulation model;

providing the simulation image to the wide area network server, wherein if the simulation image is acceptable, then leaving the mask defect, and wherein if the simulation image is unacceptable, then repairing the mask defect, thereby creating the corrected mask defect.

28. The integrated circuit of claim 27, further including receiving parameters for calibrating the at least one simulation model.

29. The integrated circuit of claim 28, further including storing the mask defect image in the database.

30. The integrated circuit of claim 27, wherein multiple users can view generating the simulation image via the wide area network server.

31. The integrated circuit of claim 27, wherein multiple users can communicate during the step of generating the simulation image using the wide area network server.

32. The integrated circuit of claim 30, wherein at least two users have different authorizations to operate on the mask defect image.

33. The integrated circuit of claim 27, further including:

generating a one-dimensional plot on a cutline of the mask defect image using at least one simulation model; and providing the one-dimensional plot to the wide area network server.

34. The integrated circuit of claim 27, wherein a user designates a portion of the mask defect image for generating the simulation image using the wide area network server.

35. The integrated circuit of claim 33, wherein a user designates the cutline of the mask defect image for generating the one-dimensional plot using the wide area network server.

36. A method for providing mask defect analysis over a wide area network, the method comprising:

storing simulation information in a database;

receiving a mask defect image via a wide area network server;

allowing a user to designate an area of the mask defect image to be simulated;

generating a simulation image of the area of the mask defect image using the simulation information;

allowing the user to designated a cutline of the mask defect image to be analyzed;

generating a one-dimensional plot of the cutline of the mask defect image using the simulation information; and providing the simulation image and the one-dimensional plot to the user via the wide area network server.

* * * * *